(12) United States Patent
Chern

(10) Patent No.: US 12,438,137 B2
(45) Date of Patent: Oct. 7, 2025

(54) INTEGRATED PACKAGES HAVING ELECTRICAL DEVICES AND PHOTONIC DEVICES AND METHODS OF MANUFACTURING THE SAME

(71) Applicant: Taiwan Semiconductor Manufacturing Company, Ltd., Hsinchu (TW)

(72) Inventor: Chan-Hong Chern, Palo Alto, CA (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 452 days.

(21) Appl. No.: 17/834,600

(22) Filed: Jun. 7, 2022

(65) Prior Publication Data

US 2023/0395583 A1    Dec. 7, 2023

(51) Int. Cl.
| | |
|---|---|
| H01L 25/16 | (2023.01) |
| H01L 21/768 | (2006.01) |
| H01L 23/00 | (2006.01) |
| H01L 23/48 | (2006.01) |
| H10F 77/40 | (2025.01) |

(52) U.S. Cl.
CPC ...... *H01L 25/167* (2013.01); *H01L 21/76898* (2013.01); *H01L 23/481* (2013.01); *H01L 24/08* (2013.01); *H01L 24/16* (2013.01); *H01L 24/48* (2013.01); *H01L 24/85* (2013.01); *H10F 77/413* (2025.01); *H01L 2224/08145* (2013.01); *H01L 2224/16145* (2013.01); *H01L 2224/48225* (2013.01)

(58) Field of Classification Search
CPC ...... G02B 6/34; G02B 6/4212; G02B 6/4214; G02B 6/428; H10F 77/413
USPC ......................................... 257/668; 438/123
See application file for complete search history.

(56) References Cited

U.S. PATENT DOCUMENTS

| | | | |
|---|---|---|---|
| 2015/0323420 A1* | 11/2015 | Kuznia | G01M 11/3154 356/73.1 |
| 2016/0238793 A1* | 8/2016 | Frankel | G02B 6/14 |
| 2019/0154916 A1* | 5/2019 | Pinguet | G02B 6/124 |

* cited by examiner

*Primary Examiner* — Didarul A Mazumder

(74) *Attorney, Agent, or Firm* — FOLEY & LARDNER LLP

(57) ABSTRACT

A semiconductor package includes a photonic die having a first side and a second side opposite to each other. The semiconductor package includes an electrical die having a third side and a fourth side opposite to each other. The first side of the photonic die faces the third side of the electrical die. The photonic die has an index matching material extending from a surface of the photonic die on the second side into the photonic die.

20 Claims, 53 Drawing Sheets

INTEGRATED PACKAGES HAVING ELECTRICAL DEVICES AND PHOTONIC DEVICES AND METHODS OF MANUFACTURING THE SAME

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 7-1 and 7-2 illustrate an example flow chart of a method for making a photonics integrated circuit (PIC) chip shown in FIG. 3, in accordance with some embodiments.

FIGS. 8-1a-1, 8-1a-2, 8-1a-3, 8-1b-1, 8-1b-2, 8-1b-3, 8-2, 8-3, 8-4, 8-5, 8-6, 8-7, 8-8, 8-9, and 8-10 illustrate respective cross-sectional views of an example semiconductor package during various fabrication stages, made by the method of FIG. 7, in accordance with some embodiments.

FIG. 9 illustrates an example flow chart of a method for making an electrical-optical converting apparatus shown in FIG. 4, in accordance with some embodiments.

FIGS. 10-1, 10-2, 10-3, 10-4, 10-5, 10-6, 10-7, 10-8, and 10-9 illustrate respective cross-sectional views of an example semiconductor package during various fabrication stages, made by the method of FIG. 9, in accordance with some embodiments.

FIGS. 11-1, 11-2, and 11-3 illustrate an example flow chart of a method for making an electrical-optical converting apparatus shown in FIGS. 5 and 6, in accordance with some embodiments.

FIGS. 12-1, 12-2, 12-3, 12-4, 12-5, 12-6, 12-7, 12-8, 12-9, 12-10, 12-11, 12-12, 12-13a-1, 12-13b-1, 12-13b-2, 12-13b-3, and 12-13b-4 illustrate respective cross-sectional views of an example semiconductor package during various fabrication stages, made by the method of FIG. 11, in accordance with some embodiments.

DETAILED DESCRIPTION

Figure 1:
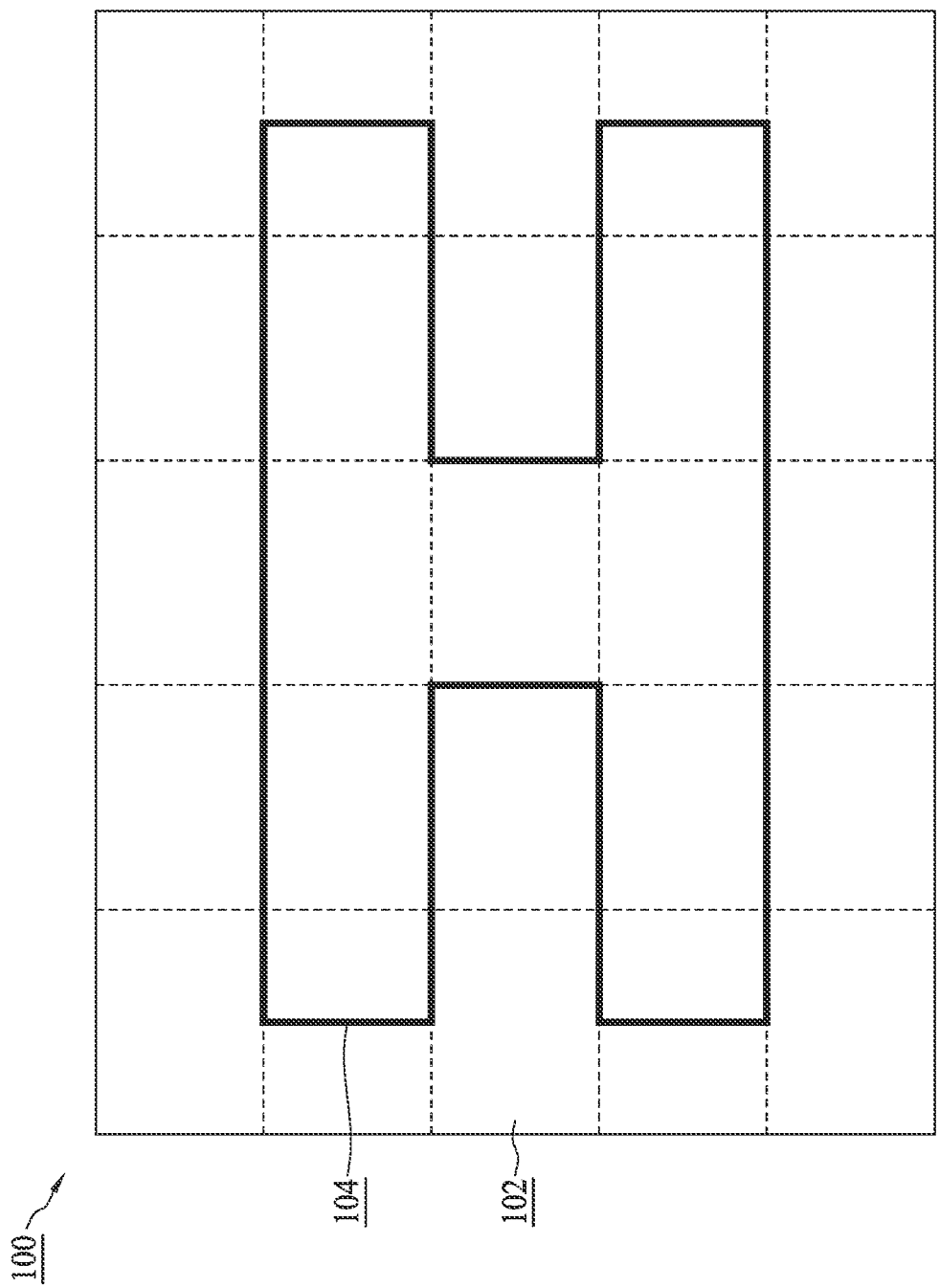
FIG. 1 illustrates a multi-chip system including a number of sites, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various embodiments of a three-dimensional (3D) packages including both an optical device (e.g., photonic integrated circuit (PIC)) and an electrical device (e.g., electronic integrated circuit (EIC)) which may be electrically coupled to each other, and the method of forming the same. In accordance with various embodiments, the package, as disclosed herein, embeds or otherwise includes an index matching material (e.g., refractive index matching to fiber material and buried oxide (BOX) material) optically coupled to the backside of an optical device. Such an index matching material can serve as an optical input/output (I/O) for the optical device. For example, the frontside of the optical device may be used for electrical coupling, and the backside of the optical device may be used for light coupling. The light may be coupled in between an optical fiber and a grating coupler through the index matching material. The electrical signals may be transmitted between the optical device and the electrical device. With a metal reflector next to a resonance component (e.g., grating coupler) of the optical device, the optical device can have a significantly improved light coupling efficiency. Light coupling efficiency may be enhanced by the metal reflector to reflect the light and constructively interfere with the light coupled between the optical fiber and the grating coupler. Further, with the index matching material formed on the backside of the optical device, a need for costly short through silicon via (TSV) and a wire-bond connection for transmitting high-frequency signals can be eliminated. As such, a shortest electrical transmission distance between the optical device and electrical device can be achieved, and/or parasitic between different electrical devices (e.g., switch, SoC) can be significantly reduced, thereby saving transmission energy. Accordingly, an area occupied by the optical device may be reduced, which may advantageously provide flexible and significant large amount of optical coupling locations, and spare more area to incorporate more high-performance (e.g., electrical) devices in the package.

FIG. 1 illustrates a multi-chip system 100, in accordance with various embodiments. The multi-chip system 100 is, e.g., a high performance computing (HPC) system, and includes a plurality of sites 102, each of which may be a separate computing system. Each of the sites 102 may be formed as a (e.g., three-dimensional (3D)) semiconductor package, for example, formed on a common package substrate. Although the system 100 shown in FIG. 1 has twenty sites 102, it should be understood that the system 100 can include any number of sites 102 while remaining within the scope of present disclosure.

The sites 102 are interconnected by an optical pathway 104, which allows the separate computing systems of the sites 102 to communicate with each other. For example, the optical pathway 104 may be a closed loop (or ring) that connects to each site 102 of the multi-chip system 100. As such, each site 102 may communicate with any of the other sites 102 via the optical pathway 104. In an embodiment, the optical pathway 104 includes a plurality of waveguides, and each waveguide connects two of the sites 102 in a peer-to-peer manner. In some embodiments, the optical pathway 104 is a silicon photonic interconnect, although other types of optical pathways could be used.

Figure 2:
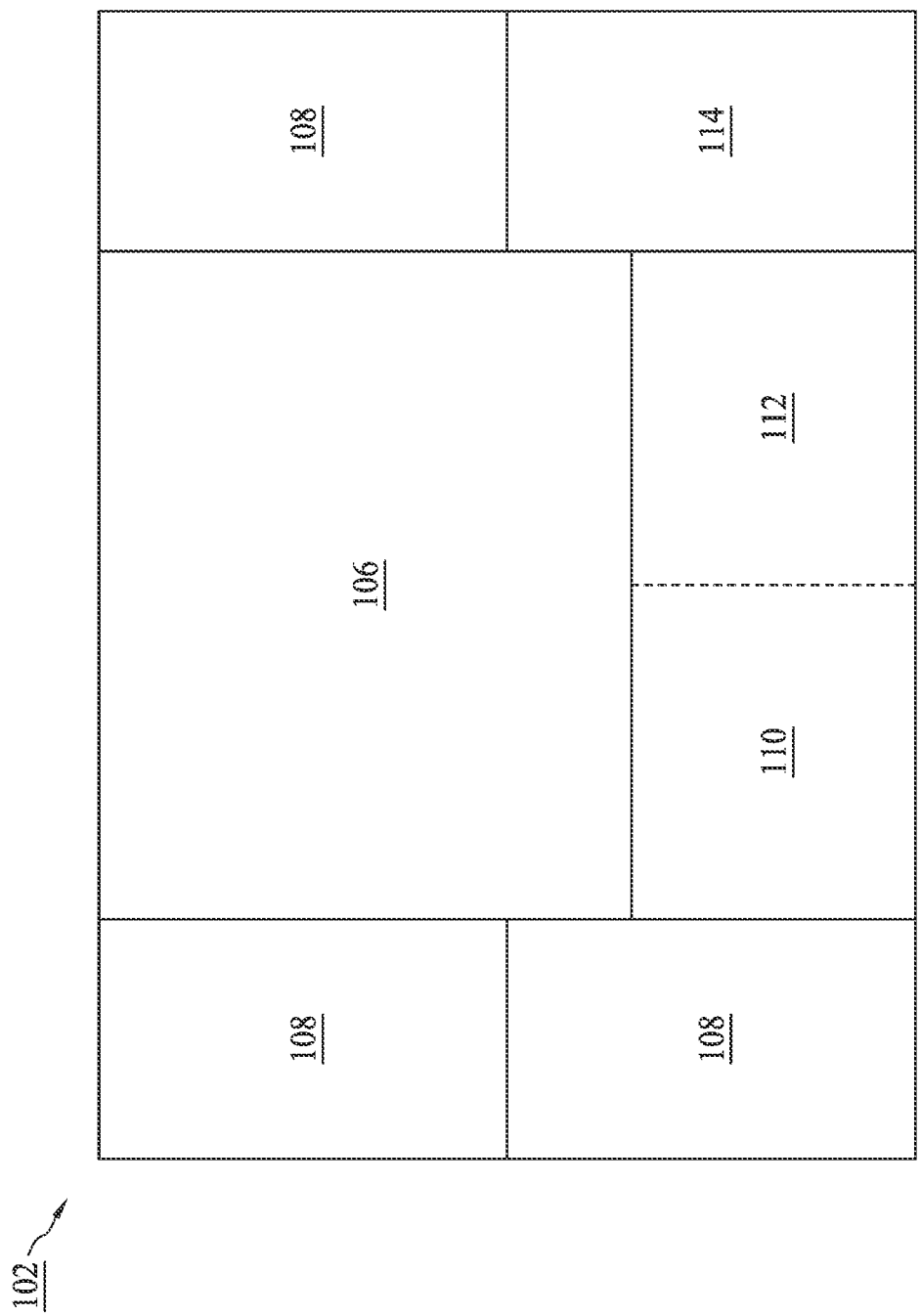
FIG. 2 illustrates an example arrangement of components of a site of the multi-chip system of FIG. 1, in accordance with some embodiments.

Referring to FIG. 2, an example layout or otherwise arrangement of components (e.g., dies, devices, etc.) in each site 102 is shown, in accordance with various embodiments. As a non-limiting example shown in FIG. 2, each site 102 may include a processor die 106, memory dies 108, an electronic die (an implementation of the electrical device) 110, a photonic die (an implementation of the optical device) 112, and an optical fiber 114. The optical pathway 104 extends under one or more components of each site 102, but at least extends under the photonic die 112 of each site 102. The sites 102 are interconnected by an electrical pathway (not shown in FIG. 1 or 2, but will be described below).

The processor die 106 may be a central processing unit (CPU), graphics processing unit (GPU), application-specific integrated circuit (ASIC), or the like. The memory dies 108 may be volatile memory such as dynamic random-access memory (DRAM), static random-access memory (SRAM), or the like. In the embodiment shown, each site 102 includes one processor die 106 and four memory dies 108, although it should be appreciated that each site 102 may include more or less memory dies 108.

The photonic die 112 can transmit, receive, convert, modulate, demodulate, or otherwise process optical signals. For example, the photonic die 112 can convert electrical signals from the processor die 106 to optical signals, and convert optical signals to electrical signals. The photonic die 112 can communicate such optical signals through the optical pathway 104 (FIG. 1) with one or more other photonic dies. According to various embodiments of the present disclosure, the photonic die 112 can receive the optical signals via an index matching material embedded onto the corresponding site 102 from the optical fiber 114, and transmit and/or receive the optical signals via one or more waveguides of the optical pathway 104. As will be discussed in further detail below, the index matching material may be optically coupled to the optical pathway 104 by edge or grating coupling (e.g., via a grating coupler). Such optical signals received through the index matching material may include a test signal configured to test the corresponding photonic die 112, the optical pathway 104, etc., and/or a carrier (e.g., laser) signal. Accordingly, the photonic die 112 is responsible for the input/output (I/O) of optical signals to/from the optical pathway 104. In some embodiments, the optical pathway 104, or at least a portion of it, may be integrated into the photonic die 112.

In various embodiments, the photonic die 112 may be a photonic integrated circuit (PIC), and the electronic die 110 includes electronic circuits needed to interface the processor die 106 with the photonic die 112. For example, the electronic die 110 may include controllers, transimpedance amplifiers, and the like. The electronic die 110 controls high-frequency signalling of the photonic die 112 according to electrical signals (digital or analog) received from the processor die 106. The electronic die 110 may be an electronic integrated circuit (EIC). Although the processor die 106, memory dies 108, and electronic die 110 are illustrated as being separate dies in the non-limiting example of FIG. 2, it should be appreciated that the sites 102 could each be a system-on-chip (SoC) or a system-on-integrated-circuit (SoIC) device/package. As such, the processing, memory, and/or electronic control functionality may be integrated on the same die or the same substrate.

Figure 3:
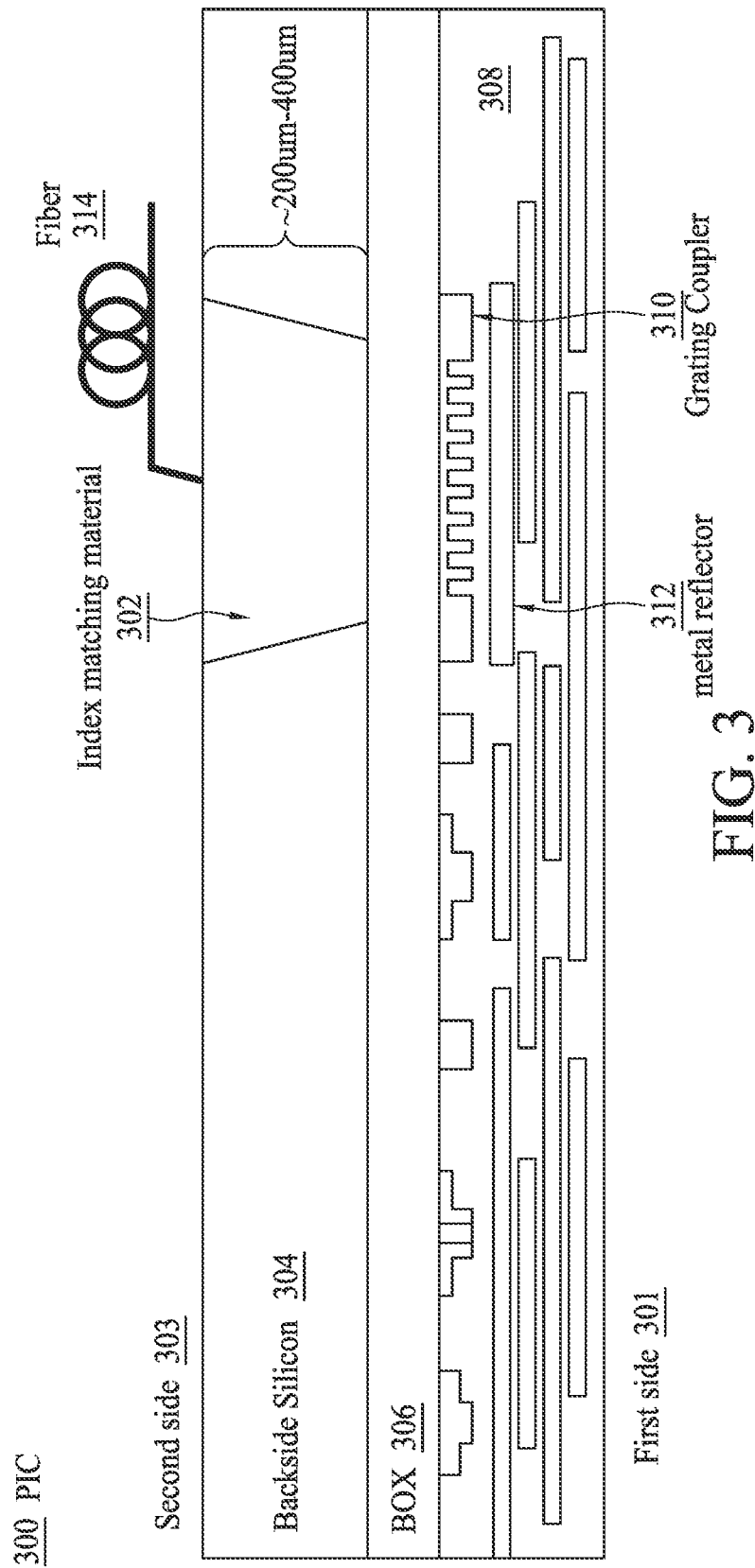
FIG. 3 illustrates a detailed, cross-sectional view of a portion of the site of FIG. 2, in accordance with some embodiments.

FIG. 3 illustrates a detailed, cross-sectional view of a portion of the site 102 of FIG. 2, in accordance with some embodiments. For example, the portion of the site 102 shown in FIG. 3 includes a photonic die 300. The photonic die 300 may be a photonic integrated circuit (PIC). The photonic die 300 may include a first side 301 and a second side 303 opposite to each other. The photonic die 300 may include an index matching material 302, a silicon substrate 304 (e.g., near to the second side 303), an insulator layer 306 (e.g., buried oxide (BOX) layer), an upper silicon layer 308 (e.g., device layer) (e.g., near to the first side 301), and an optical fiber 314. The photonic die 300 may be formed on a semiconductor-on-insulator (SOI) substrate, which includes a layer of semiconductor material formed on an insulator layer.

The index matching material 302 may be extending from a surface of the photonic die on the second side 303 into the silicon substrate 304. The index matching material 302 may be formed by filling an opening that extends through the silicon substrate 304. In some embodiments, the index matching material 302 may be at least of oxide and/or polymer (e.g., index matching to optical fiber material and BOX material). In certain embodiments, the index matching material may have an effective refractive index in a range of about 1.4 to about 1.6. The height of the backside opening (e.g., the height of the index matching material) can be about 200 micrometers (μm) to about 400 μm. The index matching material may be formed in the opening using, for example, ECP or electro-less plating. The index matching material may be configured to optically couple an optical input signal to a grating coupler of the photonic die 300. The light is coupled in between an optical fiber 314 and a grating coupler 310 through backside (e.g., the second side 303) of the silicon substrate 304 opening. The index matching material may penetrate through the silicon substrate 304.

The silicon substrate 304 may be a silicon wafer. The insulator layer 306 may be, for example, a buried oxide (BOX) layer, a silicon oxide layer, or the like. The insulator layer is provided on a semiconductor material, typically a silicon or glass substrate. The upper silicon layer 308 may include a grating coupler 310 (e.g., an implementation of the guided-mode resonance component) and a metal reflector 312. The grating coupler 310 can allow waveguides to transmit light to or receive light from the overlying light source or optical signal source (e.g., through the index matching material 302). The metal reflector 312 can reflect the light and constructively interfere with the light coupled between the optical fiber 314 and the grating coupler 310. The metal reflector 312 may be formed by acceptable photolithography and etching techniques. In an embodiment, the metal reflector 312 is formed after the grating coupler 310 is defined. For example, a photoresist may be formed and developed on the front side of the upper silicon layer. The photoresist may be patterned with openings corresponding to the metal reflector 312. One or more etching processes may be performed using the patterned photoresist as an etching mask. In particular, the front side of the upper silicon layer may be etched to form recesses in a dielectric layer, thereby defining the metal reflector 312. The etching processes may be an anisotropic wet or dry etch.

The photonic die 300 may further include a number of optical device features (e.g., modulators, waveguides, and photodetectors), a dielectric layer, and a number of conductive features (e.g., redistribution layer (RDL) metal, backend of line (BEOL) processes for inter-metal, under bump metal (UBM)) formed in the upper silicon layer. The optical device features may be partially or fully overlaid by the dielectric layer. Over the dielectric layer (when flipping the site 102 of FIG. 2), a number of conductive features (e.g., a plurality of metallization layers) are formed in a dielectric layer. The dielectric layer may be formed of the same material or respectively different materials selected from the group consisting of: silicon oxide, silicon nitride, a low-k dielectric material, and combinations thereof. The conductive features may be disposed in a number of layers or levels, sometimes referred to as metallization layers. The metallization layers may include a plurality of interconnect structures. Generally, the metallization layers disposed closet to and farthest from the device features may be referred to as M0 (the bottommost metallization layer) and Mx (the topmost metallization layer), respectively. Over the Mx, a number of pads (not shown) may be formed to electrically connect the conductive features therein to conductive features of the photonic die. In certain embodiments, the metal reflector 312 may be disposed in one of the metallization layers closest to the grating coupler 310, and wherein the metal reflector is vertically aligned with the grating coupler.

The optical fiber 314 may include silicon nitride to optimize photon (e.g., light) traveling efficiency. In some other embodiments, the optical fiber include other materials having optical properties, such as, for example, polysilicon, amorphous silicon, aluminum nitride, and some polymeric materials. Due to the difference in refractive indices of the materials of the insulator layer 306 and the optical fiber 314, the index matching material 302 may be employed on the backside trench of the photonic die 300 to enhance light coupling efficiency.

Figure 4:
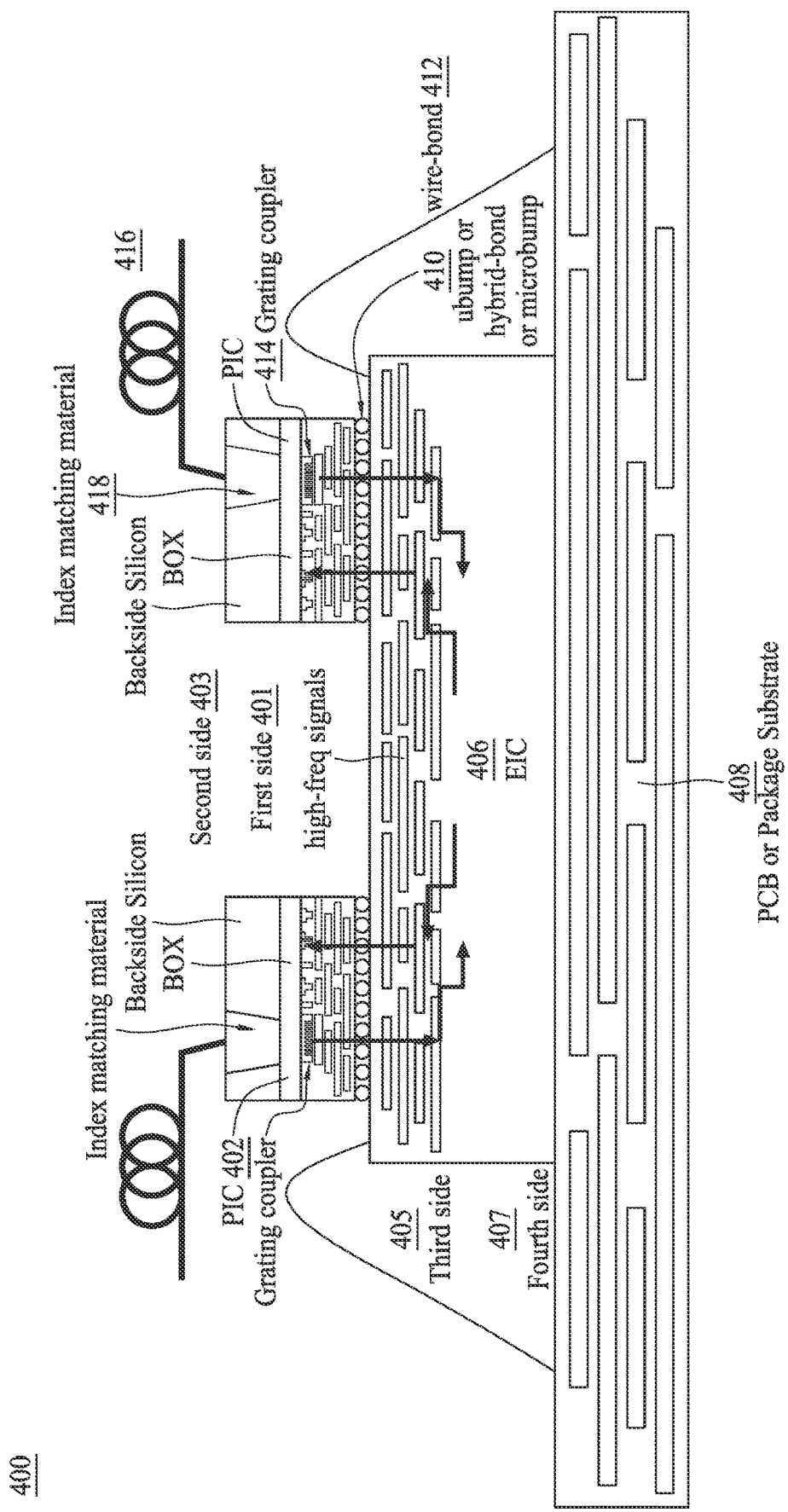
FIG. 4 illustrates a cross-sectional view of a portion of the site of FIG. 1, in accordance with some embodiments.

FIG. 4 illustrates a cross-sectional view of a portion of the site 102 of FIG. 1, in accordance with some embodiments. For example, the portion of the site 102 shown in FIG. 4 includes a semiconductor package 400. The semiconductor package 400 may include a photonic die 402 (e.g., photonic integrated circuit (PIC)), an electrical die 406 (e.g., electronic integrated circuit (EIC)), a package substrate 408 (e.g., printed circuit board (PCB)), a number of first conductive connectors 410, a number of second conductive connectors 412, and an optical fiber 416. The photonic die 402 may include a first side 401 and a second side 403 opposite to each other. The electrical die 406 may include a third side 405 and a fourth side 407 opposite to each other. An index matching material 418 may be extending from a surface of the photonic die 402 on the second side 403 into the photonic die 402. In some embodiments, the index matching material 418 may be at least of oxide and/or polymer (e.g., index matching to optical fiber material and BOX material). In certain embodiments, the index matching material may have an effective refractive index in a range of about 1.4 to about 1.6. The height of the backside opening (e.g., the height of the index matching material) can be about 200 micrometers (μm) to about 400 μm. The first side 401 of photonic integrated circuit 402 may be attached to or otherwise stacked over the third side 405 of the electronic integrated circuit 406, and such two stacked circuits are disposed over the package substrate 408. The PIC 402 may be integrated with the EIC 406 by 3-dimensional stacking through the first conductive connectors 410. The first conductive connectors 410 can electrically and/or physically couple various dies (e.g., the stacked electrical die and optical die). The first conductive connectors 410 may be ball grid array (BGA) connectors, solder balls, metal pillars, controlled collapse chip connection (C4) bumps, micro bumps (μbump), electroless nickel-electroless palladium-immersion gold technique (ENEPIG) formed bumps, or the like.

In some embodiments, the EIC 406 may include at least a switch, a system on chip (SoC), an application-specific integrated circuit (ASIC), a central processing unit (CPU), or a graphics processing unit (GPU). In certain embodiments, the EIC, in an order from the third side 405 to the fourth side 407, may comprise a plurality of metallization layers, a plurality of transistors, and a silicon layer. Further, it should be appreciated that over the package substrate 408, the site 102 can include any of various other dies attached thereto, for example, one or more memory dies 108, one or more processor dies 106, etc., while remaining within the scope of present disclosure.

In some embodiments, bonding between the photonic die 402 and the electrical die 406 may not include any bump structure, i.e., bumpless. However, in some other embodiments, the bonding between the photonic die 402 and the electrical die 406 may be established through a number of bump structures. For example, the bonding may be hybrid bonding, fusion bonding, direct bonding, dielectric bonding, metal bonding, solder joints (e.g., microbumps), or the like.

As a non-limiting example, the photonic die 402 is bonded to the electrical die 406 by hybrid bonding. In such embodiments, covalent bonds are formed with oxide layers, such as a dielectric layer of the photonic die 402 and a dielectric layer of the electrical die 406. Before performing the bonding, a surface treatment may be performed on the electrical die 110. Next, a pre-bonding process may be performed, where respective pads or conductive features of the photonic die 402 and the electrical die 406 are aligned. The photonic die 402 and the electrical die 406 are pressed against together to form weak bonds. After the pre-bonding process, the photonic die 402 and the electrical die 406 are annealed to strengthen the weak bonds. During the annealing, OH bonds in the top of the dielectric layers break to form Si—O—Si bonds between the photonic die 402 and the electrical die 406, thereby strengthening the bonds.

The semiconductor package 400 further includes a number of second conductive connectors 412. The second conductive connectors 412 can electrically and/or physically couple the electrical die 406 to one or more other devices/packages (e.g., package substrate 408). In certain embodiments, the second conductive connectors 412 can be bonding wires.

As shown in FIG. 4, an optical transmission path extending from the backside of photonic die 402 (e.g., from the optical fiber 416) to a grating coupler 414 exists. In various embodiments, such an optical transmission path is free from any of the conductive features. Stated another way, along this optical transmission path, no components formed of a conductive material exist, which can substantially limit interference induced by conductive features.

The photonic die 402 of FIG. 4 is an implementation of the photonic die 300 of FIG. 3. The photonic die 402 may further include a number of conductive features (e.g., redistribution layer (RDL) metal, backend of line (BEOL) processes for inter-metal, under bump metal (UBM)) disposed on the first side 401 of the photonic die. The electrical die 406 may also include a number of conductive features (e.g., redistribution layer (RDL) metal, backend of line (BEOL) processes for inter-metal, under bump metal (UBM)) disposed on the third side 405 of the electrical die. The conductive features may be disposed in a number of layers or levels, sometimes referred to as metallization layers. Generally, the metallization layers disposed closet to and farthest from the device features may be referred to as M0 (the bottommost metallization layer) and Mx (the topmost metallization layer), respectively. Over the Mx, a number of pads (not shown) may be formed to electrically connect the conductive features therein to conductive features of the photonic die or electrical die.

By flipping the stacked order between EIC and PIC, high-frequency signals may directly transport between PIC and EIC through the first conductive connectors 410. In some embodiments, the EIC can be integrated with switch/SoC in a single wafer. The present disclosure is able to transmit electrical signals at a significantly higher frequency/bandwidth and/or data rate (e.g., 250 Gbps per channel) between PIC and EIC, or between EIC and switch/SoC. The top metallization layers of the EIC (e.g., switch/SoC) can significantly reduce insertion loss. Power/ground and low-frequency signals can be transmitted through bonding wires to package substrate 408. The semiconductor package 400 shown in FIG. 4 may not require expensive processes for short through-silicon via (TSV). The high-frequency signals may communicate among PIC, EIC, and switch/SoC without using TSVs. By inserting an index matching material in the backside silicon of the PIC, the present disclosure may avoid using an unremovable molding compound to hold the silicon wafer. In this scenario, the light coupling path may not be blocked by the molding compound.

Figure 5:
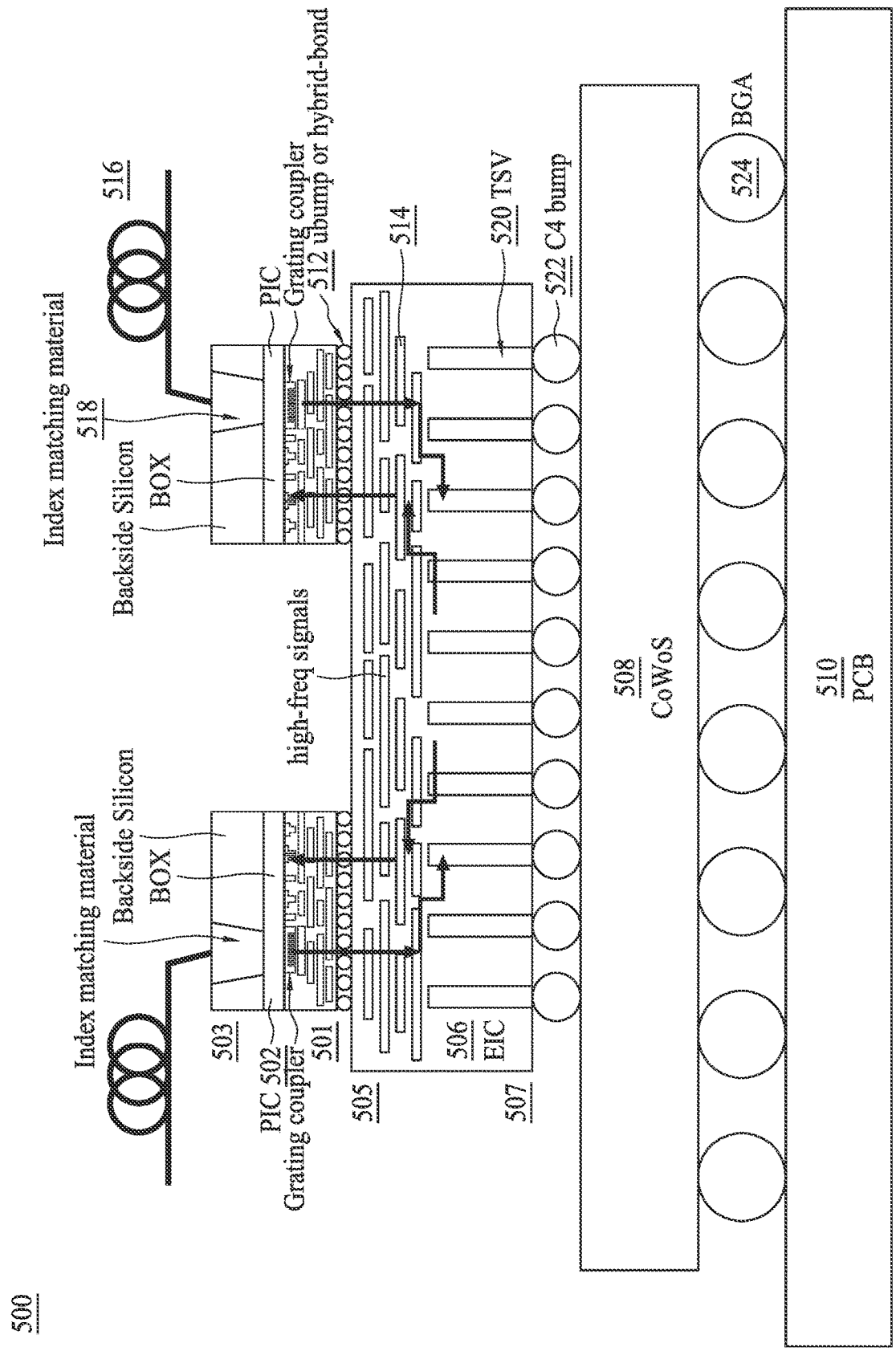
FIG. 5 illustrates a cross-sectional view of a portion of the site of FIG. 1, in accordance with some embodiments.

FIG. 5 illustrates another embodiment of a cross-sectional view of a portion of the site 102 of FIG. 1, in accordance with some embodiments. For example, the portion of the site 102 shown in FIG. 5 includes a semiconductor package 500. The semiconductor package 500 may include a photonic die 502 (e.g., photonic integrated circuit (PIC)), an electrical die 506 (e.g., electronic integrated circuit (EIC)), a Chip on Wafer on Substrate (CoWoS) 508, a package substrate 510 (e.g., printed circuit board (PCB)), a number of first conductive connectors 512 (e.g., µbump, hybrid bond), a number of conductive features 520 (e.g., through silicon via (TSV)), a number of second conductive connectors 522 (e.g., C4 bump), a number of third conductive connectors 524 (e.g., ball array package (BGA)), and an optical fiber 516. The photonic die 502 may include a first side 501 and a second side 503 opposite to each other. The electrical die 506 may include a third side 505 and a fourth side 507 opposite to each other. The first side (e.g., the frontside surface) 501 of photonic integrated circuit 502 may be attached to or otherwise stacked over the third side 505 of the electronic integrated circuit 506, and such two stacked circuits are disposed over the CoWoS 508 and the package substrate 510. The photonic die 502 of FIG. 5 is an implementation of the photonic die 300 of FIG. 3.

An index matching material 518 may be extending from a surface of the photonic die 502 on the second side (e.g., the backside surface) 503 into the middle portion of the photonic die 502. In some embodiments, the index matching material 518 may be at least of oxide and/or polymer (e.g., index matching to optical fiber material and BOX material). In certain embodiments, the index matching material may have an effective refractive index in a range of about 1.4 to about 1.6. The height of the backside opening (e.g., the height of the index matching material) can be about 200 micrometers (µm) to about 400 µm. The index matching material may be configured to optically couple an optical input signal to a grating coupler of the photonic die 502. The PIC 502 may be integrated with the EIC 506 by 3-dimensional stacking through the first conductive connectors 512. The first conductive connectors 512 can electrically and/or physically couple various dies (e.g., the stacked electrical die and optical die). The first conductive connectors 512 may be hybrid bonding, ball grid array (BGA) connectors, solder balls, metal pillars, controlled collapse chip connection (C4) bumps, micro bumps (µbump), electroless nickel-electroless palladium-immersion gold technique (ENEPIG) formed bumps, or the like. The EIC 506 may include at least a switch, a system on chip (SoC), an application-specific integrated circuit (ASIC), a central processing unit (CPU), or a graphics processing unit (GPU). In some embodiments, the CoWoS 508 may be one form of 3-dimensional integrated circuits. In some embodiments, the CoWoS 508 may be a substrate without active circuit elements formed thereon. In a CoWoS package, a variety of chips comprising active circuits are first attached to an interposer wafer using micro bumps (µbumps) to form a chip-on-wafer (CoW) structure. The variety of chips may be interconnected using through silicon vias (TSVs) in the interposer wafer. The CoW structure may then be attached to a substrate to form the completed CoWoS package. Further, it should be appreciated that over the package substrate 510, the site 102 can include any of various other dies attached thereto, for example, one or more memory dies 108, one or more processor dies 106, etc., while remaining within the scope of present disclosure.

In some embodiments, the semiconductor package 500 may further comprise a second photonic die also disposed above and attached to the third side 505 of the electrical die. The second photonic die may have a second index matching material extending from its backside surface into its middle portion. The second photonic die is laterally spaced apart from the photonic die 502.

The semiconductor package 500 may further include a number of second conductive connectors 522. The second conductive connectors 522 can electrically and/or physically couple the electrical die 506 to the CoWoS 508. The electrical die 506 may be attached to the CoWoS 508 on the fourth side (e.g., the backside surface of the electrical die) 507. In certain embodiments, the second conductive connectors 522 can be µbump, hybrid bonding, ball grid array (BGA) connectors, solder balls, metal pillars, controlled collapse chip connection (C4) bumps, micro bumps (µbump), electroless nickel-electroless palladium-immersion gold technique (ENEPIG) formed bumps, or the like.

As shown in FIG. 5, an optical transmission path extending from the backside of photonic die 502 (e.g., from the optical fiber 516) to a grating coupler exists. In various embodiments, such an optical transmission path is free from any of the conductive features. Stated another way, along this optical transmission path, no components formed of a conductive material exist, which can substantially limit interference induced by conductive features.

The photonic die 502 may further include a number of conductive features (e.g., redistribution layer (RDL) metal, backend of line (BEOL) processes for inter-metal, under bump metal (UBM)) disposed on the first side 501 of the photonic die. The electrical die 506 may also include a number of conductive features (e.g., redistribution layer (RDL) metal, backend of line (BEOL) processes for inter-metal, under bump metal (UBM)) disposed on the third side 505 of the electrical die. The conductive features may be disposed in a number of layers or levels, sometimes referred to as metallization layers. Generally, the metallization layers disposed closet to and farthest from the device features may be referred to as MO (the bottommost metallization layer) and Mx (the topmost metallization layer), respectively. Over the Mx, a number of pads (not shown) may be formed to electrically connect the conductive features therein to conductive features of the photonic die or electrical die.

In some embodiments, the electrical die may include a number of conductive features 520 (e.g., through silicon via (TSV)) disposed on the fourth side 507 of the electrical die 506. The conductive features 520 can electrically and/or physically couple the metallization layers of the electrical die to the second conductive connectors 522 (e.g., C4 bump) to one or more other devices/packages (e.g., CoWoS).

By flipping the stacked order between EIC and PIC, high-frequency signals may directly transport between PIC and EIC (e.g., switch/SoC) through the first conductive connectors 512. In some embodiments, the EIC can be integrated with switch/SoC in a single wafer. The present disclosure is able to transmit electrical signals at a significantly higher frequency/bandwidth and/or data rate (e.g., 250 Gbps per channel) between PIC and EIC, or between EIC and switch/SoC. The top metallization layers of the EIC (e.g., switch/SoC) can significantly reduce insertion loss. Power/ground and low-frequency signals can be through the TSV 520 in the switch/SoC to C4 bumps 522 to CoWoS 508 to BGA 524 and package substrate 510 (e.g., PCB). Note that the TSV can be tall (as for low-frequency signals) and be significantly easier in fabrication. By inserting an index matching material in the backside silicon of the PIC, the present disclosure may avoid using an unremovable molding compound to hold the silicon wafer. In this scenario, the light coupling path may not be blocked by the molding compound.

Figure 6:
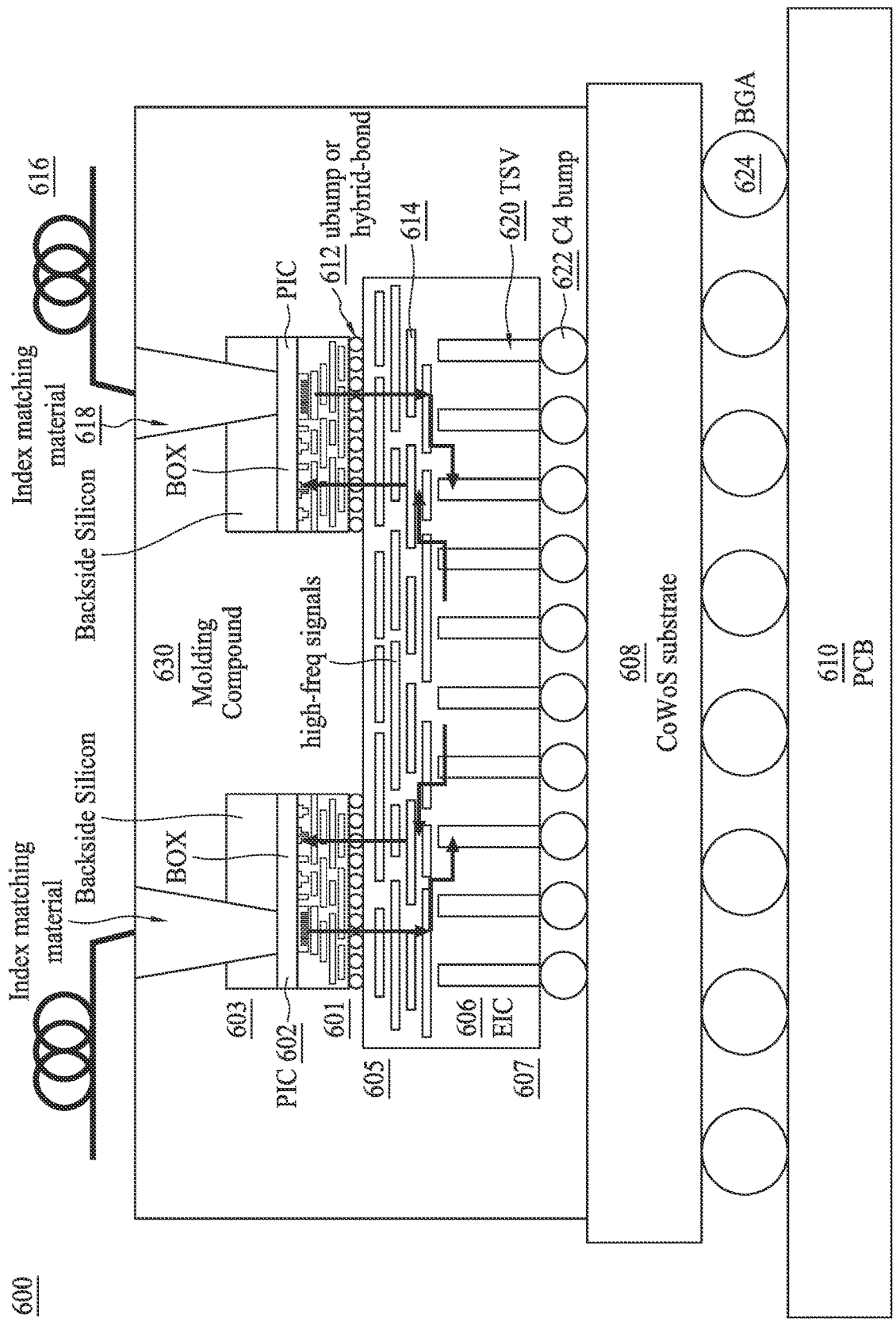
FIG. 6 illustrates a cross-sectional view of a portion of the site of FIG. 1, in accordance with some embodiments.

FIG. 6 illustrates another embodiment of a cross-sectional view of a portion of the site 102 of FIG. 1, in accordance with some embodiments. For example, the portion of the site 102 shown in FIG. 6 includes a semiconductor package 600. The semiconductor package 600 may include a photonic die 602 (e.g., photonic integrated circuit (PIC)), an electrical die 606 (e.g., electronic integrated circuit (EIC)), a Chip on Wafer on Substrate (CoWoS) 608, a package substrate 610 (e.g., printed circuit board (PCB)), a number of first conductive connectors 612 (e.g., μbump, hybrid bond), a number of first conductive features 620 (e.g., through silicon via (TSV)), a number of second conductive connectors 622 (e.g., C4 bump), a number of third conductive connectors 624 (e.g., ball array package (BGA)), an optical fiber 616, and a molding compound 630. The photonic die 602 may include a first side 601 and a second side 603 opposite to each other. The electrical die 606 may include a third side 605 and a fourth side 607 opposite to each other. The first side 601 of photonic integrated circuit 602 may be attached to or otherwise stacked over the third side 605 of the electronic integrated circuit 606, and such two stacked circuits are disposed over the CoWoS 608 and the package substrate 610. The photonic die 602 of FIG. 6 is an implementation of the photonic die 300 of FIG. 3. In some embodiments, the CoWoS 608 may be one form of 3-dimensional integrated circuits. In some embodiments, the CoWoS 608 may be a substrate without active circuit elements formed thereon.

FIG. 6 basically includes the same elements as FIG. 5. In FIG. 6, the main difference is that the whole PIC and EIC (e.g., switch, SoC) is protected by the molding compound 630. An index matching material 618 may be formed by filling an opening that extends through the molding compound 630 and the silicon substrate of the PIC 602. In some embodiments, the index matching material 618 may be at least of oxide and/or polymer (e.g., refractive index matching to optical fiber 616 material and BOX material). In certain embodiments, the index matching material may have an effective refractive index in a range of about 1.4 to about 1.6. The index matching material may be formed in the opening by using, for example, ECP or electro-less plating. The light is coupled in between the optical fiber 616 and a grating coupler of the PIC 602 through backside (e.g., the second side 603) of the silicon substrate opening.

As shown in FIG. 6, an optical transmission path extending from the surface of the molding compound 630 (e.g., from the optical fiber 616) to the backside of photonic die 602, and reaching a grating coupler exists. In various embodiments, such an optical transmission path is free from any of the conductive features. Stated another way, along this optical transmission path, no components formed of a conductive material exist, which can substantially limit interference induced by conductive features.

By flipping the stacked order between EIC and PIC, high-frequency signals may directly transport between PIC and EIC (e.g., switch/SoC) through the first conductive connectors 612. In some embodiments, the EIC can be integrated with switch/SoC in a single wafer. The present disclosure is able to transmit electrical signals at a significantly higher frequency/bandwidth and/or data rate (e.g., 250 Gbps per channel) between PIC and EIC, or between EIC and switch/SoC. The top metallization layers of the EIC (e.g., switch/SoC) can significantly reduce insertion loss. Power/ground and low-frequency signals can be through the TSV 620 in the switch/SoC to C4 bumps 622 to CoWoS 508 to BGA 624 and package substrate 610 (e.g., PCB). Note that the TSV can be tall (as for low-frequency signals) and be significantly easier in fabrication. The molding compound may be patterned to have light path opening and filled with the index matching material (e.g., refractive index matching to optical fiber material and underneath material).

Figures 1, 7:
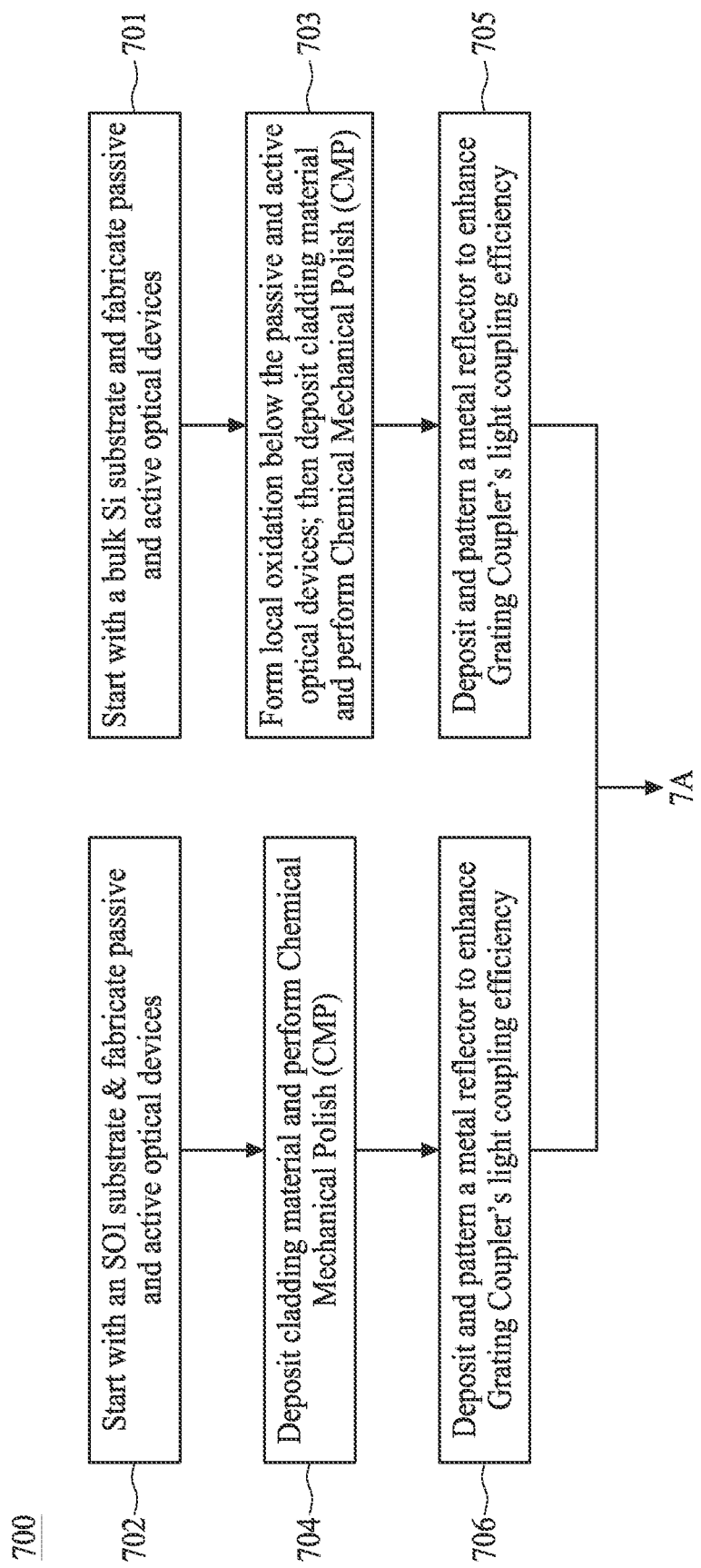
Figures 2, 7:
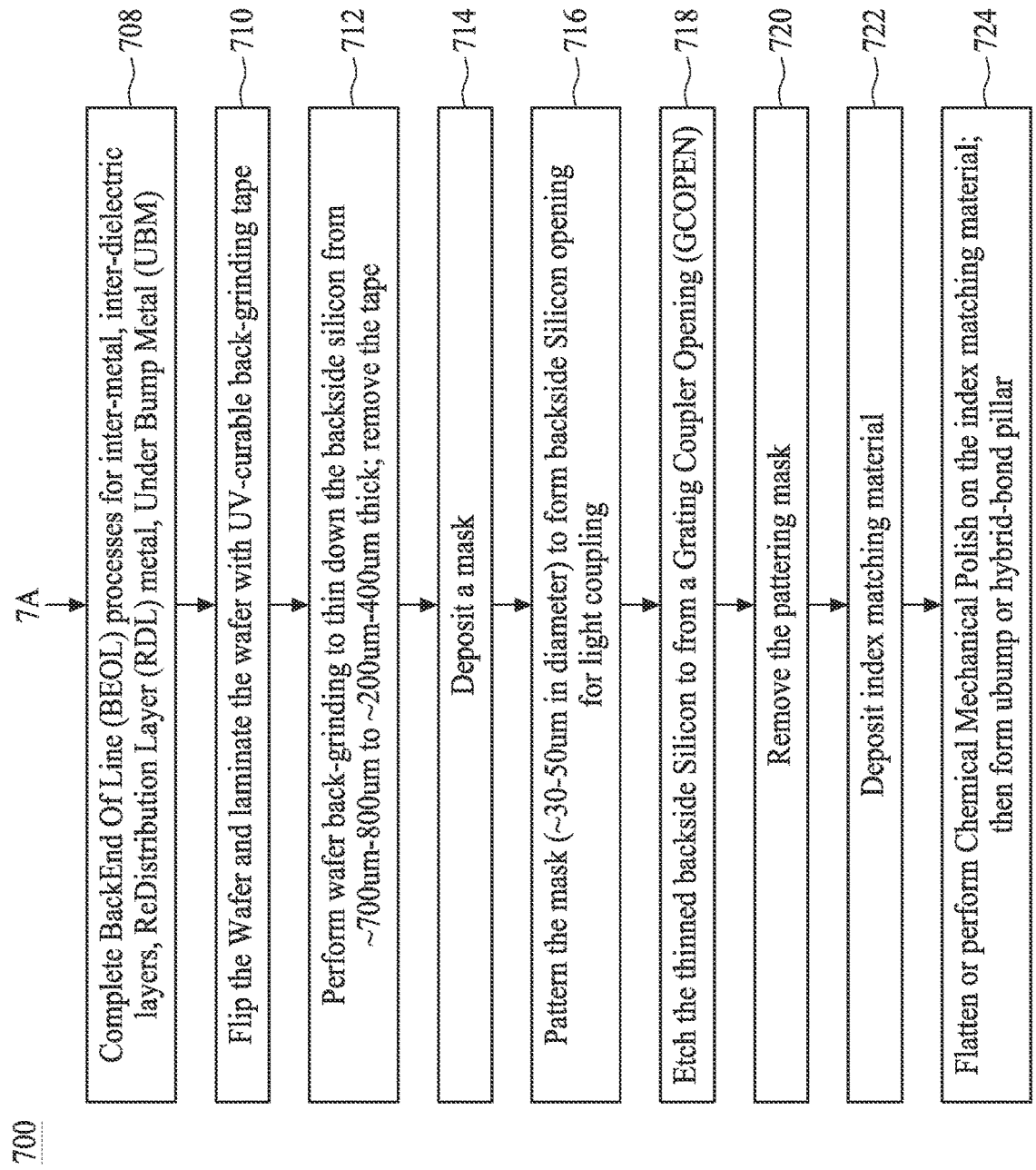

FIGS. 7-1 and 7-2 are a flowchart of an exemplary method for fabricating a photonic integrated circuit (PIC), in accordance with some embodiments. FIGS. 8-1a-1, 8-1a-2, 8-1a-3, 8-1b-1, 8-1b-2, 8-1b-3, 8-2, 8-3, 8-4, 8-5, 8-6, 8-7, 8-8, 8-9, and 8-10 are schematic cross-sectional views of an example photonic integrated circuit during various fabrication stages, in accordance with some embodiments. It is understood that FIGS. 7-1 and 7-2, and FIGS. 8-1a-1, 8-1a-2, 8-1a-3, 8-1b-1, 8-1b-2, 8-1b-3, 8-2, 8-3, 8-4, 8-5, 8-6, 8-7, 8-8, 8-9, and 8-10 have been simplified for a better understanding of the concepts of the present disclosure. Accordingly, it should be noted that additional processes may be provided before, during, and after the methods of FIGS. 7-1 and 7-2, and 8-1a-1, 8-1a-2, 8-1a-3, 8-1b-1, 8-1b-2, 8-1b-3, 8-2, 8-3, 8-4, 8-5, 8-6, 8-7, 8-8, 8-9, and 8-10, and that some other processes may only be briefly described herein.

As shown in FIGS. 7-1 and 8-1a-1, operations 702 can provide a silicon-on-insulator (SOI) substrate 802 with fabricated passive optical devices 806, active optical devices 804 and a grating coupler 808. In some embodiments, the SOI substrate 802 may include three-layered wafers made of a Si substrate, an insulator layer (or buried oxide (BOS) layer), and an upper Si layer (e.g., device layer). The insulator layer may be, for example, a BOX layer, a silicon oxide layer, or the like. The insulator layer is provided on a semiconductor material, typically a silicon or glass substrate. The passive optical devices 806 may comprise at least one of a waveguide, a grating coupler, a splitter, a ring resonator, or a mach zehnder interferometer. The active optical devices 804 may comprise at least one of a phase shifter, a micro-ring modulator, a mach zehnder modulator, or a photodetector. The grating coupler 808 can allow the waveguide to transmit light to or receive light from the overlying light source or optical signal source (e.g., through an optical fiber). The grating coupler 808 may be formed by acceptable photolithography and etching techniques. In an embodiment, the grating coupler 808 is formed after the waveguide is defined. For example, a photoresist may be formed and developed on the front side of the overlaying semiconductor material (e.g., on the waveguide and in the recesses defining them). The photoresist may be patterned with openings corresponding to the grating coupler 808. One or more etching processes may be performed using the patterned photoresist as an etching mask. In particular, the front side of the overlaying semiconductor material may be etched to form recesses in the waveguide, thereby defining the grating coupler 808. The etching processes may be an anisotropic wet or dry etch. In some embodiments, an oxide layer can be interposed between the grating coupler and the silicon substrate.

Figures 1, 1A, 8:
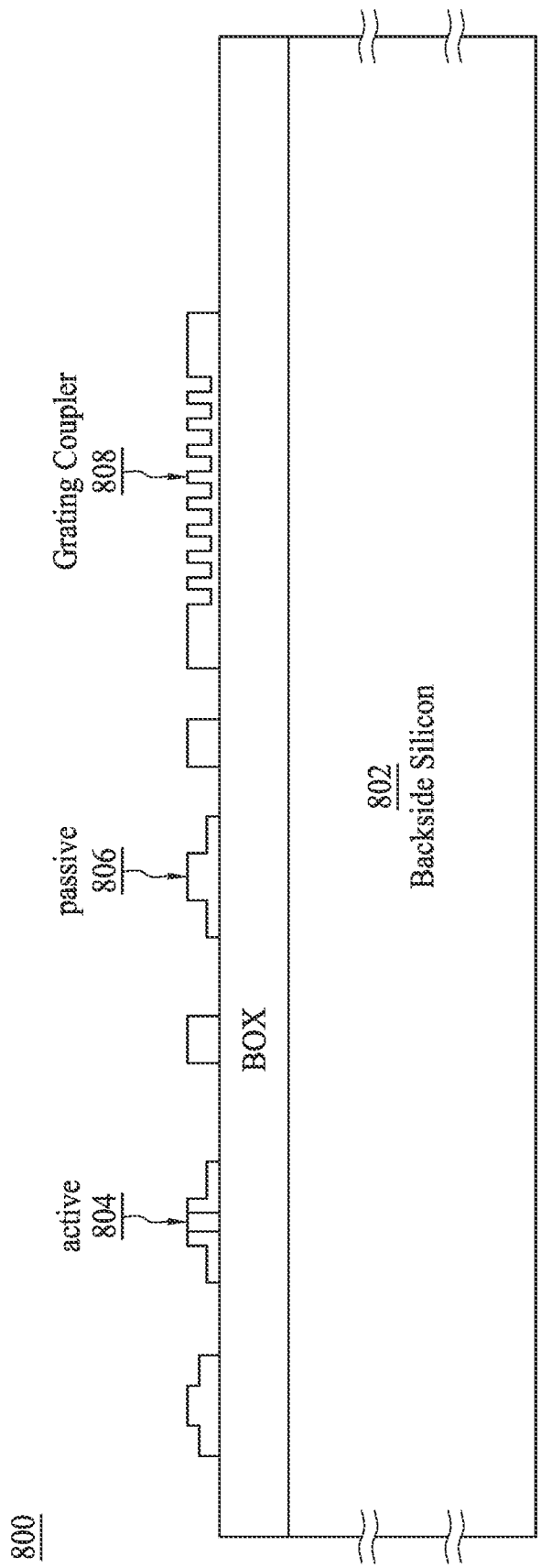
Figures 1A, 2, 8:
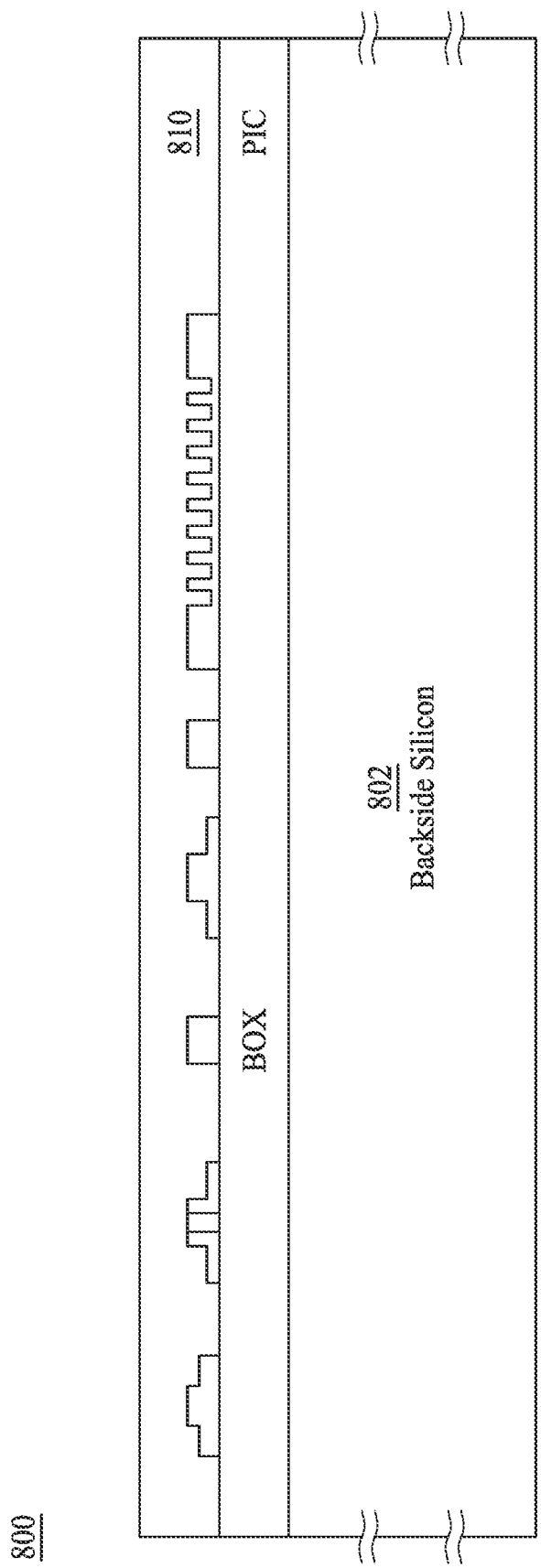
Figures 1A, 3, 8:
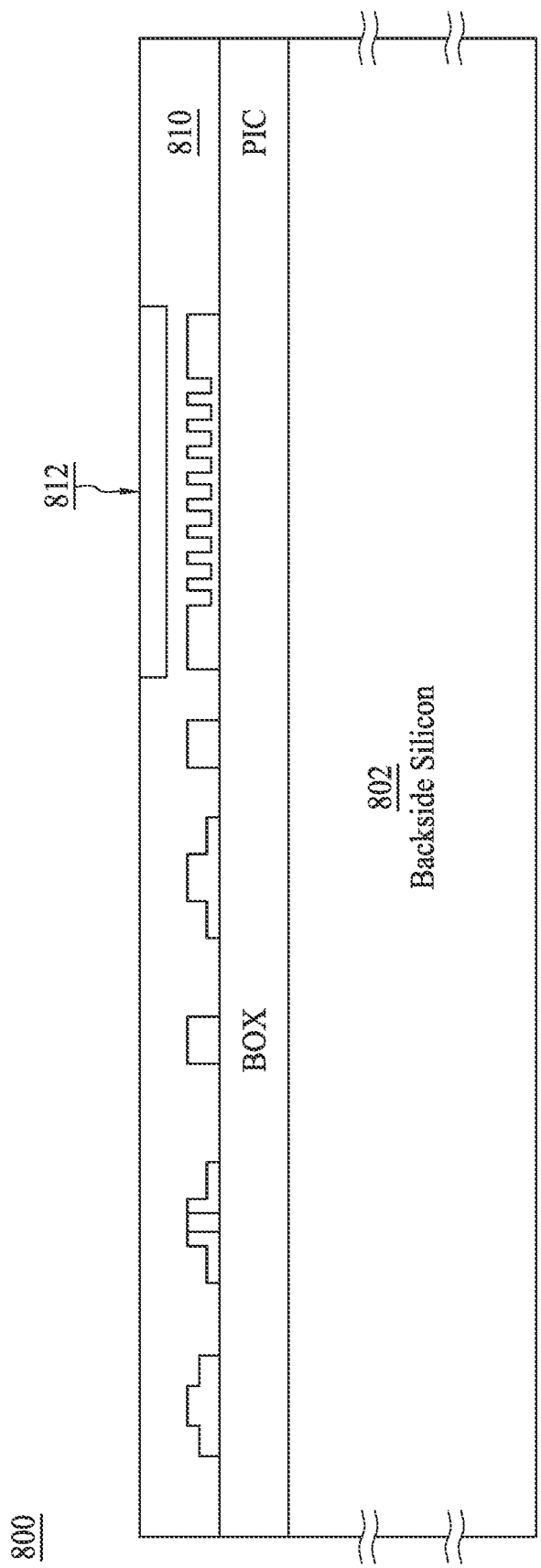

Referring now to operation 704 and FIG. 8-1a-2, a cladding material 810 may be formed over the top of the grating coupler 808, the passive optical devices 806, and the active optical devices 804. The cladding material may include, but are not limited to, $SiO_2$ and a polymer, and may be formed by chemical vapor deposition (CVD), physical vapor deposition (PVD), atomic layer deposition (ALD), a spin-on-dielectric process, the like, or a combination thereof. After formation, the cladding material 810 may be planarized, such as by a chemical mechanical polish (CMP) or a mechanical grinding.

Referring now to operation 706 and FIG. 8-1a-3, a metal reflector 812 may be deposited and patterned to enhance light coupling efficiency of the grating coupler 808. The metal reflector 812 may include, but are not limited to, Cu, TaN, TiN, or Al. In some embodiments, the metal reflector 812 may be formed by chemical vapor deposition (CVD), physical vapor deposition (PVD), atomic layer deposition (ALD), a spin-on-dielectric process, the like, or a combination thereof. After formation, the metal reflector 812 may be planarized, such as by a chemical mechanical polish (CMP) or a mechanical grinding. The metal reflector 812 is then patterned using photolithography techniques, and etched using plasma etch processes.

Figures 1, 1B, 8:
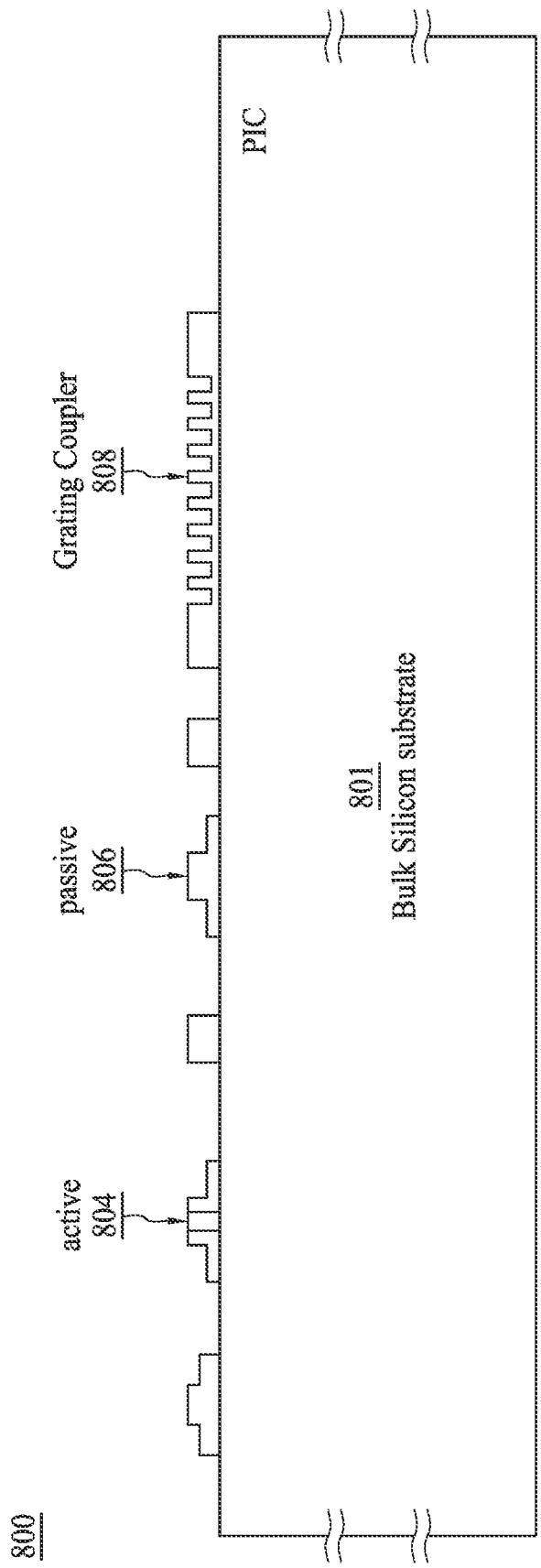
Figures 1B, 2, 8:
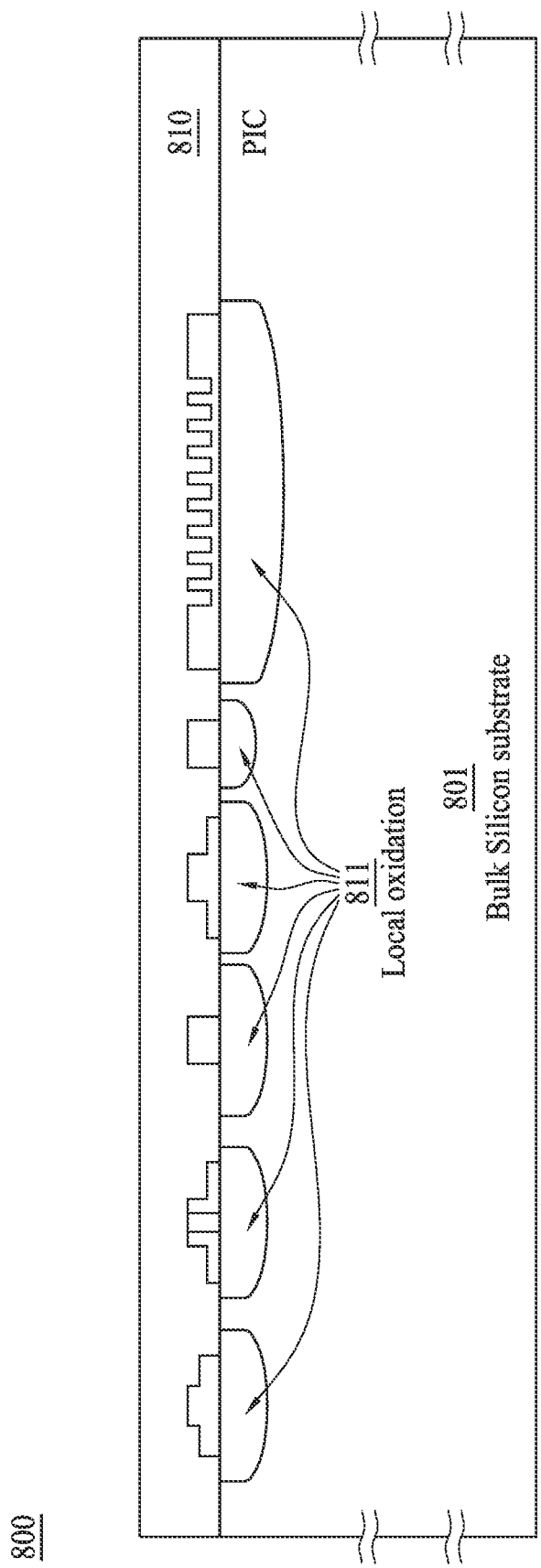
Figures 1B, 3, 8:
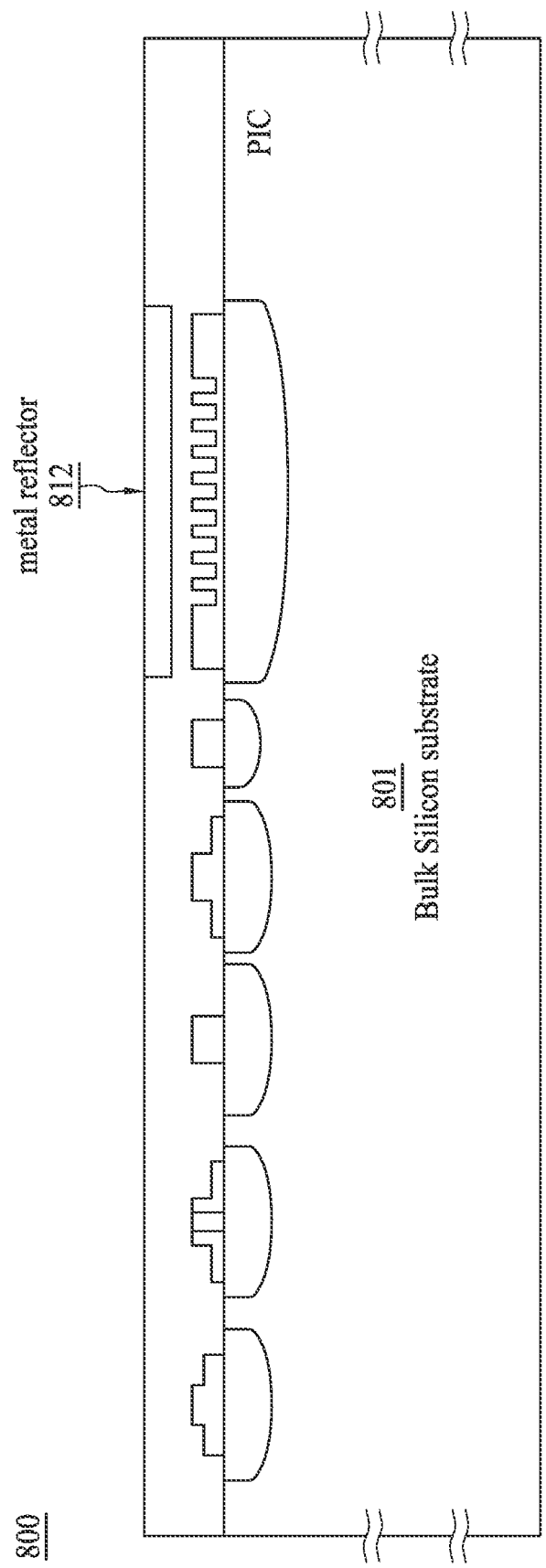
Figures 2, 8:
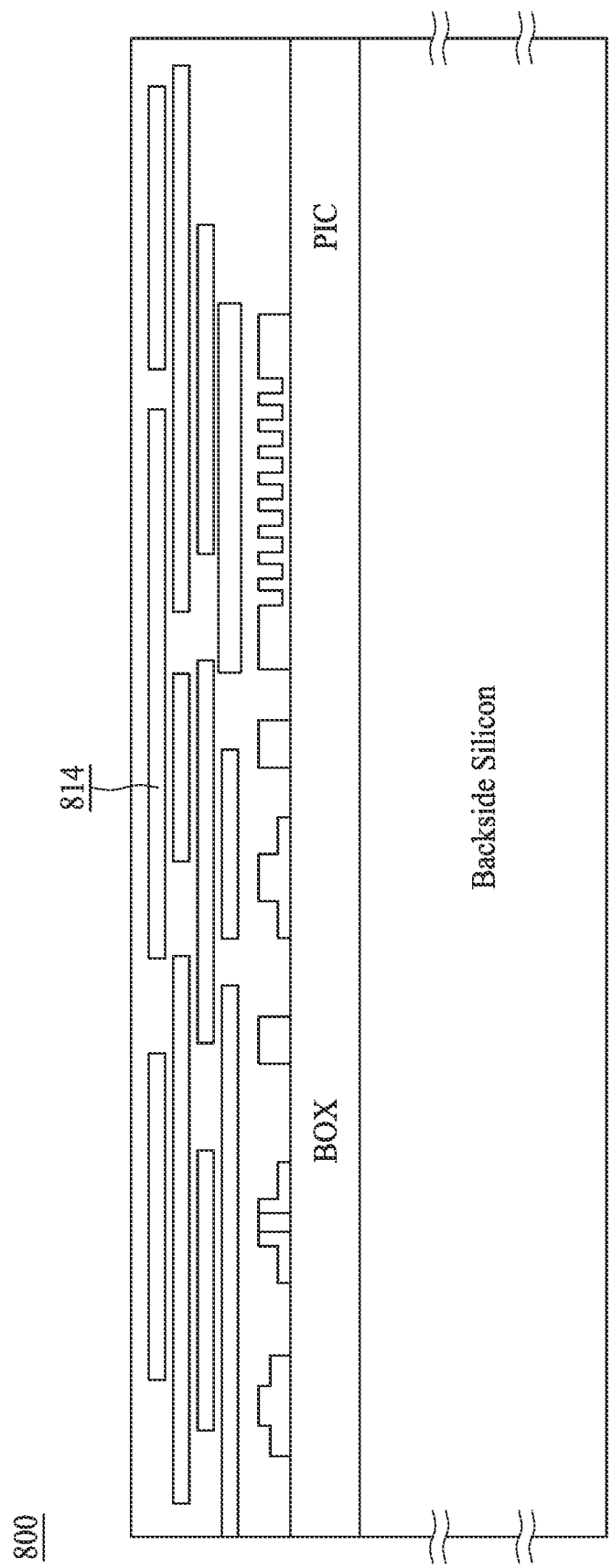
Figures 3, 8:
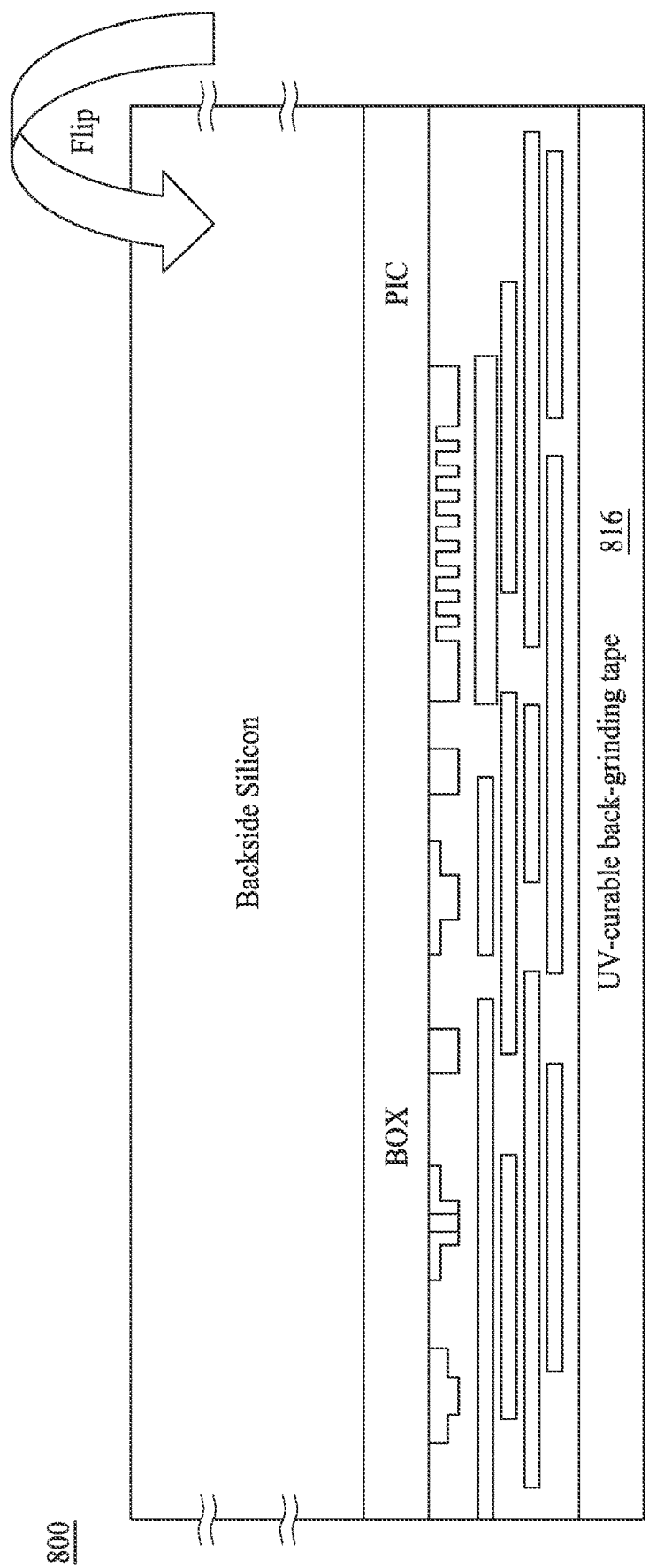
Figures 4, 8:
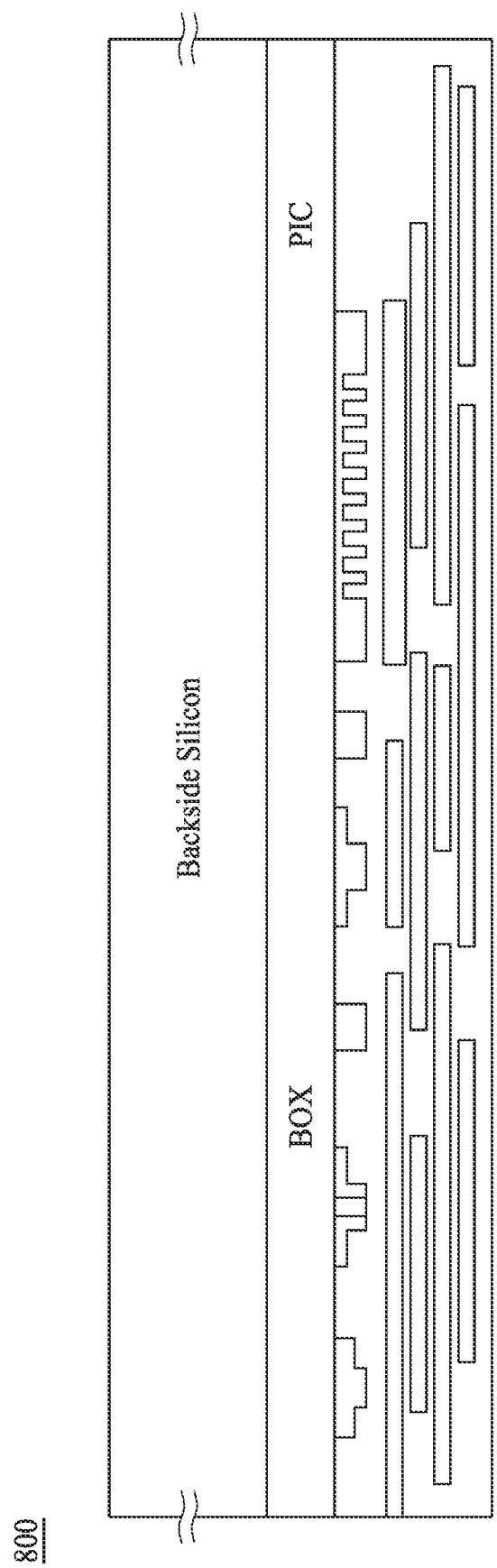
Figures 5, 8:
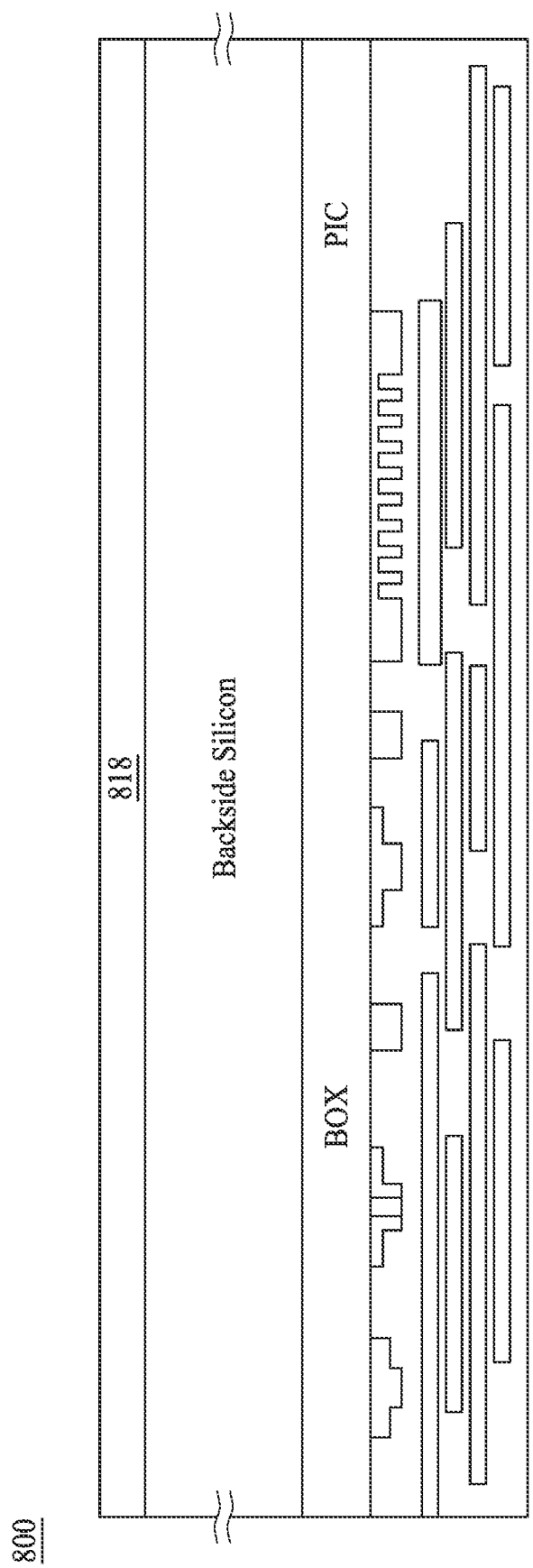
Figures 6, 8:
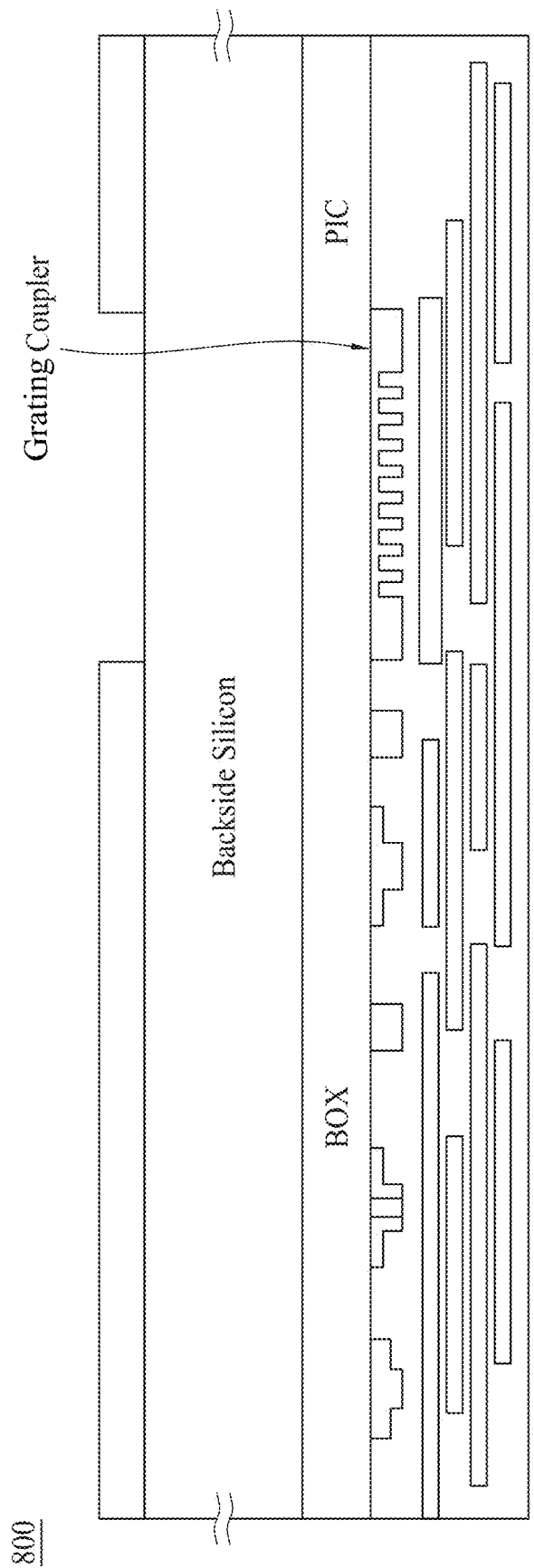
Figures 7, 8:
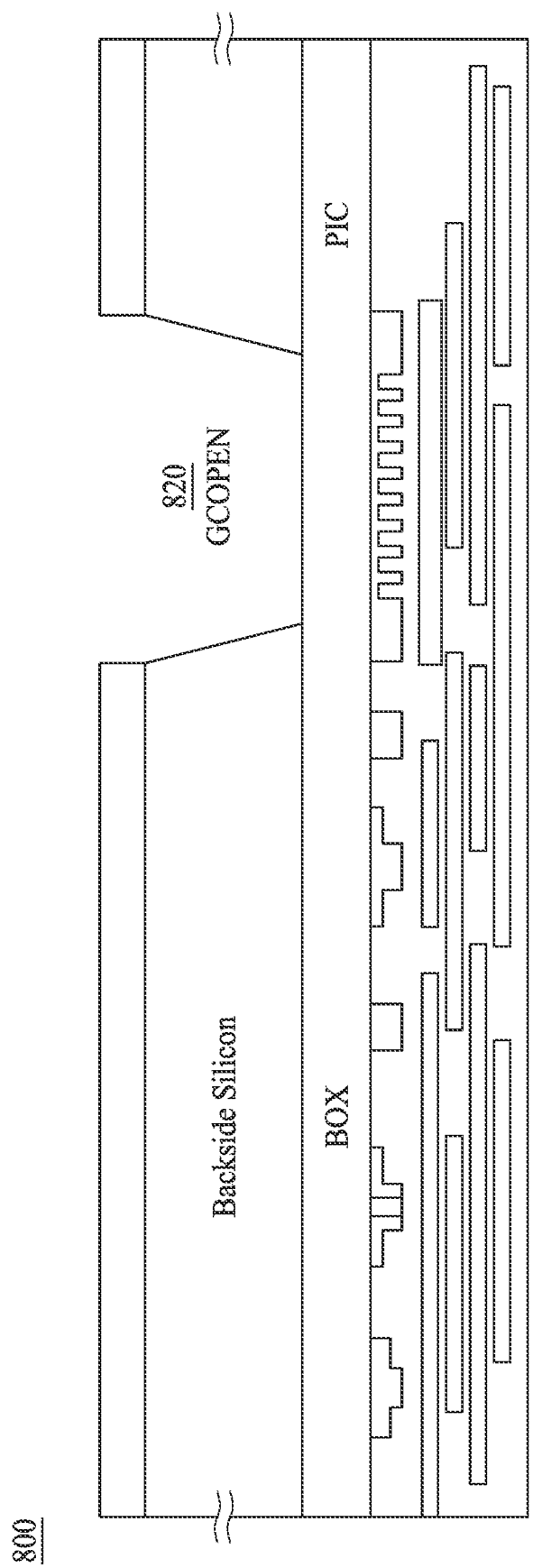
Figure 8:
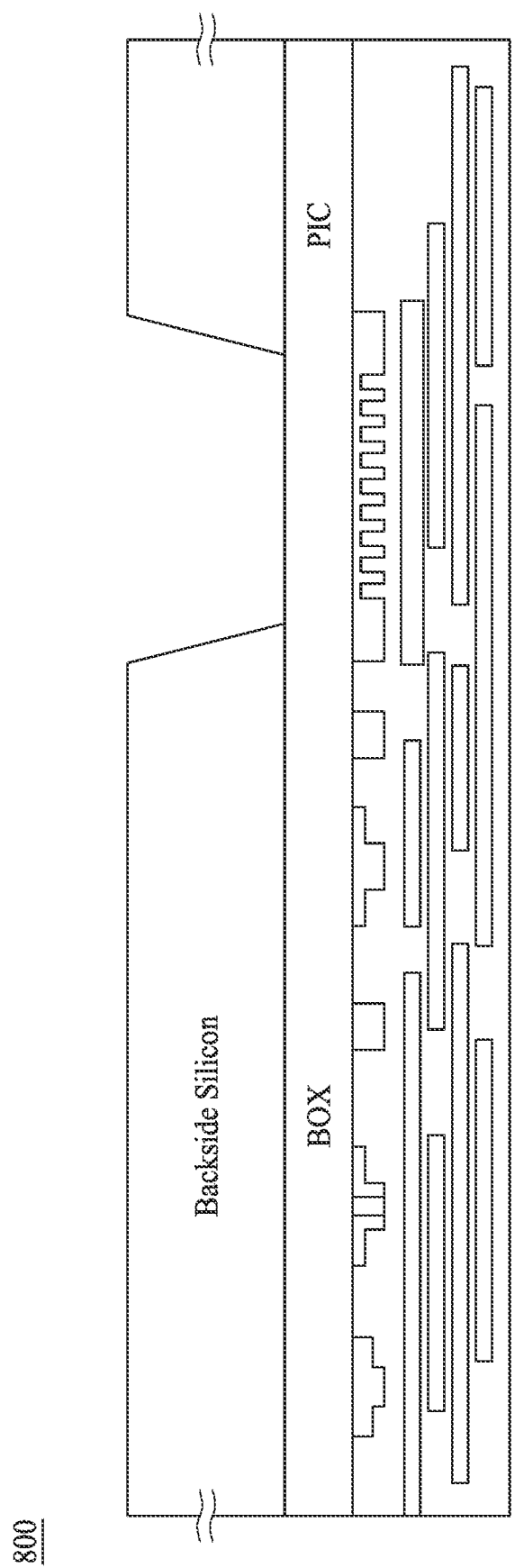

Note that the starting material can be a bulk Si substrate 801 instead of an SOI substrate, as shown in FIGS. 8-1b-1 and operation 701. In some embodiments, operations 701 can provide a bulk Si substrate 801 with fabricated passive optical devices 806, active optical devices 804, and a grating coupler 808. Followed by operation 703, a local oxidation 811 may be formed below the passive optical devices, the active optical devices, and the grating coupler, and a cladding material 810 may be formed over the top of the grating coupler 808, the passive optical devices 806, and the active optical devices 804. An oxide layer can be interposed between the grating coupler and the silicon substrate.

Referring now to operation 705 and FIG. 8-1b-3, a metal reflector 812 may be deposited and patterned to enhance light coupling efficiency of the grating coupler 808. The metal reflector 812 may include, but are not limited to, Cu, TaN, TiN, or Al. In some embodiments, the metal reflector 812 may be formed by chemical vapor deposition (CVD), physical vapor deposition (PVD), atomic layer deposition (ALD), a spin-on-dielectric process, the like, or a combination thereof. After formation, the metal reflector 812 may be planarized, such as by a chemical mechanical polish (CMP) or a mechanical grinding. The metal reflector 812 is then patterned using photolithography techniques, and etched using plasma etch processes. The rest of the fabrication flow for the bulk Si substrate can be kept the same as for the SOI substrate case.

Next, the method 700 proceeds to operation 708 of completing back end of line (BEOL) processes. The BEOL processes may include inter-metal, inter-dielectric layers, redistribution layer (RDL) metal, or under bump metal (UBM). FIG. 8-2 is a cross-sectional view of the semiconductor package 800 in which conductive features 814 may be disposed in a number of layers or levels, sometimes referred to as metallization layers. The metallization layers may be formed over the grating coupler. Generally, the metallization layers disposed closet to and farthest from the device features may be referred to as M0 (the bottommost metallization layer) and Mx (the topmost metallization layer), respectively. Over the Mx, a number of pads (not shown) may be formed to electrically connect the conductive features therein to conductive features of a photonic die. Next, the semiconductor package 800 may be flipped over and laminated with an UV-curable back-grinding tape 816 (as shown in operation 710 and FIG. 8-3). The backside silicon of the semiconductor package may be planarized, such as by a chemical mechanical polish (CMP) or a mechanical grinding, from 700-800 μm to 200-400 μm without warping or breaking the backside silicon, followed by removing the UV-curable back-grinding tape (as shown in operation 712 and FIG. 8-4). The thickness (e.g., 200-400 μm) of the backside silicon may prevent Si wafer from warping.

Next, the method 700 proceeds to operations 714, 716, and 718 (as shown in FIGS. 8-5, 8-6, and 8-7) of forming a grating coupler opening (GCOPEN). A mask 818 may be formed over a second (back) surface/side of the backside silicon of the photonic die 800. The mask may be patterned to form a backside silicon opening 820 for light coupling. Patterning the mask material may be accomplished with acceptable photolithography and etching techniques. The mask may be patterned with openings corresponding to a grating coupler. One or more etching processes may be performed using a patterned mask (e.g., photoresist). As shown in FIG. 8-7, based on the patterns of the mask 818, the backside silicon surface may present an opening with 30-50 um in diameter. A grating coupler opening (GCOPEN) may be formed to encompass a grating coupling area.

Figures 8, 9:
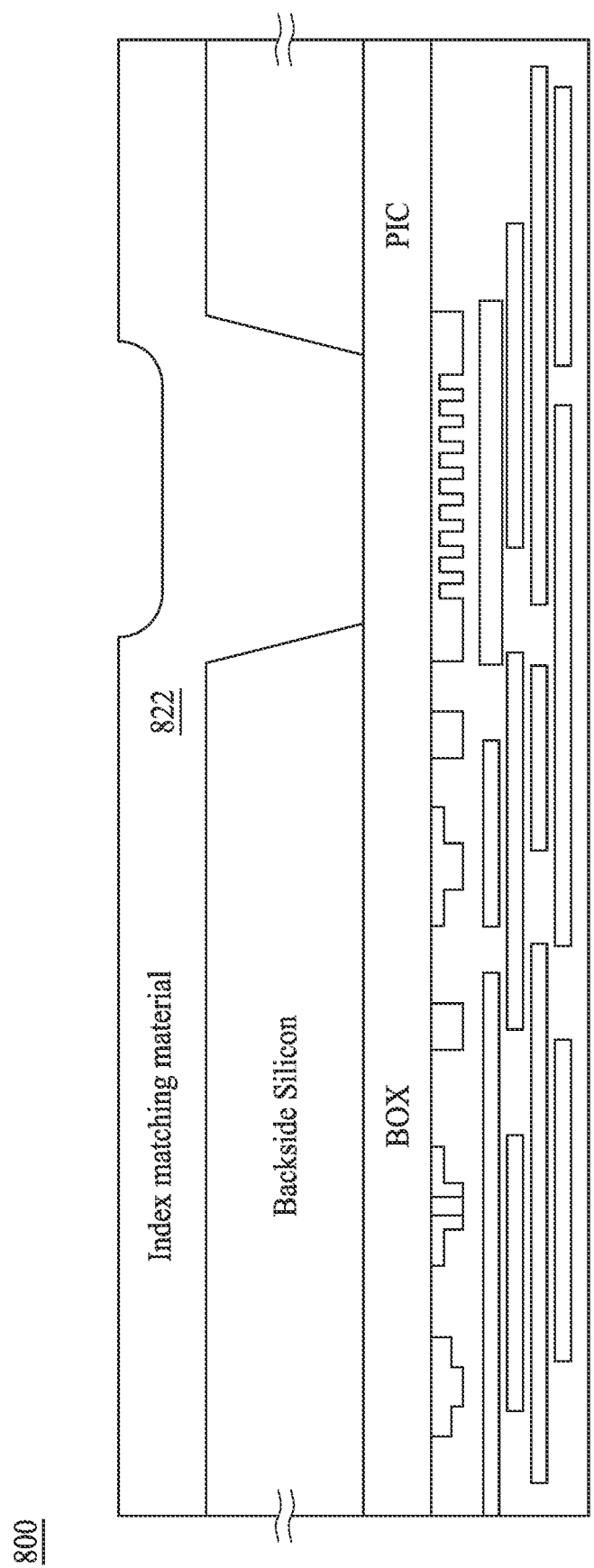
Figures 8, 9, 10:
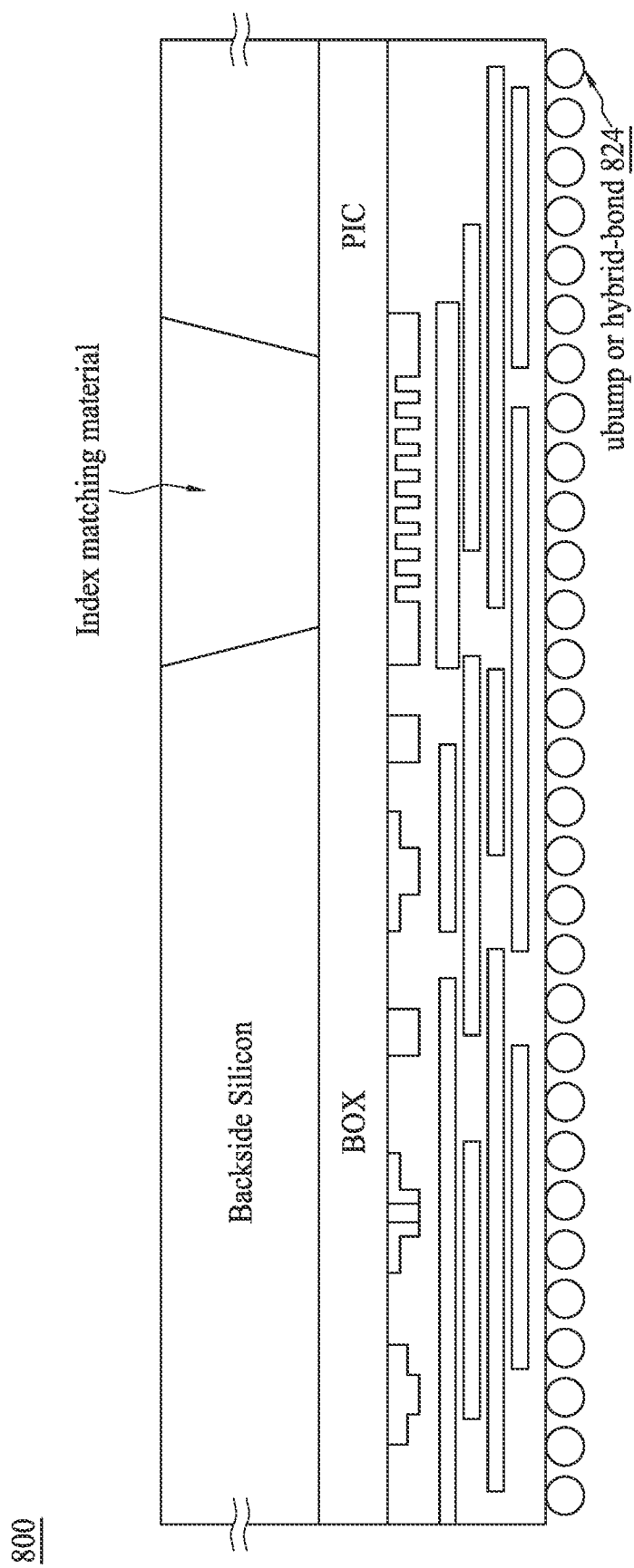
Figure 9:
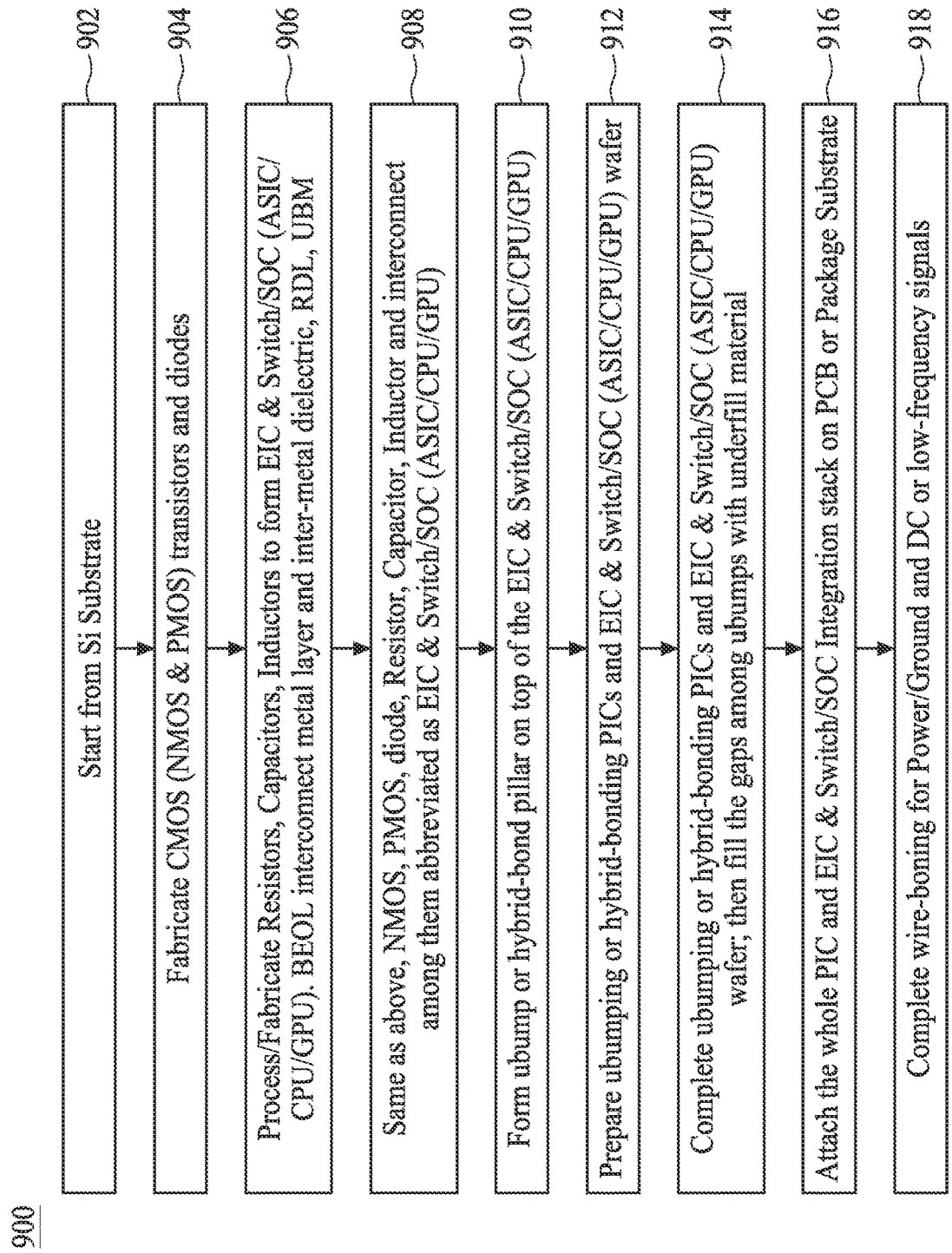
Figures 1, 10:
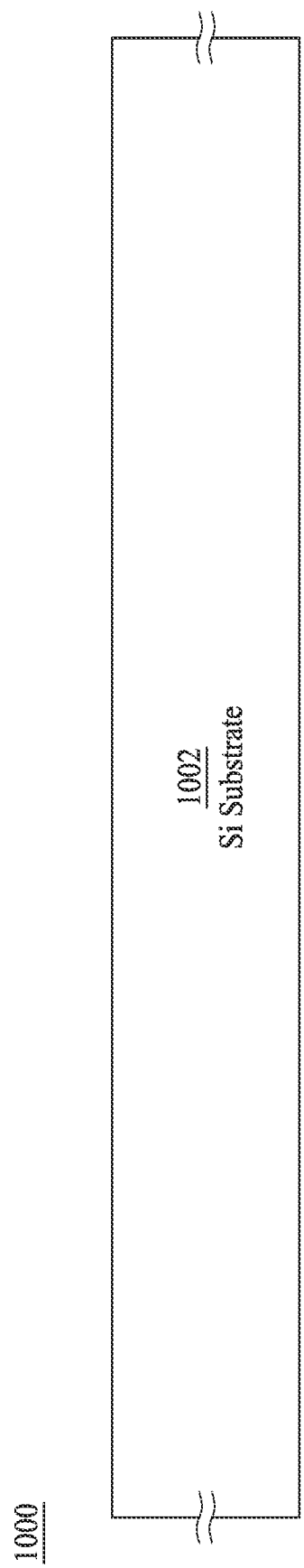
Figures 2, 10:
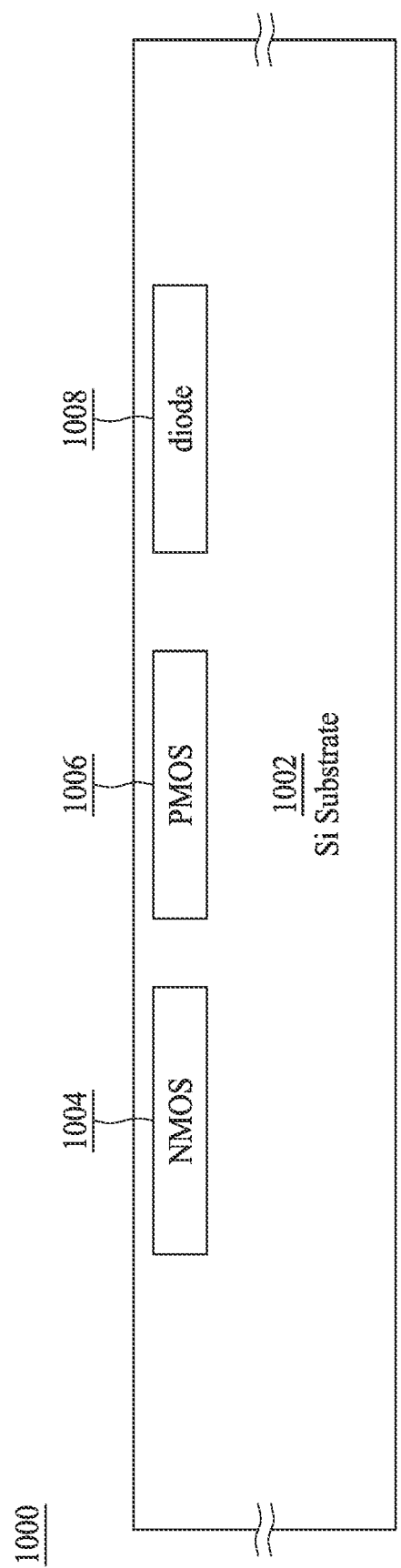
Figures 3, 10:
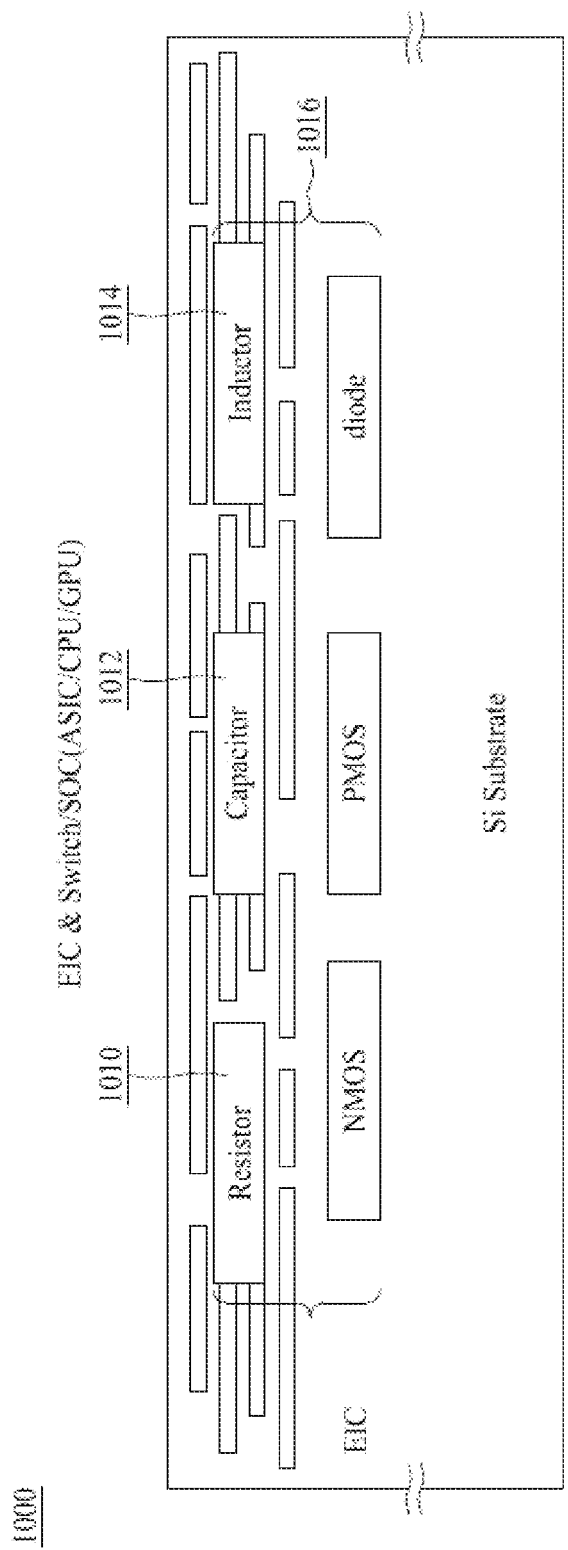
Figures 4, 10:
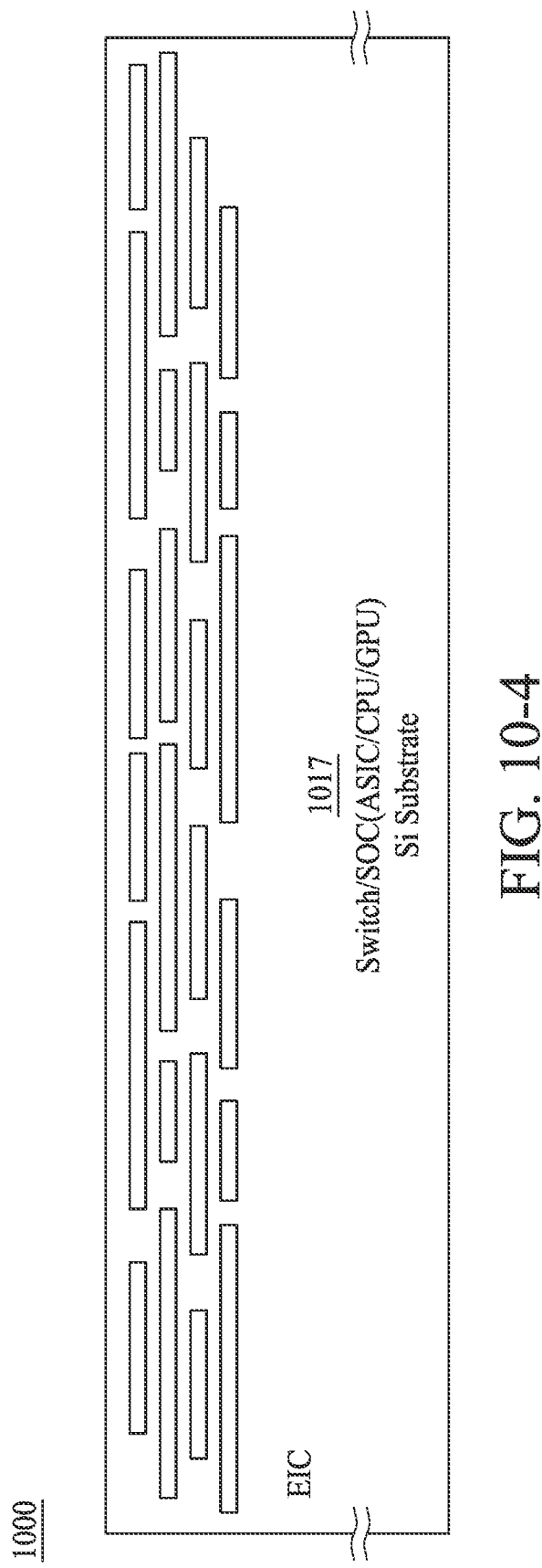
Figures 5, 10:
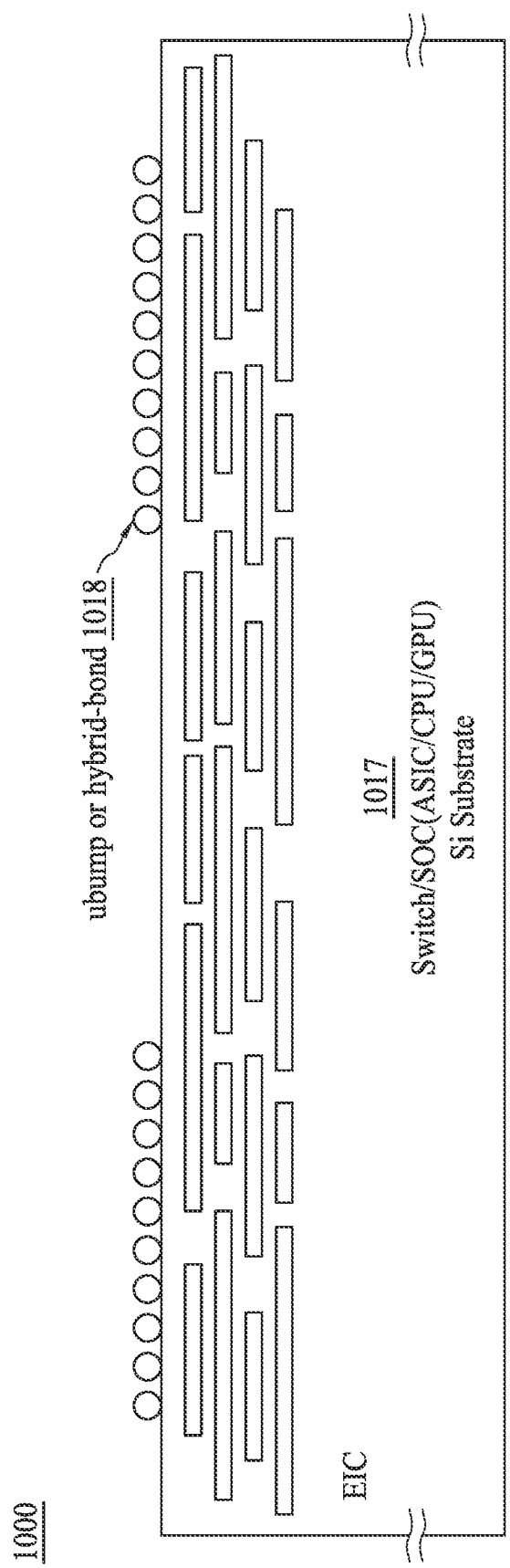
Figures 6, 10:
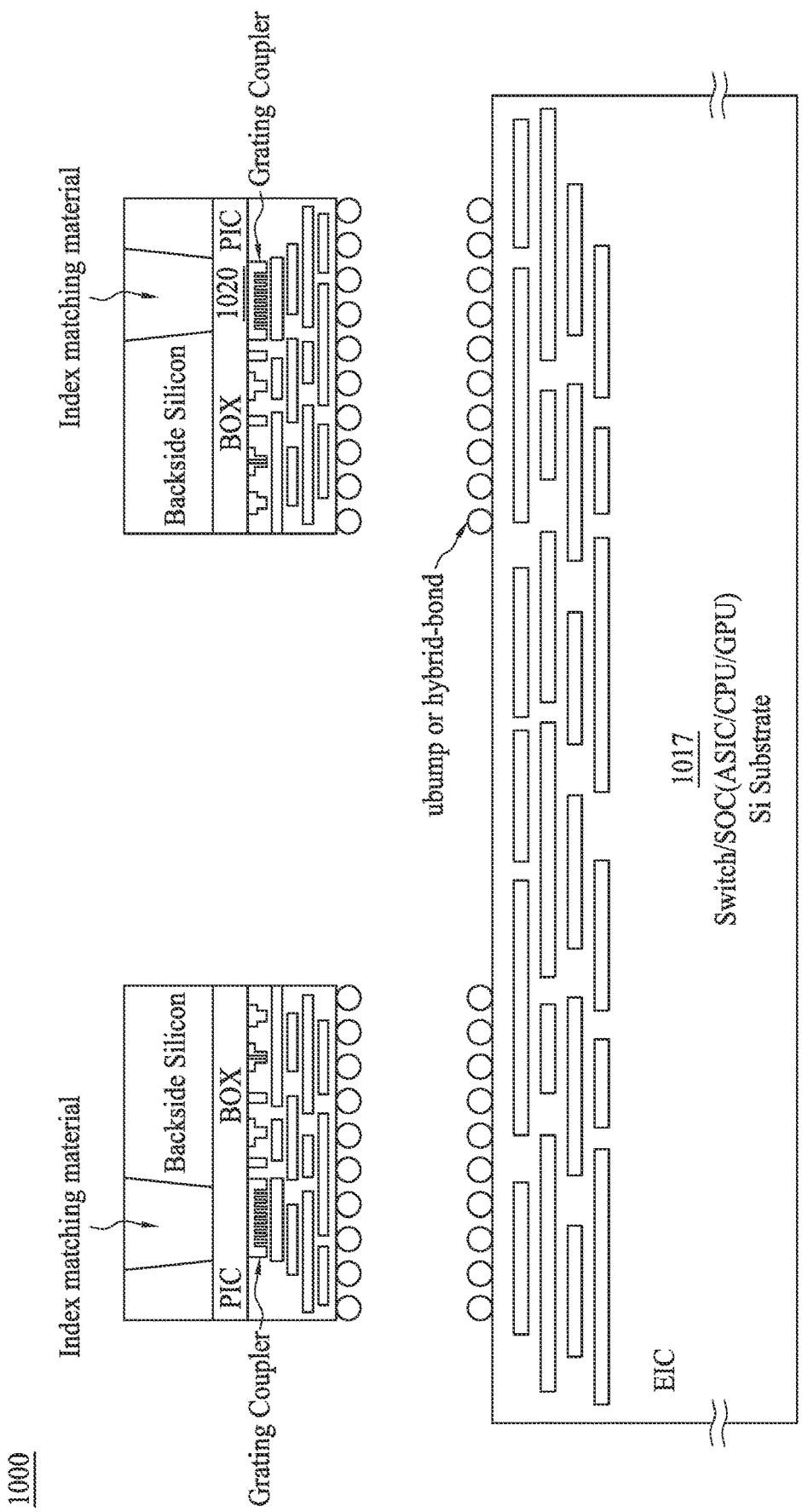
Figures 7, 10:
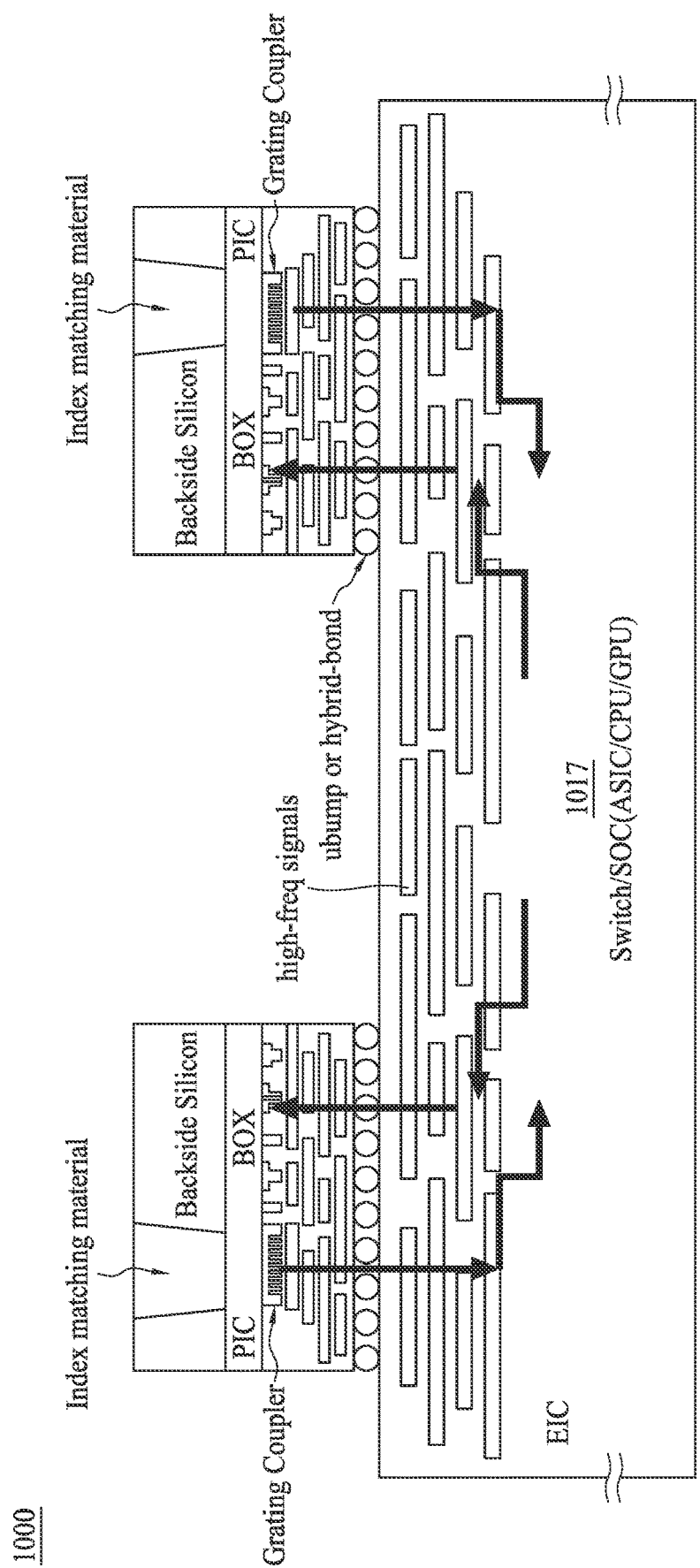
Figures 8, 10:
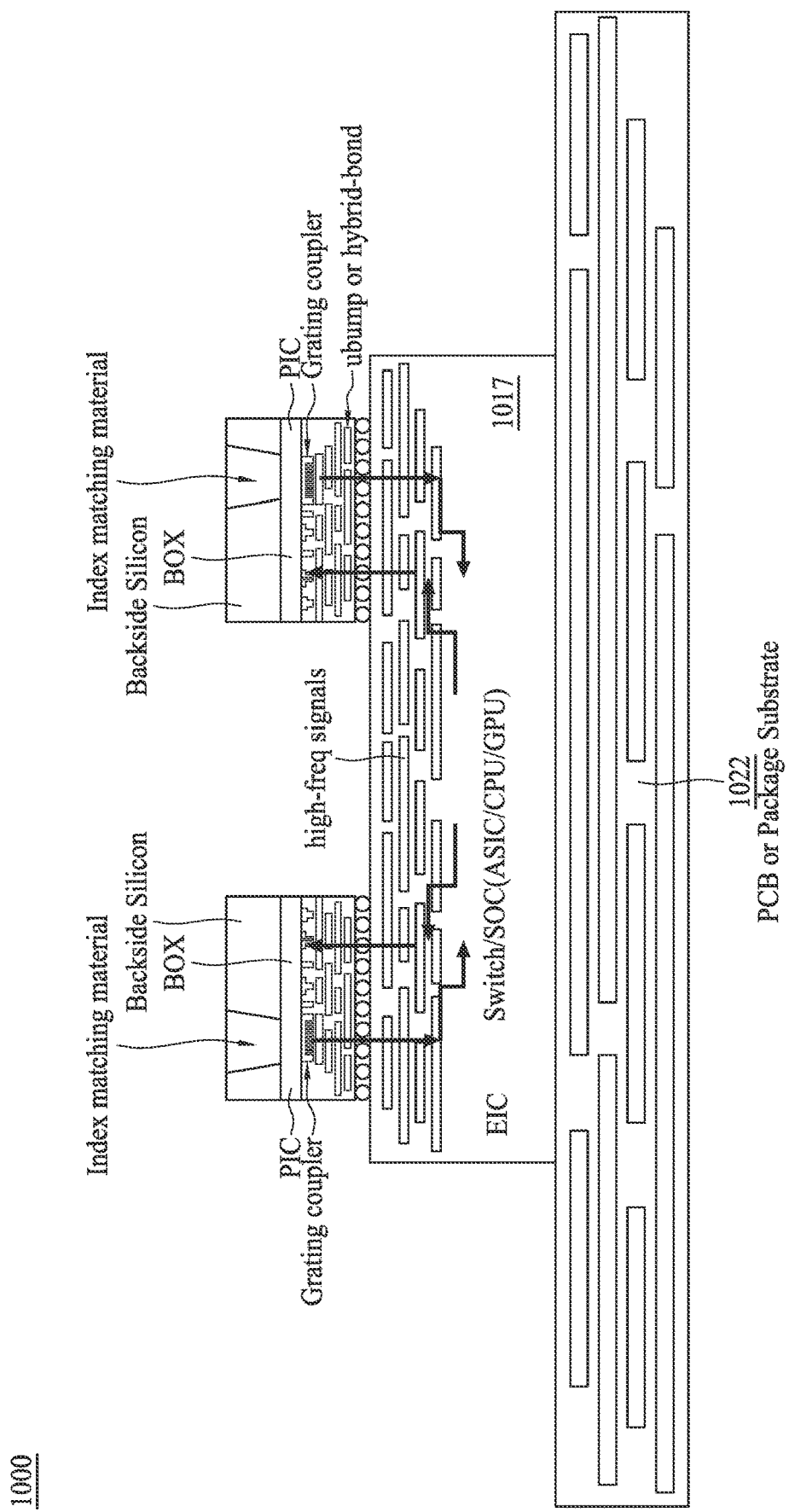
Figures 9, 10:
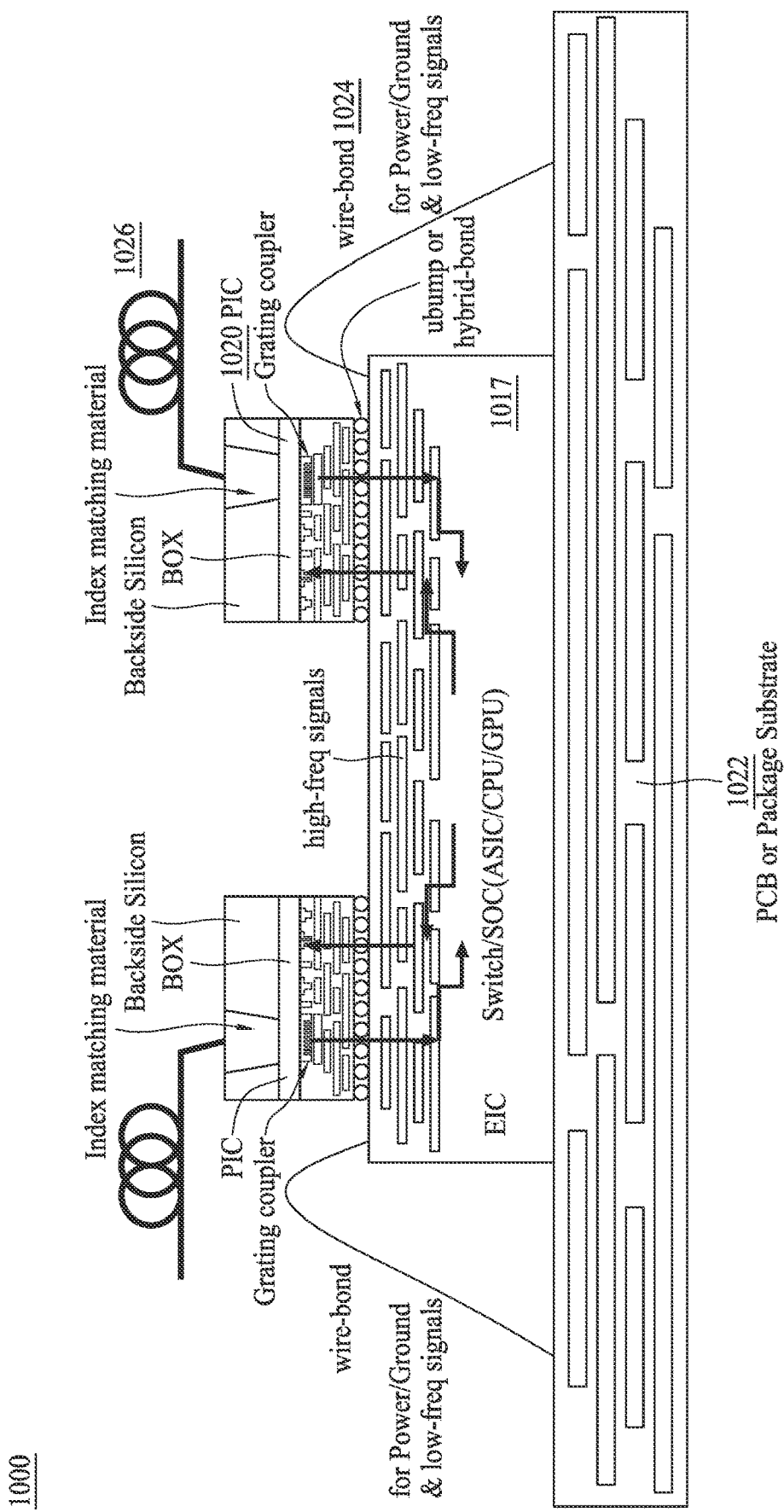

Next, the method 700 proceeds to operations 720, 722, and 724 (as shown in FIGS. 8-8, 8-9, and 8-10) of forming an index matching material. After removing the pattern mask 818, an index matching material 822 may be formed over the grating coupler opening (GCOPEN). The index matching material may be formed in the opening using, for example, ECP or electro-less plating. In some embodiments, the index matching material 822 may be at least of oxide and/or polymer (e.g., index matching to optical fiber material and BOX material). In certain embodiments, the index matching material may have an effective refractive index in a range of about 1.4 to about 1.6. After formation, the index matching material 822 may be planarized, such as by a chemical mechanical polish (CMP) or a mechanical grinding. The height of the backside opening (e.g., the height of the index matching material) can be about 200 micrometers (μm) to about 400 μm. Conductive connectors 824 may be formed on the frontside of the semiconductor package 800 (as shown in FIG. 8-10). The conductive connectors 824 may be ball grid array (BGA) connectors, solder balls, metal pillars, hybrid bond pillar, controlled collapse chip connection (C4) bumps, micro bumps (μbump), electroless nickel-electroless palladium-immersion gold technique (ENEPIG) formed bumps, or the like. The frontside of the photonic integrated circuit (PIC) may be used for electrical coupling. The backside of the PIC may be used for light coupling. The light coupling between an optical fiber and a grating coupler may be employing though the backside grating coupler opening filled with the index matching material without using an unremovable molding compound.

FIG. 9 is a flowchart of an exemplary method for fabricating a semiconductor package 400 shown in FIG. 4, in accordance with some embodiments. FIGS. 10-1, 10-2, 10-3, 10-4, 10-10-6, 10-7, 10-8, and 10-9 are schematic cross-sectional views of an example semiconductor package during various fabrication stages, in accordance with some embodiments. It is understood that FIG. 9, and FIGS. 10-1, 10-2, 10-3, 10-4, 10-5, 10-6, 10-7, 10-8, and 10-9 have been simplified for a better understanding of the concepts of the present disclosure. Accordingly, it should be noted that additional processes may be provided before, during, and after the methods of FIGS. 9, and 10-1, 10-2, 10-3, 10-4, 10-5, 10-6, 10-7, 10-8, and 10-9, and that some other processes may only be briefly described herein.

Referring now to FIG. 9 in conjunction with FIGS. 10-1, 10-2, 10-3, 10-4, 10-5, 10-6, 10-7, 10-8, and 10-9, a semiconductor package 1000 can be fabricated in accordance with the method 900 of FIG. 9. As shown in FIGS. 9, 10-1, 10-2, 10-3, and 10-4, operation 902 can provide a Si substrate 1002. The Si substrate 1002 may be fabricated with CMOS transistors (e.g., NMOS 1004, PMOS 1006) and diodes 1008 (operation 904 and FIG. 10-2) over a frontside surface of the Si substrate 1002. In some embodiments, the NMOS and the PMOS can be narrow-sheet transistors, gate-all-around transistors, FinFET transistors, or planar transistors. The Si substrate may be further fabricated with resistors 1010, capacitors 1012, and inductors 1014 to form electronic integrated circuit (EIC) and switch/SoC (specific integrated circuit (ASIC)/central processing unit (CPU)/graphics processing unit (GPU)) (operation 906 and FIG. 10-3). The backend of line (BEOL) processes for interconnect metal layers, inter-metal dielectric, RDL, UBM may be formed in the upper (e.g., frontside) Si substrate (FIG. 10-3). The interconnect metal layers may be formed over the transistors. NMOS, PMOS, diodes, resistors, capacitors, inductors, and interconnects may be abbreviated as EIC & Switch/SoC (ASIC/CPU/GPU) 1017 (operation 908 and FIG. 10-4).

Next, the method 900 proceeds to operations 910, 912, and 914 (as shown in FIGS. 10-5, 10-6, and 10-7) of forming first conductive connectors. Micro bumps and/or hybrid-bond pillars 1018 may be formed on the top of the EIC & Switch/SoC (ASIC/CPU/GPU) 1017 (operation 910 and FIG. 10-5). A photonic integrated circuit (PIC) 1020 may be prepared for micro bumping and/or hybrid-bonding with the EIC & Switch/SoC (ASIC/CPU/GPU) 1017 (operation 912 and FIG. 10-6). The micro bumping and/or hybrid-bonding may be completed by filling the gaps among micro bumps with underfill material (not shown in FIG. 10-7) (operation 914 and FIG. 10-7).

Next, the method 900 proceeds to operations 916 and 918 (as shown in FIGS. 10-8 and of forming second conductive connectors. A package substrate (e.g., PCB) 1022 may be attached to the EIC & Switch/SoC (ASIC/CPU/GPU) 1017 (operation 916 and FIG. 10-8). A plurality of bonding wires 1024 may electrically connect the EIC & Switch/SoC (ASIC/CPU/GPU) 1017 to the package substrate 1022 (operation 918 and FIG. 10-9). Power/ground and low-frequency signals can be transmitted through bonding wires to package substrate 1022. The EIC & Switch/SoC (ASIC/CPU/GPU) 1017 may be free from any through via structures (TSVs). The present disclosure may monolithically integrate optical module's EIC with switch/SoC.

Figures 1, 11:
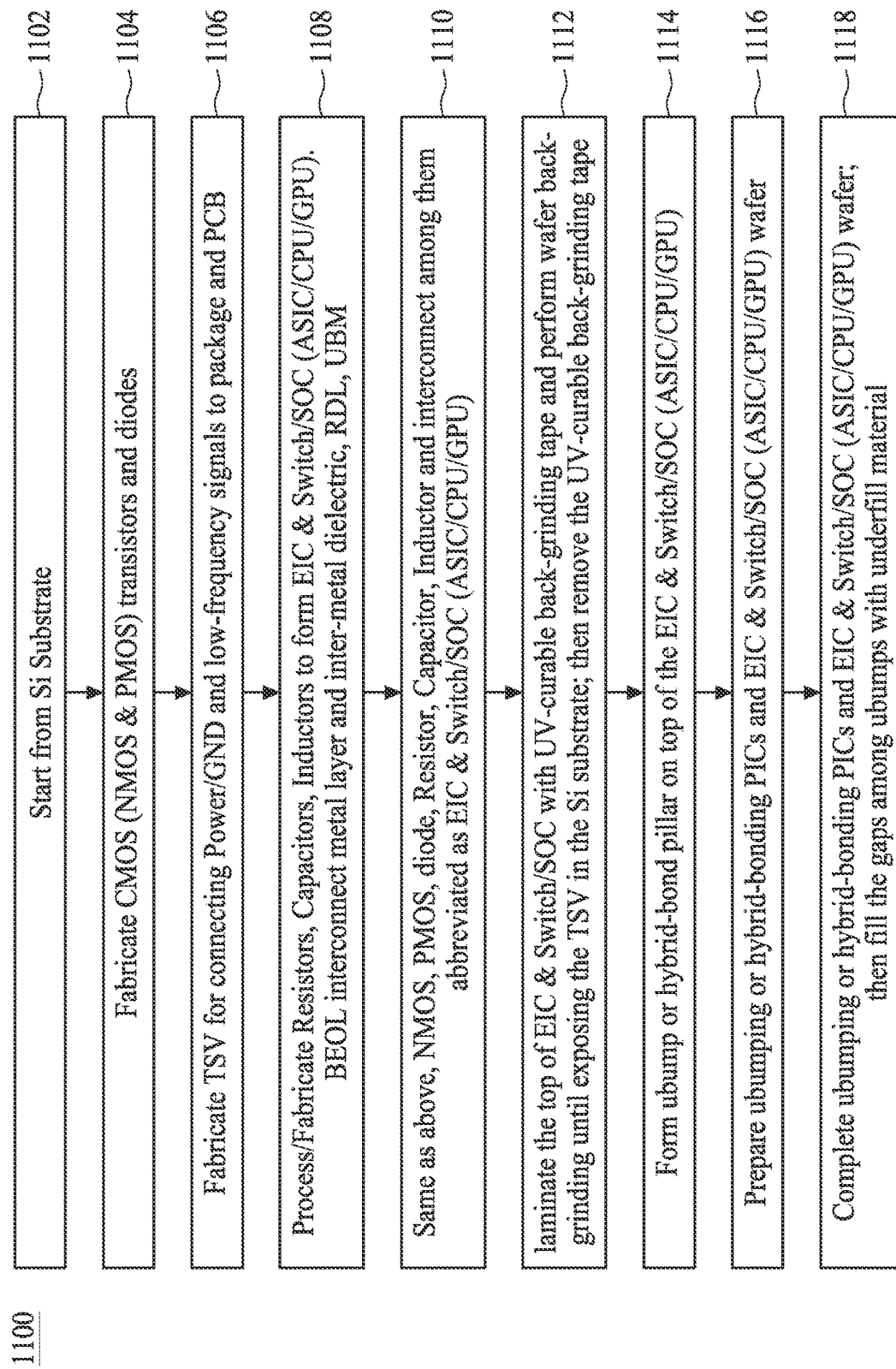
Figures 2, 11:
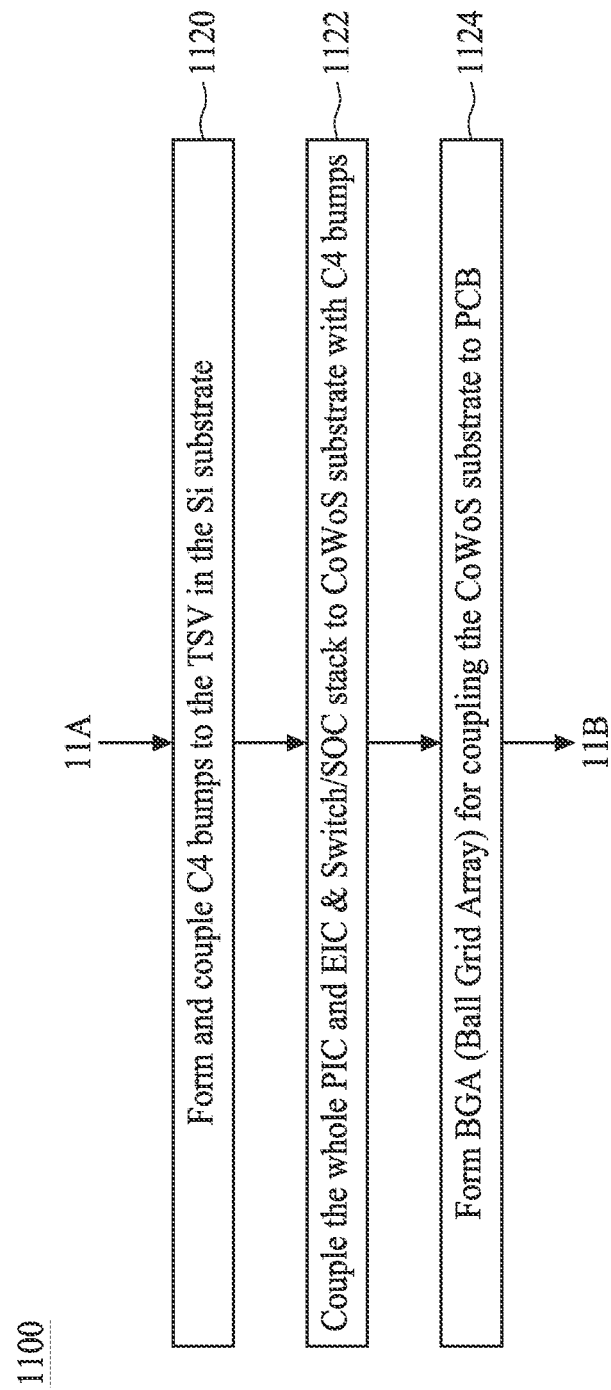
Figures 3, 11:
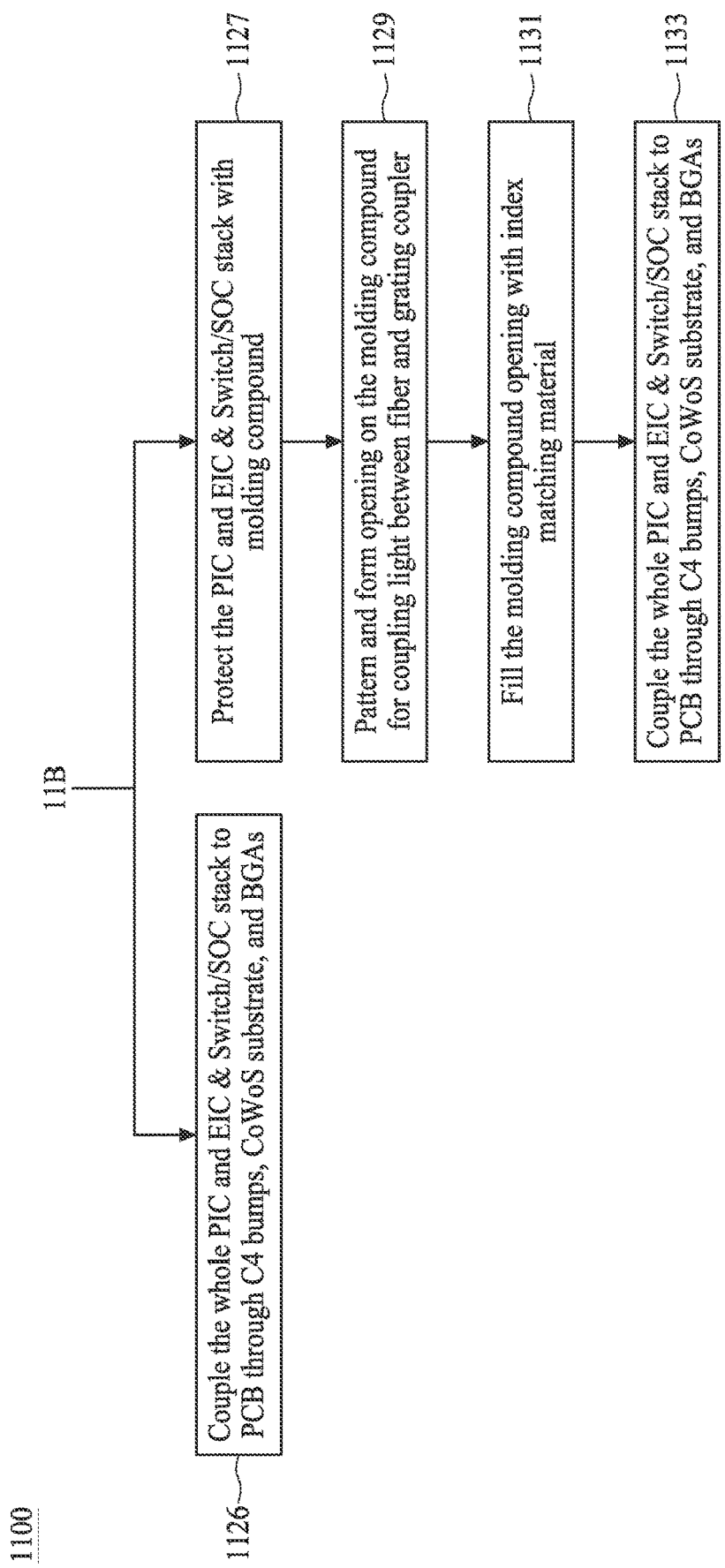

FIG. 11 is a flowchart of an exemplary method for fabricating a semiconductor package 500 and 600 shown in FIGS. 5 and 6, in accordance with some embodiments. FIGS. 12-1, 12-2, 12-3, 12-4, 12-5, 12-6, 12-7, 12-8, 12-9, 12-10, 12-11, 12-12, 12-13a-1, 12-13b-1, 12-13b-2, 12-13b-3, and 12-13b-4 are schematic cross-sectional views of an example semiconductor package during various fabrication stages, in accordance with some embodiments. It is understood that FIG. 11, and FIGS. 12-1, 12-2, 12-3, 12-4, 12-5, 12-6, 12-7, 12-8, 12-9, 12-10, 12-11, 12-12, 12-13a-1, 12-13b-1, 12-13b-2, 12-13b-3, and 12-13b-4 have been simplified for a better understanding of the concepts of the present disclosure. Accordingly, it should be noted that additional processes may be provided before, during, and after the methods of FIGS. 11, and 12-1, 12-2, 12-3, 12-4, 12-5, 12-6, 12-7, 12-8, 12-9, 12-10, 12-11, 12-12, 12-13a-1, 12-13b-1, 12-13b-2, 12-13b-3, and 12-13b-4, and that some other processes may only be briefly described herein.

Figures 1, 12:
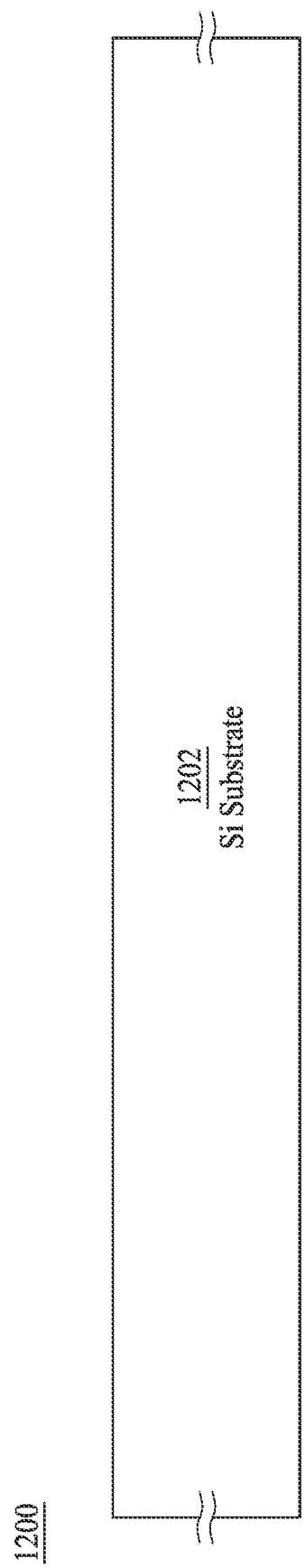
Figures 2, 12:
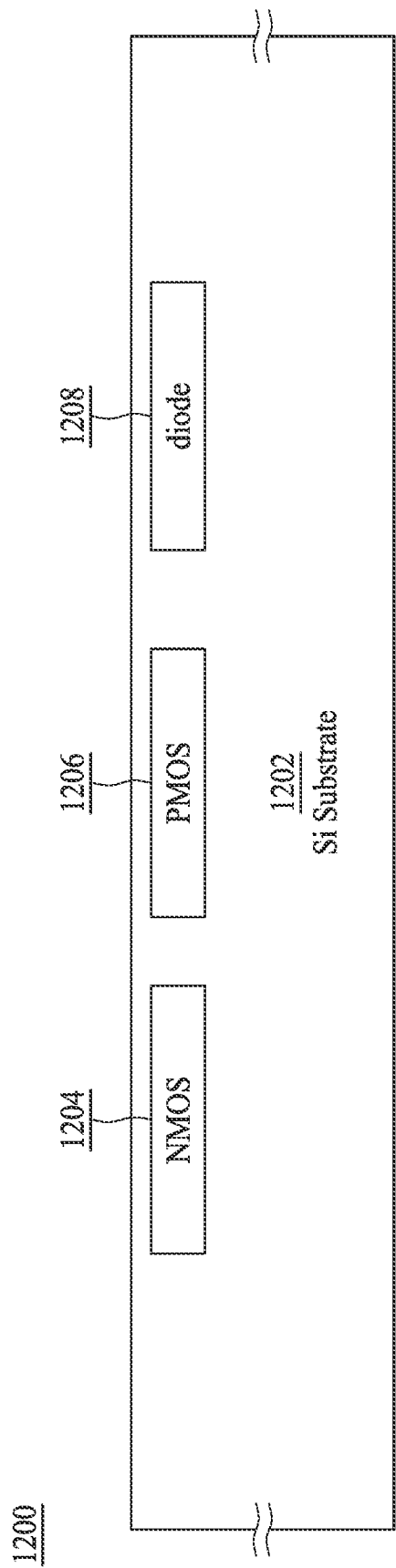
Figures 3, 12:
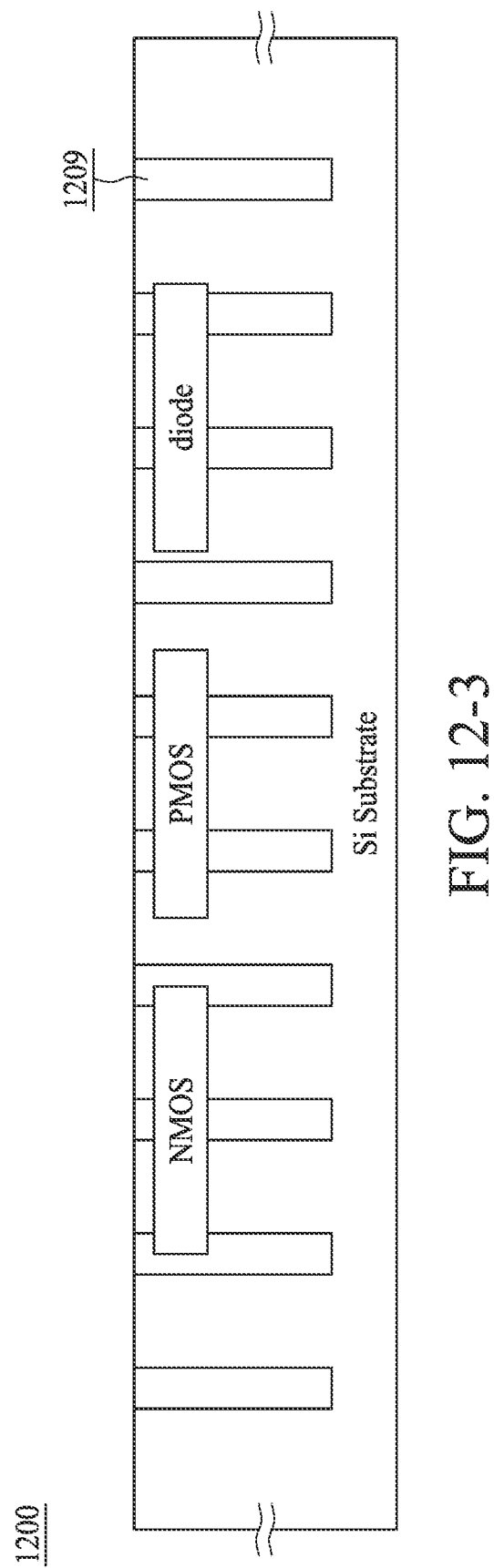
Figures 4, 12:
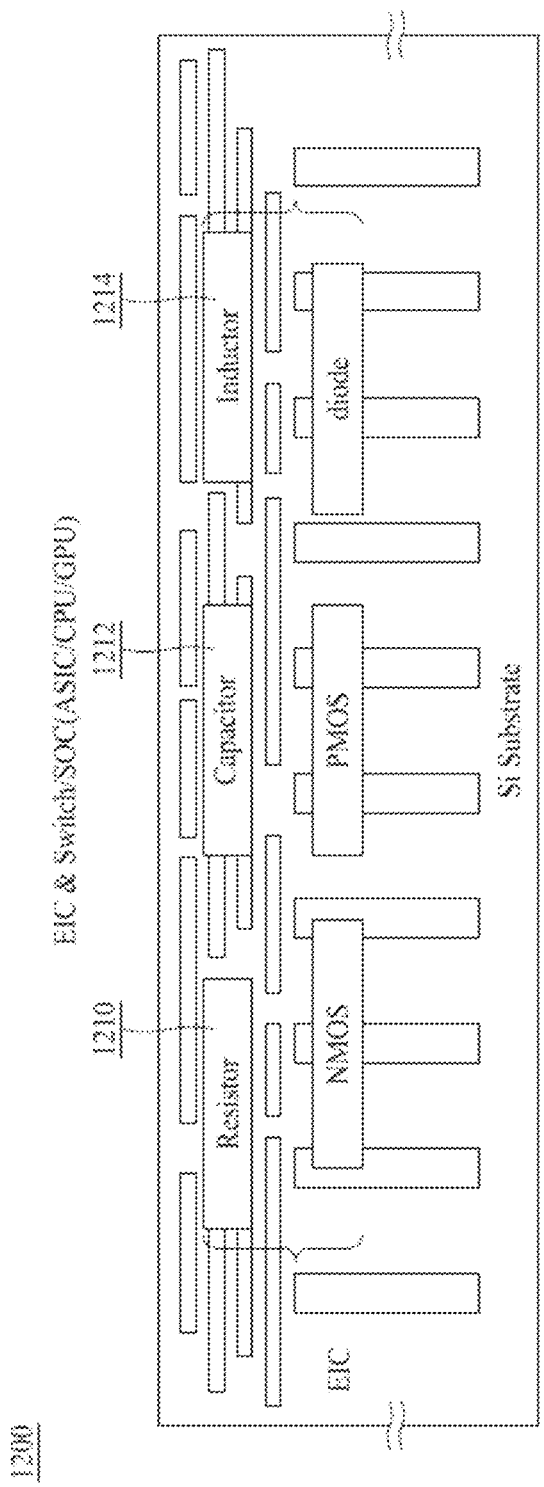
Figures 5, 12:
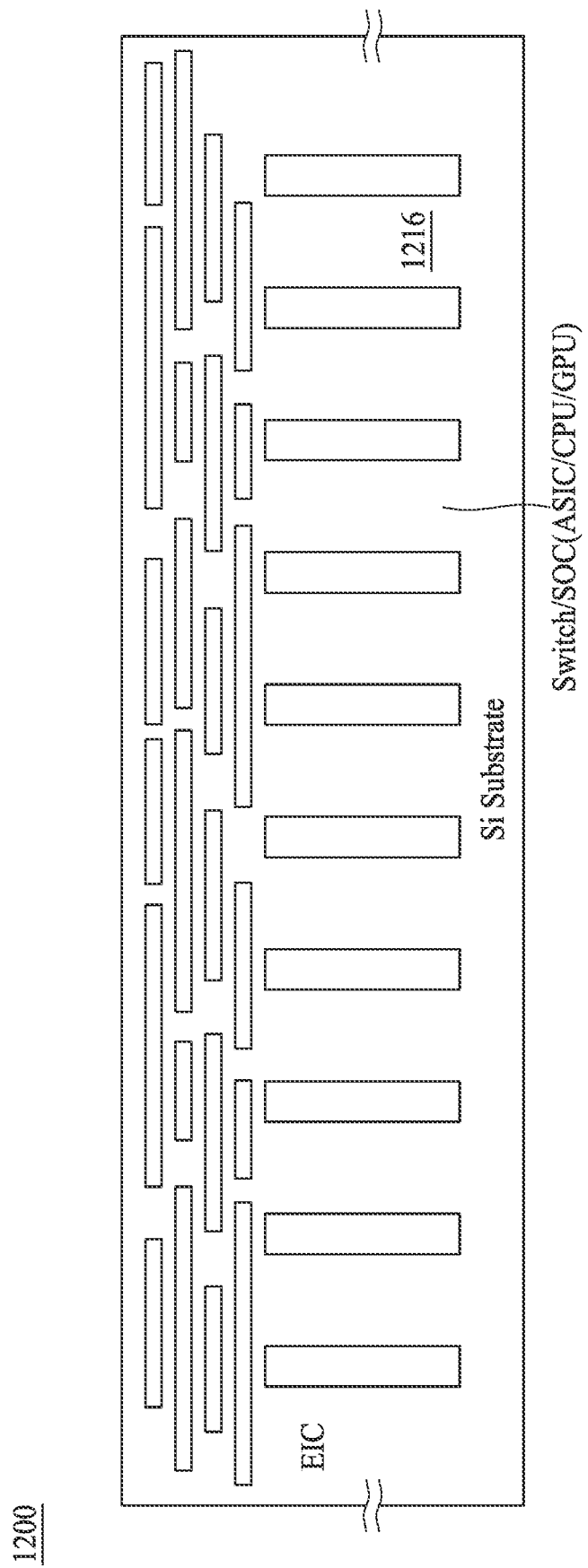
Figures 6, 12:
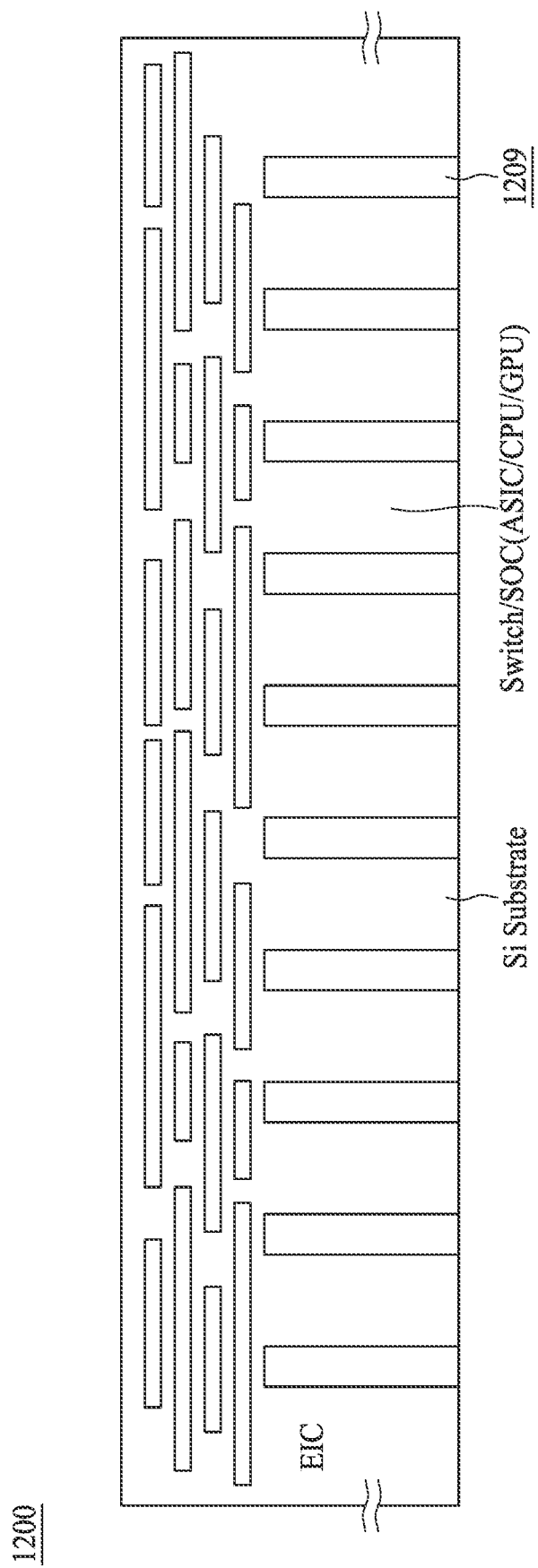
Figures 7, 12:
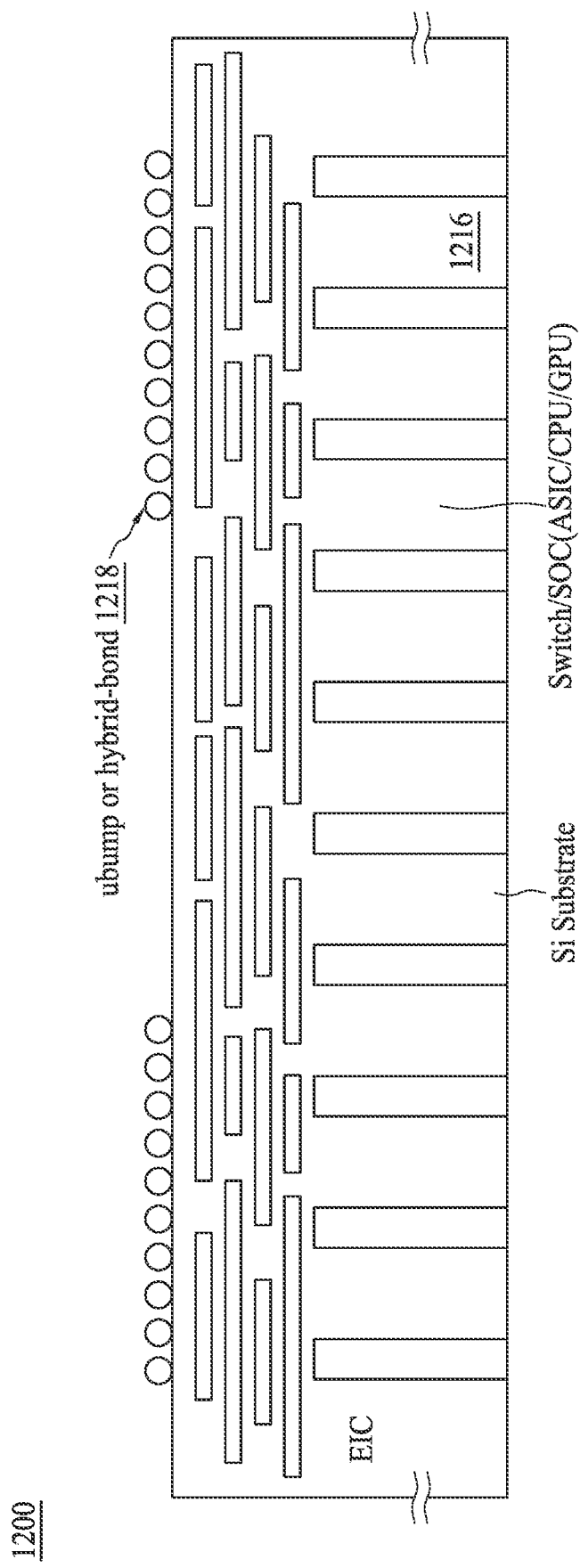
Figures 8, 12:
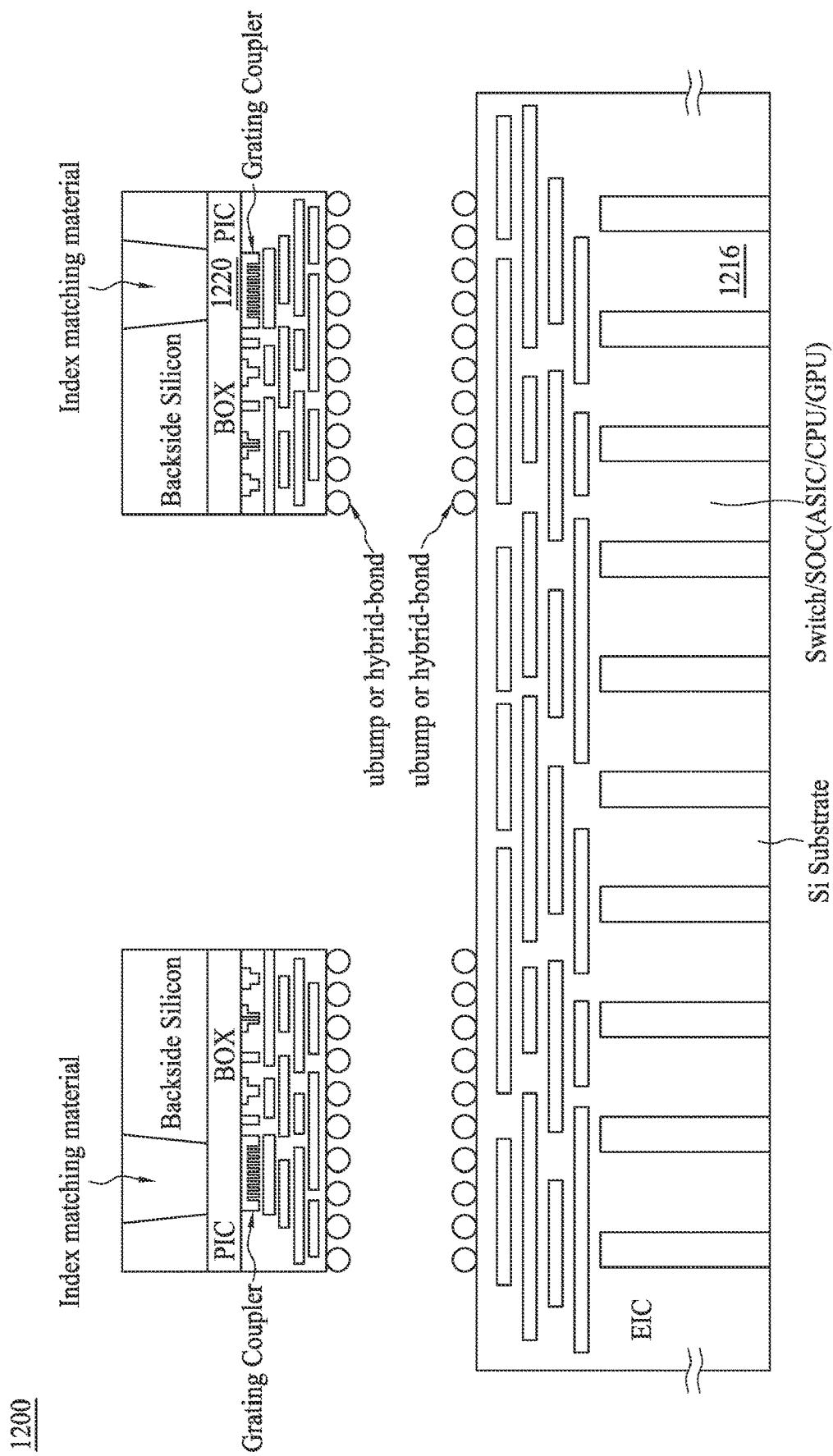
Figures 9, 12:
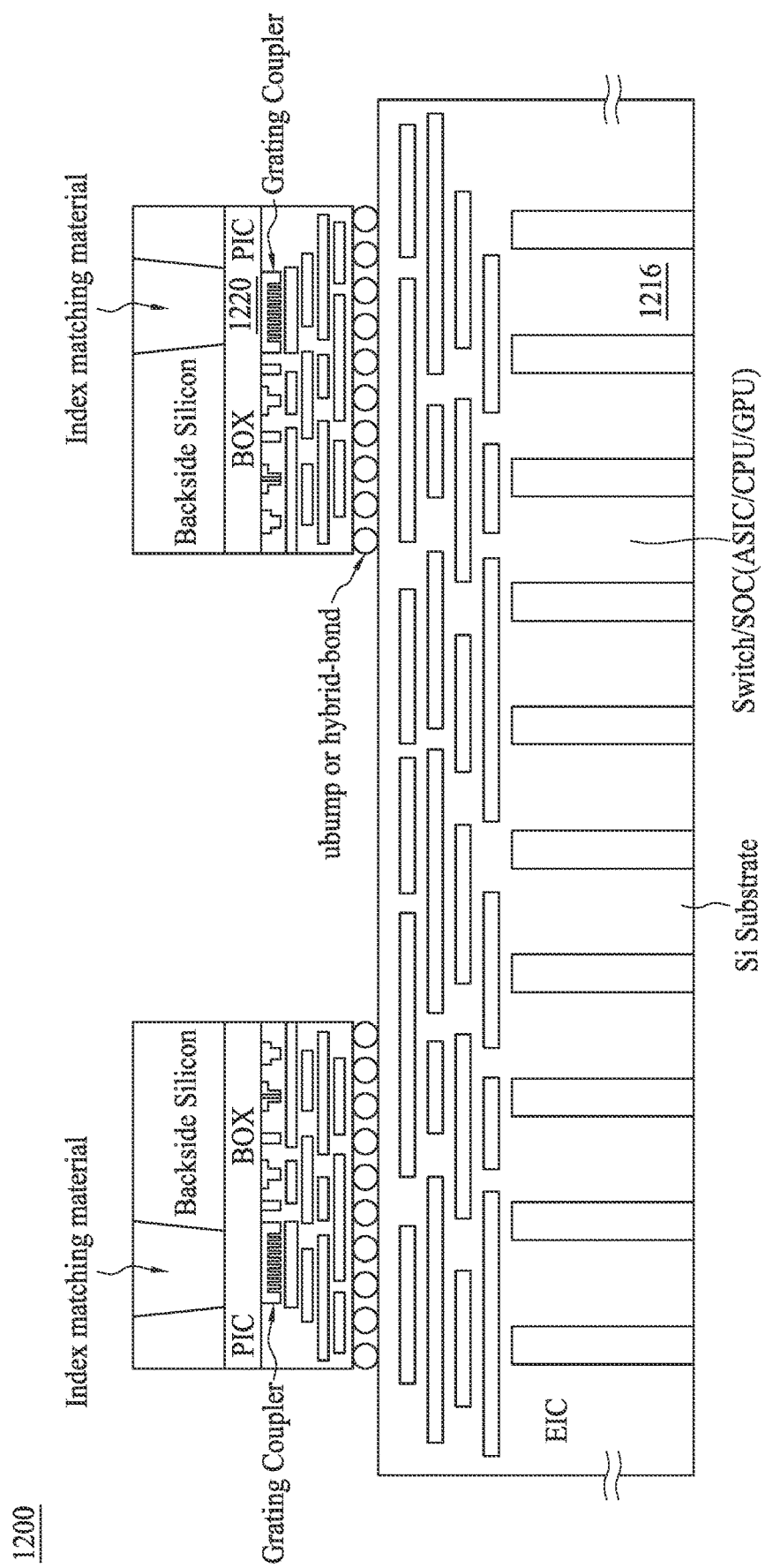
Figures 10, 12:
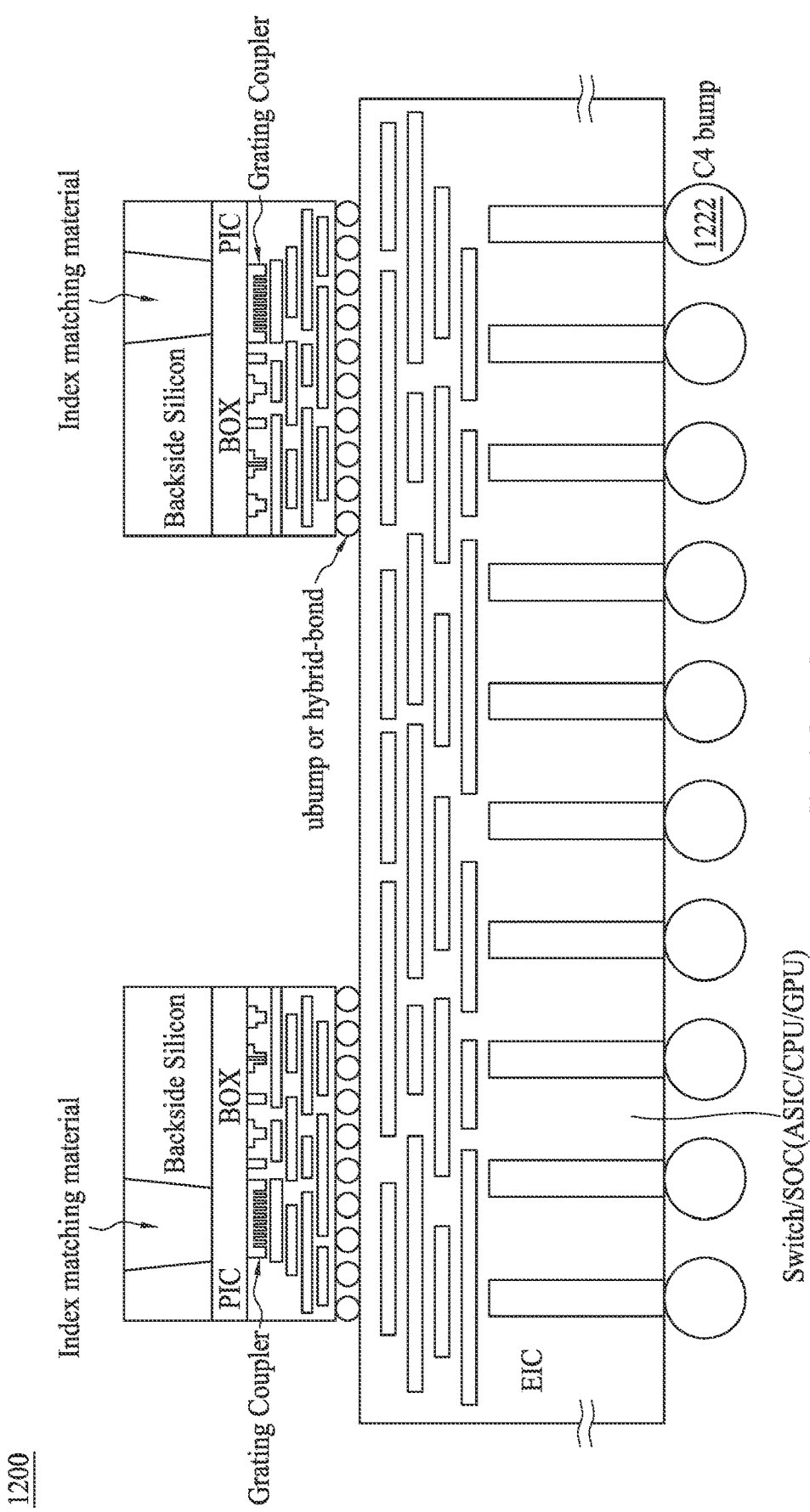
Figures 11, 12:
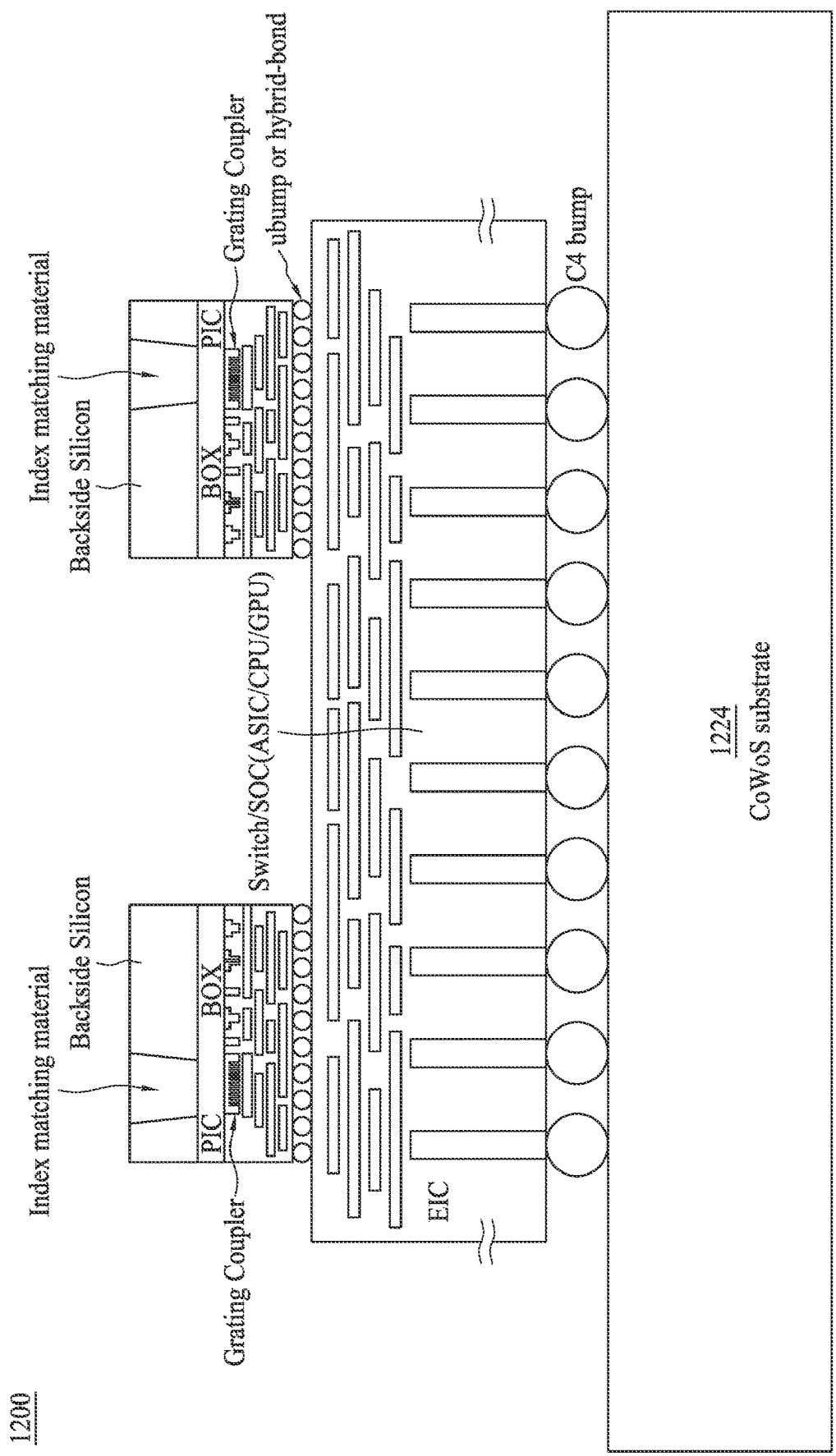
Figure 12:
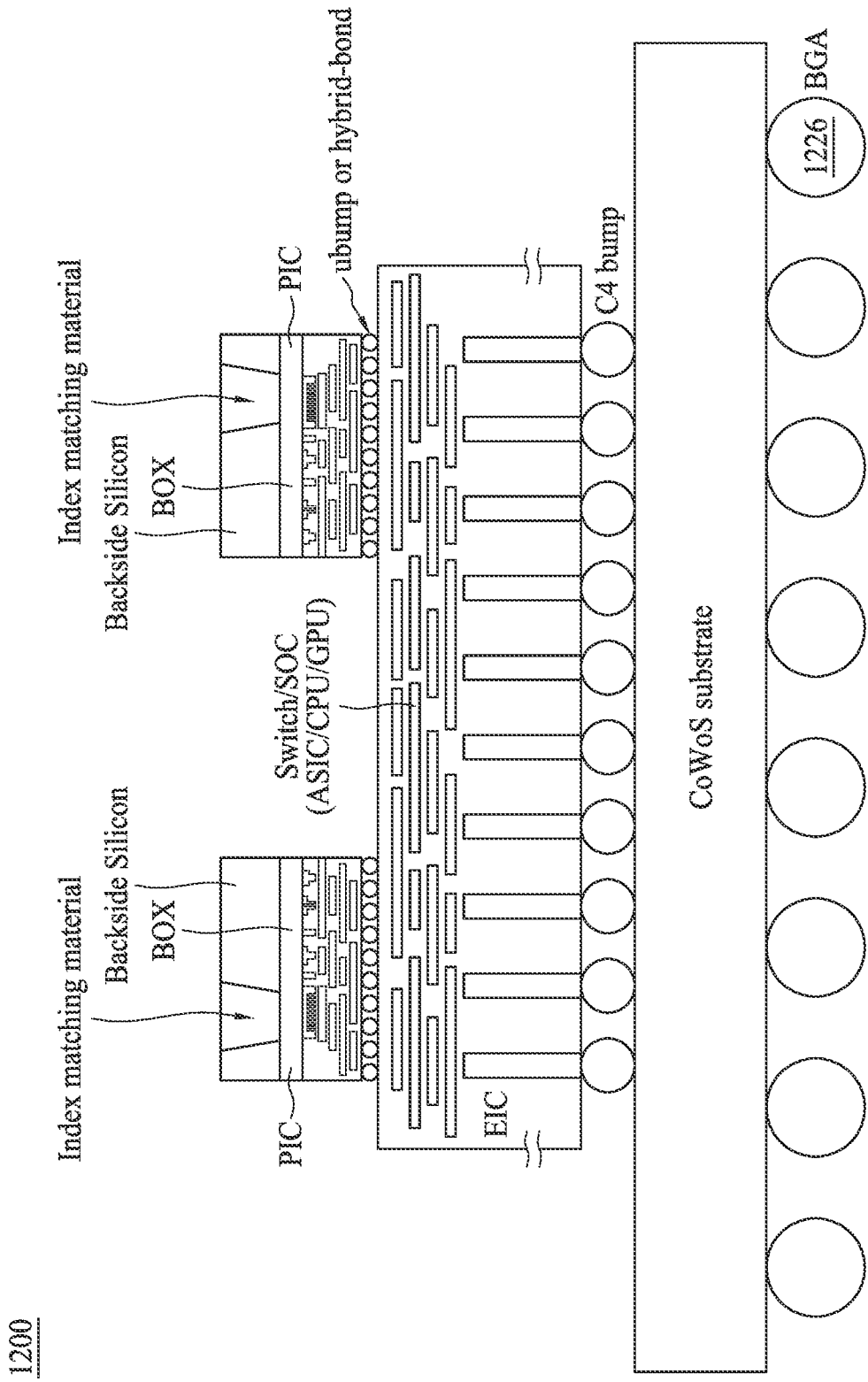
Figures 1, 12, 13, 13A:
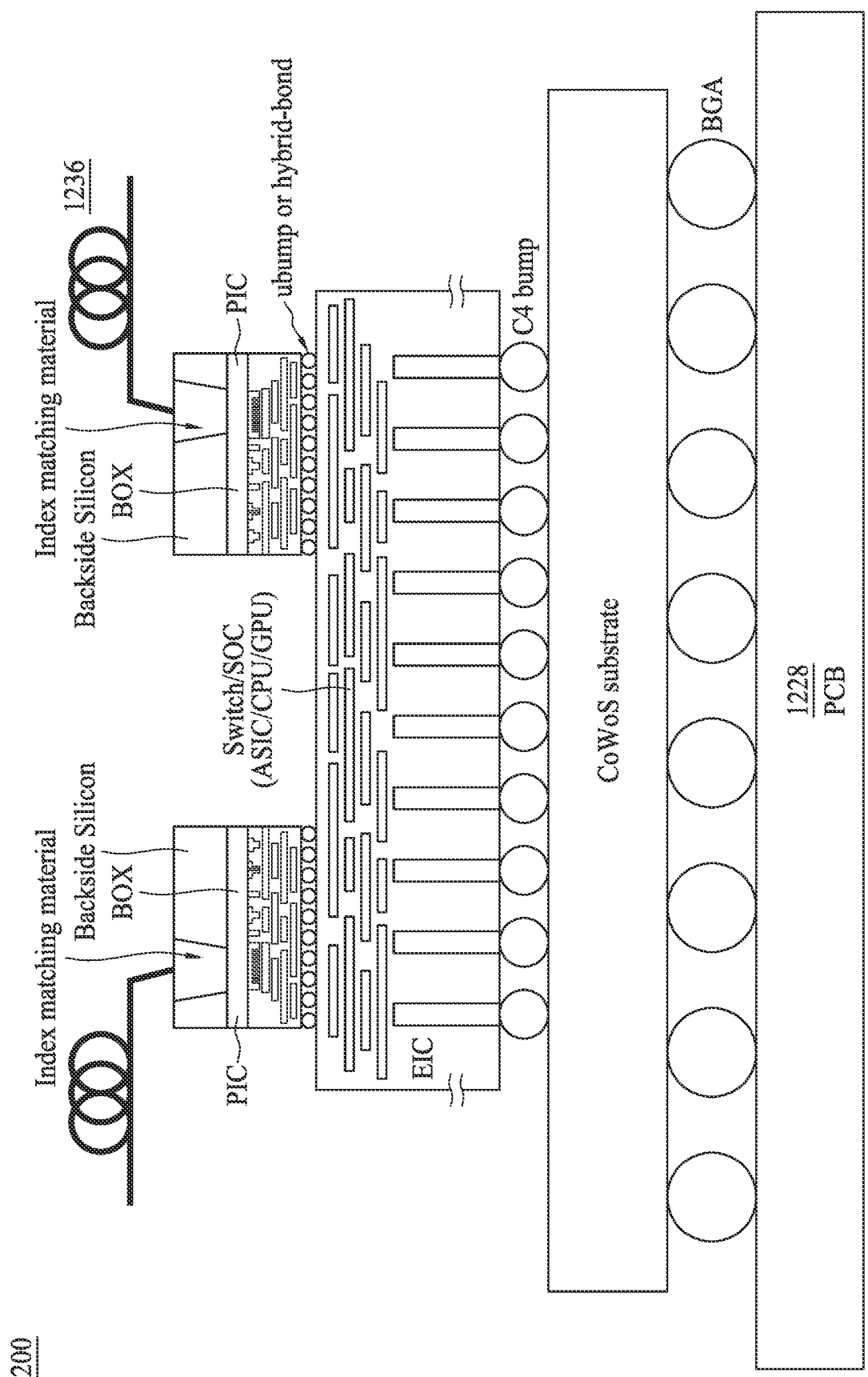
Figures 1, 12, 13, 13B:
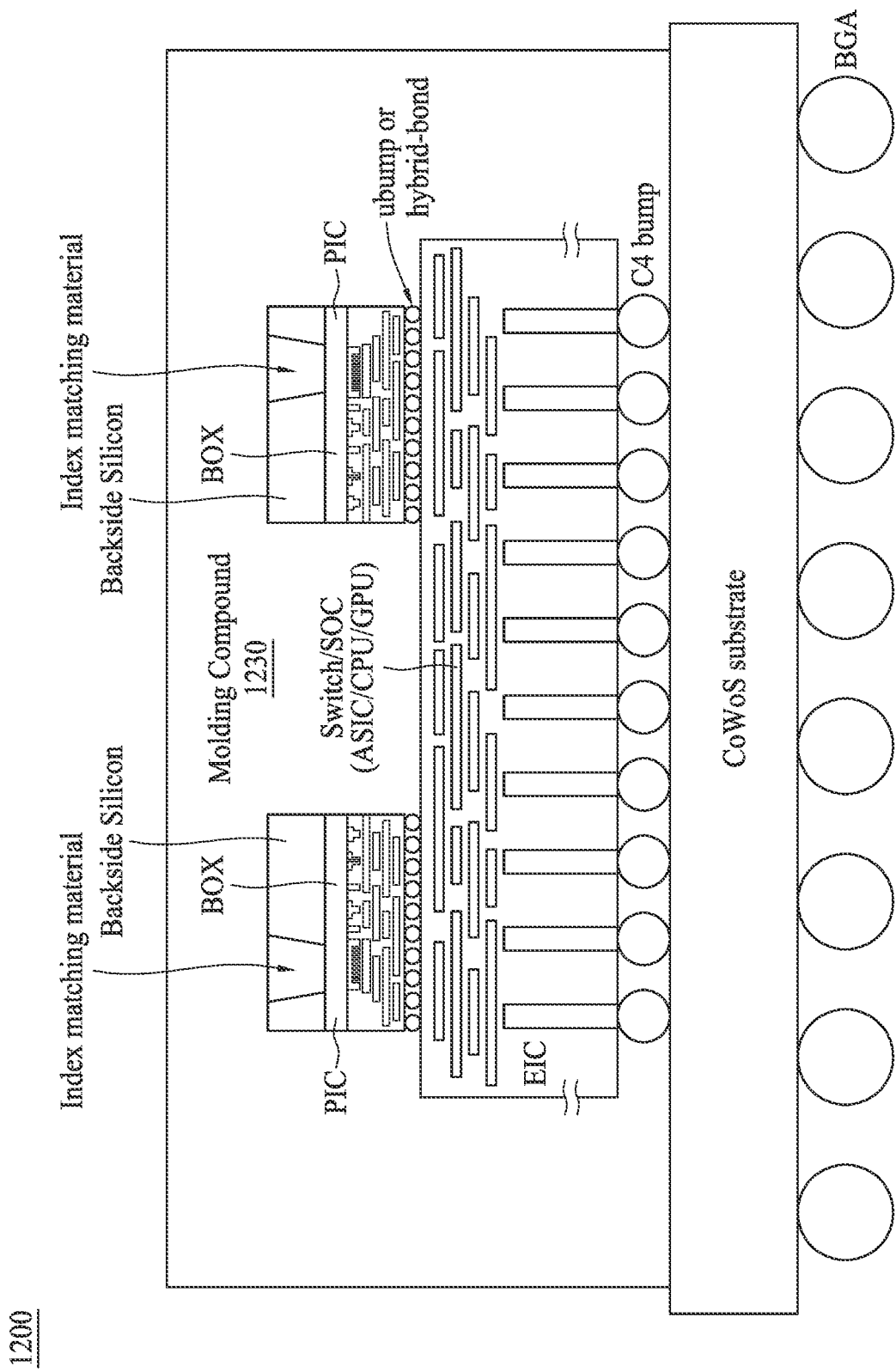
Figures 2, 12, 13, 13B:
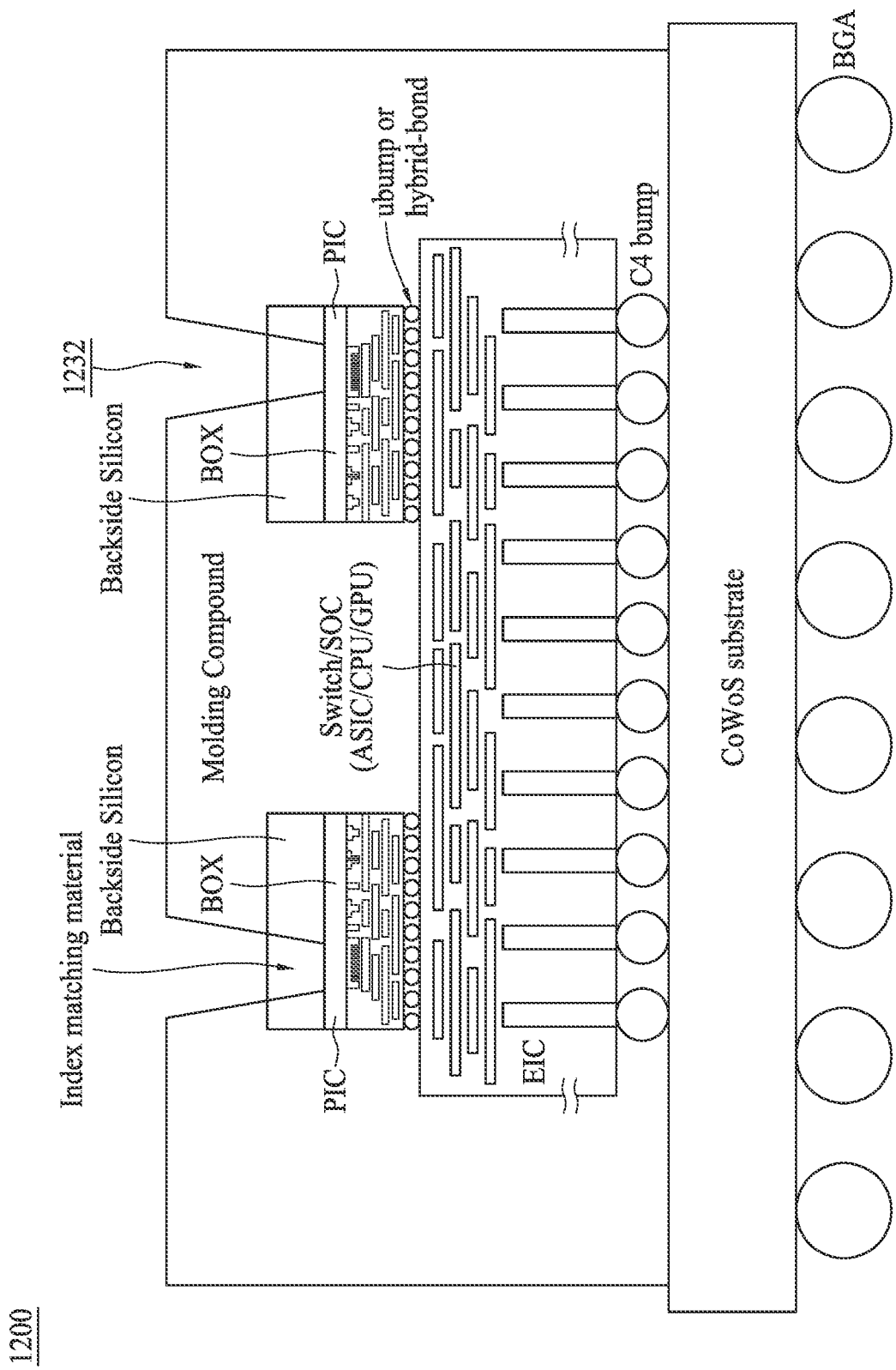
Figures 3, 12, 13, 13B:
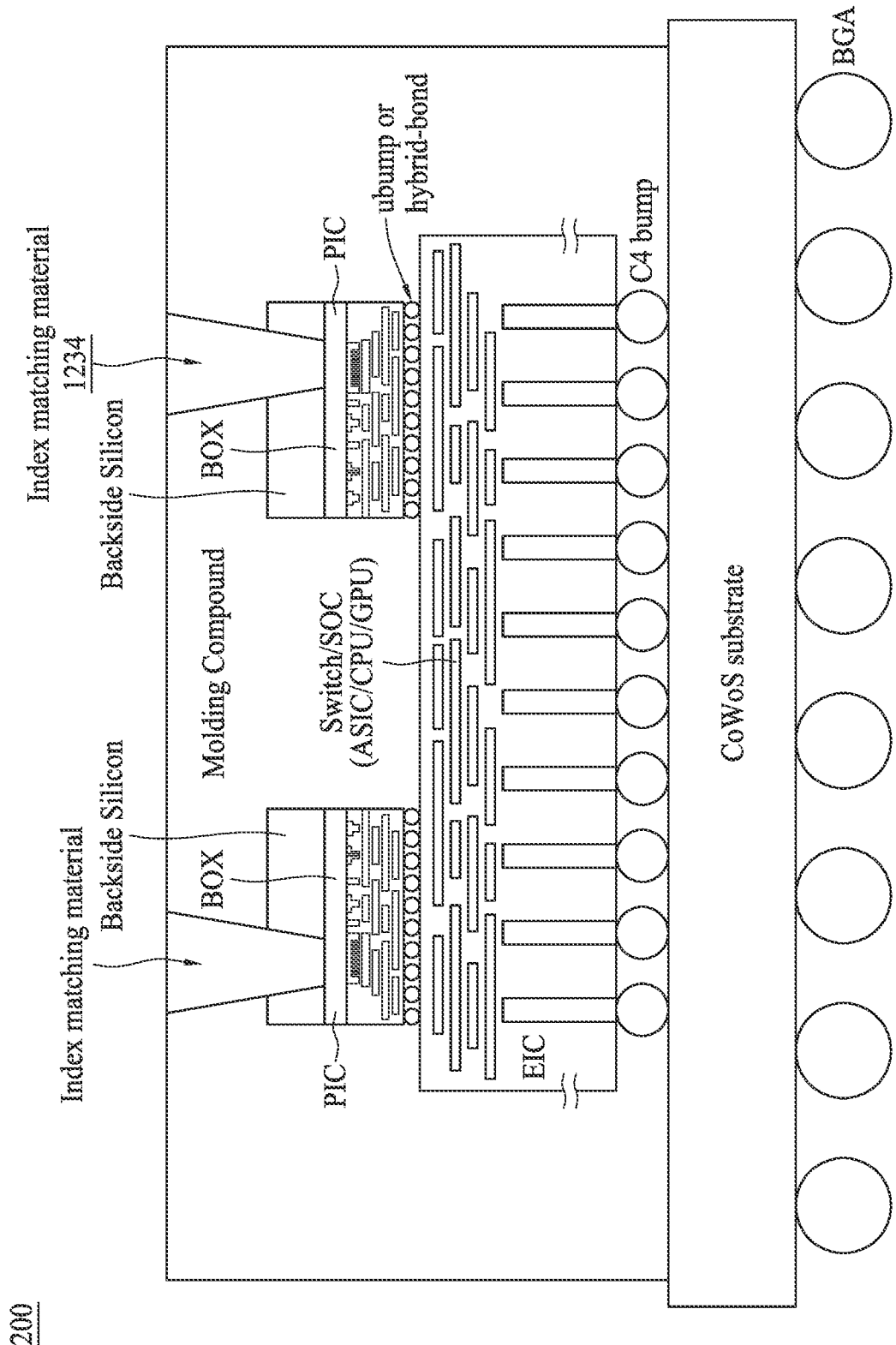
Figures 4, 12, 13, 13B:
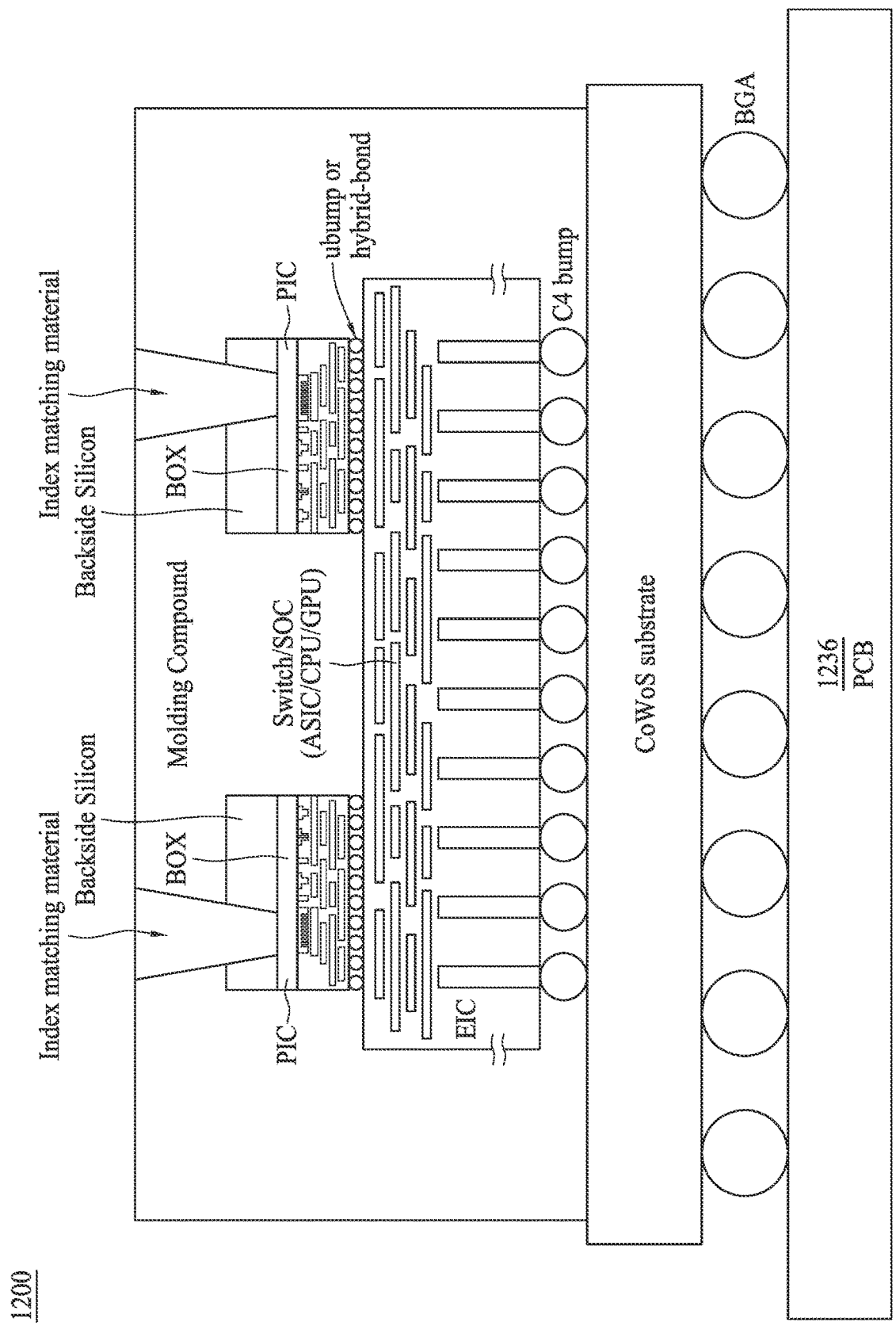

Referring now to FIG. 11 in conjunction with FIGS. 12-1, 12-2, 12-3, 12-4, 12-5, 12-6, 12-7, 12-8, 12-9, 12-10, 12-11, 12-12, 12-13a-1, 12-13b-1, 12-13b-2, 12-13b-3, and 12-13b-4, a semiconductor package 1200 can be fabricated in accordance with the method 1100 of FIG. 11. As shown in FIGS. 11, 12-1, 12-2, 12-3, and 12-4, operation 1102 can provide a Si substrate 1202. The Si substrate 1202 may be fabricated with CMOS transistors (e.g., NMOS 1204, PMOS 1206) and diodes 1208 (operation 1104 and FIG. 12-2). In some embodiments, the NMOS and the PMOS can be narrow-sheet transistors, gate-all-around transistors, FinFET transistors, or planar transistors. A plurality of through via structures (TSVs) 1209 may be formed in the Si substrate 1202 for connecting power/ground and low-frequency signals to underlying package substrates (operation 1106 and FIG. 12-3). The Si substrate may be further fabricated with resistors 1210, capacitors 1212, and inductors 1214 to form electronic integrated circuit (EIC) and switch/SoC (specific integrated circuit (ASIC)/central processing unit (CPU)/graphics processing unit (GPU)) (operation 1108 and FIG. 12-4). The backend of line (BEOL) processes for interconnect metal layers, inter-metal dielectric, RDL, UBM may be formed in the upper Si substrate (FIG. 12-4).

Next, the method 1100 proceeds to operations 1110, 1112, and 1114 (as shown in FIGS. 12-5, 12-6, and 12-7) of forming first conductive connectors. NMOS, PMOS, diodes, resistors, capacitors, inductors, and interconnects may be abbreviated as EIC & Switch/SoC (ASIC/CPU/GPU) 1216 (operation 1110 and FIG. 12-5). The top of the EIC & Switch/SoC 1216 may be laminated with an UV-curable back-grinding tape (not shown in FIG. 12-6). The backside of the EIC & Switch/SoC 1216 may be planarized, such as by a chemical mechanical polish (CMP) or a mechanical grinding, until exposing the TSVs 1209 in the Si substrate, followed by removing the UV-curable back-grinding tape (operation 1112 and FIG. 12-6). Micro bumps and/or hybrid-bond pillars 1218 may be formed on the top of the EIC & Switch/SoC (ASIC/CPU/GPU) 1216 (operation 1114 and FIG. 12-7).

Next, the method 1100 proceeds to operations 1116 and 1118 (as shown in FIGS. 12-8 and 12-9) of forming first conductive connectors. A photonic integrated circuit (PIC) 1220 may be prepared for micro bumping and/or hybrid-bonding with the EIC & Switch/SoC (ASIC/CPU/GPU) 1216 (operation 1116 and FIG. 12-8). The micro bumping and/or hybrid-bonding may be completed by filling the gaps among micro bumps with underfill material (not shown in FIG. 12-9) (operation 1118 and FIG. 12-9).

Next, the method 1100 proceeds to operations 1120, 1122, and 1124 (as shown in FIGS. 12-10, 12-11, and 12-12) of forming first conductive connectors and second conductive connectors. A plurality of C4 bumps 1222 may be formed and coupled to the TSVs 1209 in the Si substrate (operation 1120 and FIG. 12-10). The EIC & Switch/SoC (ASIC/CPU/GPU) 1216 may be stacked to a Chip on Wafer on Substrate (CoWoS) 1224 with the plurality of C4 bumps 1222 (operation 1122 and FIG. 12-11). A plurality of via structures extending through the EIC silicon substrate. The plurality of via structures electrically connect the electrical die to the package substrate. A plurality of ball grid arrays (BGAs) may be formed to couple the CoWoS 1224 to underlying package substrates (operation 1124 and FIG. 12-12).

In some embodiments, the method 1100 may proceed to operation 1126 (as shown in FIG. 12-13a-1) of forming coupling to a printed circuit board (PCB). The whole PIC and EIC & Switch/SoC stack may be coupled to a PCB 1228 through the C4 bumps, the CoWoS, and BGAs (operation 1126 and FIG. 12-13a-1).

In certain embodiments, the method 1100 may proceed to operations 1127, 1129, 1131, and 1133 (as shown in FIGS. 12-13b-1, 12-13b-2, 12-13b-3, and 12-13b-4) of forming a molding compound. A molding compound 1230 may be formed to protect the PIC and the EIC & Switch/SoC stack (operation 1127 and FIG. 12-13b-1). The molding compound may be patterned and formed openings 1232 for coupling light between an optical fiber and a grating coupler (operation 1129 and FIG. 12-13b-2). A grating coupler opening (GCOPEN) may be formed to encompass a grating coupling area (operation 1131 and FIG. 12-13b-3). An index matching material 1234 may be formed over the grating coupler opening (GCOPEN). The index matching material 1234 may be formed in the openings using, for example, ECP or electro-less plating. In some embodiments, the index matching material 1234 may be at least of oxide and/or polymer (e.g., index matching to optical fiber material and BOX material). In certain embodiments, the index matching material may have an effective refractive index in a range of about 1.4 to about 1.6. After formation, the index matching material 1234 may be planarized, such as by a chemical mechanical polish (CMP) or a mechanical grinding. The whole PIC and EIC & Switch/SoC stack may be coupled to a PCB 1236 through the C4 bumps, the CoWoS, and BGAs (operation 1133 and FIG. 12-13b-4).

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
   a photonic die having a first side and a second side opposite to each other; and
   an electrical die having a third side and a fourth side opposite to each other;
   wherein the first side of the photonic die faces the third side of the electrical die;
   wherein the photonic die has an index matching material extending from a surface of the photonic die on the second side into the photonic die; and
   wherein the electrical die, in an order from the third side to the fourth side, comprises:
      a plurality of metallization layers, each of which includes a plurality of interconnect structures;
      a plurality of transistors; and
      a silicon layer.

2. The semiconductor package of claim 1, wherein the index matching material has an effective refractive index in a range of about 1.4 to about 1.6.

3. The semiconductor package of claim 1, wherein the photonic die, in an order from the second side to the first side, comprises:
   a silicon layer;
   an oxide layer;
   a grating coupler; and
   a plurality of metallization layers, each of which includes a plurality of interconnect structures;
   wherein the index matching material penetrates through the silicon layer.

4. The semiconductor package of claim 3, wherein the photonic die further comprising a metal reflector disposed in one of the metallization layers closest to the grating coupler, and wherein the metal reflector is vertically aligned with the grating coupler.

5. The semiconductor package of claim 1, wherein the index matching material is configured to optically couple an optical input signal to a grating coupler of the photonic die.

6. The semiconductor package of claim 1, wherein the index matching material has a height of about 200 micrometers (μm) to about 400 μm.

7. The semiconductor package of claim 1, wherein the photonic die and the electrical die are bonded to each other with a plurality of microbump structures or without any bump structures.

8. The semiconductor package of claim 1, further comprising a package substrate, wherein the electrical die is attached to the package substrate on the fourth side.

9. The semiconductor package of claim 8, further comprising a plurality of bonding wires electrically connecting the electrical die to the package substrate.

10. The semiconductor package of claim 8, further comprising a plurality of via structures extending through the silicon layer, wherein each of the plurality of via structures is configured to electrically connect the electrical die to the package substrate.

11. A semiconductor package, comprising:
a package substrate;
an electrical die disposed above the package substrate, wherein the electrical die has a backside surface attached to the package substrate; and
a first photonic die disposed above the electrical die, wherein the first photonic die has a frontside surface attached to the electrical die;
wherein the first photonic die has a first index matching material extending from its backside surface into its middle portion; and
wherein the electrical die, in an order from a frontside surface to the backside surface, comprises:
a plurality of metallization layers, each of which includes a plurality of interconnect structures;
a plurality of transistors; and
a silicon layer.

12. The semiconductor package of claim 11, further comprising:
a second photonic die also disposed above and attached to the electrical die with a frontside surface;
wherein the second photonic die has a second index matching material extending from a backside surface into a middle portion; and
wherein the second photonic die is laterally spaced apart from the first photonic die.

13. The semiconductor package of claim 11, wherein the electrical die includes at least one of: a switch, a System on Chip (SoC), an Application-Specific Integrated Circuit (ASIC), a Central Processing Unit (CPU), or a Graphics Processing Unit (GPU).

14. The semiconductor package of claim 11, wherein the first index matching material has an effective refractive index in a range of about 1.4 to about 1.6 that is configured to optically couple an optical input signal to a grating coupler of the first photonic die.

15. The semiconductor package of claim 11, further comprising a plurality of bonding wires electrically connecting the electrical die to the package substrate, wherein the electrical die is free from any through via structures.

16. The semiconductor package of claim 11, wherein the electrical die includes a plurality of through via structures electrically connecting the electrical die to the package substrate.

17. A semiconductor package, comprising:
a package substrate;
an electrical die disposed above the package substrate, wherein the electrical die has a backside surface attached to the package substrate;
a first photonic die disposed above the electrical die, wherein the first photonic die has a frontside surface attached to the electrical die; and
a second photonic die also disposed above and attached to the electrical die with a frontside surface;
wherein the first photonic die has a first index matching material extending from a backside surface into a middle portion;
wherein the second photonic die has a second index matching material extending from a backside surface into a middle portion; and
wherein the second photonic die is laterally spaced apart from the first photonic die.

18. The semiconductor package of claim 17, wherein the electrical die includes at least one of: a switch, a System on Chip (SoC), an Application-Specific Integrated Circuit (ASIC), a Central Processing Unit (CPU), or a Graphics Processing Unit (GPU).

19. The semiconductor package of claim 17, wherein the first index matching material has an effective refractive index in a range of about 1.4 to about 1.6 that is configured to optically couple an optical input signal to a grating coupler of the first photonic die.

20. The semiconductor package of claim 17, further comprising a plurality of bonding wires electrically connecting the electrical die to the package substrate, wherein the electrical die is free from any through via structures.

* * * * *